(12) United States Patent
Wells

(10) Patent No.: US 10,504,773 B2
(45) Date of Patent: Dec. 10, 2019

(54) FLUORIMETRY SYSTEMS

(71) Applicant: Micron Technology, Inc., Boise, ID (US)

(72) Inventor: David H. Wells, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 42 days.

(21) Appl. No.: 15/687,506

(22) Filed: Aug. 27, 2017

(65) Prior Publication Data

US 2017/0372943 A1 Dec. 28, 2017

Related U.S. Application Data

(60) Division of application No. 14/712,219, filed on May 14, 2015, now Pat. No. 9,786,548, which is a division of application No. 13/971,169, filed on Aug. 20, 2013, now Pat. No. 9,117,744, which is a division of application No. 11/724,654, filed on Mar. 14, 2007, now Pat. No. 8,617,966, which is a continuation of application No. 11/704,466, filed on Feb. 7, 2007, now Pat. No. 7,989,322.

(51) Int. Cl.
*H01L 21/764* (2006.01)
*H01L 21/20* (2006.01)
*H01L 21/02* (2006.01)

(52) U.S. Cl.
CPC ........ *H01L 21/764* (2013.01); *H01L 21/0265* (2013.01); *H01L 21/02381* (2013.01); *H01L 21/02488* (2013.01); *H01L 21/02532* (2013.01); *H01L 21/02639* (2013.01); *H01L 21/2015* (2013.01)

(58) Field of Classification Search
None
See application file for complete search history.

(56) References Cited

U.S. PATENT DOCUMENTS

| 4,528,047 A | 7/1985 | Beyer et al. |
| 4,820,654 A | 4/1989 | Lee |
| 4,993,143 A | 2/1991 | Sidner et al. |
| 5,021,843 A | 6/1991 | Ohmi |

(Continued)

FOREIGN PATENT DOCUMENTS

| DE | 10 2005 010 821 A1 | 9/2006 |
| EP | 1184897 | 3/2002 |

(Continued)

OTHER PUBLICATIONS

WO PCT/US2007/016150 Writ. Opin., Apr. 9, 2008, Micron Technology, Inc.

(Continued)

*Primary Examiner* — Jack S Chen
(74) *Attorney, Agent, or Firm* — Wells St. John P.S.

(57) ABSTRACT

Some embodiments include methods of forming voids within semiconductor constructions. In some embodiments the voids may be utilized as microstructures for distributing coolant, for guiding electromagnetic radiation, or for separation and/or characterization of materials. Some embodiments include constructions having micro-structures therein which correspond to voids, conduits, insulative structures, semiconductor structures or conductive structures.

7 Claims, 54 Drawing Sheets

(56) References Cited

U.S. PATENT DOCUMENTS

| | | |
|---|---|---|
| 5,281,840 A | 1/1994 | Sarma |
| 5,374,329 A | 12/1994 | Miyawaki |
| 5,405,802 A | 4/1995 | Yamagata et al. |
| 5,453,394 A | 9/1995 | Yonehara et al. |
| 5,670,411 A | 9/1997 | Yonehara et al. |
| 5,767,020 A | 6/1998 | Sakaguchi et al. |
| 5,773,355 A | 6/1998 | Inoue et al. |
| 5,841,171 A | 11/1998 | Iwamatsu et al. |
| 5,849,627 A | 12/1998 | Linn et al. |
| 5,882,532 A | 3/1999 | Field et al. |
| 5,910,672 A | 6/1999 | Iwamatsu et al. |
| 5,923,046 A | 7/1999 | Tezuka et al. |
| 6,010,921 A | 1/2000 | Soutome |
| 6,037,634 A | 3/2000 | Akiyama |
| 6,048,411 A | 4/2000 | Henley et al. |
| 6,071,783 A | 6/2000 | Liang et al. |
| 6,091,076 A | 7/2000 | Deleonibus |
| 6,093,623 A | 7/2000 | Forbes |
| 6,177,333 B1 | 1/2001 | Rhodes |
| 6,204,524 B1 | 3/2001 | Rhodes |
| 6,215,155 B1 | 4/2001 | Wollesen |
| 6,245,636 B1 | 6/2001 | Maszara |
| 6,255,731 B1 | 7/2001 | Ohmi et al. |
| 6,265,327 B1 | 7/2001 | Kobayashi et al. |
| 6,268,630 B1 | 7/2001 | Schwank et al. |
| 6,313,014 B1 | 11/2001 | Sakaguchi et al. |
| 6,340,829 B1 | 1/2002 | Hirano et al. |
| 6,346,729 B1 | 2/2002 | Liang et al. |
| 6,350,703 B1 | 2/2002 | Sakaguchi et al. |
| 6,358,791 B1 | 3/2002 | Hsu et al. |
| 6,403,485 B1 | 6/2002 | Quek et al. |
| 6,410,938 B1 | 6/2002 | Xiang |
| 6,433,401 B1 | 8/2002 | Clark et al. |
| 6,509,613 B1 | 1/2003 | En et al. |
| 6,512,244 B1 | 1/2003 | Ju et al. |
| 6,531,375 B1 | 3/2003 | Giewont et al. |
| 6,534,380 B1 | 3/2003 | Yamauchi et al. |
| 6,541,861 B2 | 4/2003 | Higashi et al. |
| 6,552,396 B1 | 4/2003 | Bryant et al. |
| 6,552,496 B2 | 4/2003 | Yamazaki |
| 6,610,615 B1 | 8/2003 | McFadden et al. |
| 6,627,549 B2 | 9/2003 | Juengling |
| 6,642,579 B2 | 11/2003 | Fung |
| 6,649,959 B2 | 11/2003 | Hsu et al. |
| 6,661,065 B2 | 12/2003 | Kunikiyo |
| 6,664,146 B1 | 12/2003 | Yu |
| 6,670,257 B1 | 12/2003 | Barlocchi et al. |
| 6,680,243 B1 | 1/2004 | Kamath et al. |
| 6,683,364 B2 | 1/2004 | Oh et al. |
| 6,803,637 B2 | 10/2004 | Benzel et al. |
| 6,808,954 B2 | 10/2004 | Ma et al. |
| 6,870,235 B2 | 3/2005 | Abstreiter et al. |
| 7,023,051 B2 | 4/2006 | Forbes |
| 7,029,989 B2 | 4/2006 | Kim et al. |
| 7,153,753 B2 | 12/2006 | Forbes |
| 7,157,350 B2 | 1/2007 | Yang et al. |
| 7,229,895 B2 | 6/2007 | Wells |
| 7,378,704 B2 | 5/2008 | Parekh |
| 7,393,789 B2 | 7/2008 | Abatchev et al. |
| 7,416,943 B2 | 8/2008 | Figura et al. |
| 7,498,265 B2 | 3/2009 | Wells et al. |
| 7,557,002 B2 | 7/2009 | Wells et al. |
| 7,572,572 B2 | 8/2009 | Wells |
| 7,579,259 B2 | 8/2009 | Fournel et al. |
| 7,601,608 B2 | 10/2009 | Wells |
| 7,625,776 B2 | 12/2009 | Wells et al. |
| 7,628,932 B2 | 12/2009 | Lee et al. |
| 7,682,944 B2 | 3/2010 | Brandes et al. |
| 7,709,327 B2 | 5/2010 | Wells |
| 7,709,341 B2 | 5/2010 | Fucsko et al. |
| 7,956,416 B2 | 6/2011 | Wells et al. |
| 7,989,322 B2 | 8/2011 | Wells |
| 2001/0020722 A1 | 9/2001 | Yang |
| 2002/0011670 A1 | 1/2002 | Higashi et al. |
| 2002/0017660 A1 | 2/2002 | Villa et al. |
| 2002/0034844 A1 | 3/2002 | Hsu et al. |
| 2002/0048844 A1 | 4/2002 | Sakaguchi |
| 2002/0070454 A1 | 6/2002 | Yasukawa |
| 2002/0090816 A1 | 7/2002 | Ashby et al. |
| 2002/0134503 A1 | 9/2002 | Hussinger et al. |
| 2002/0158301 A1 | 10/2002 | Urakami |
| 2003/0085424 A1 | 5/2003 | Bryant et al. |
| 2003/0116552 A1 | 6/2003 | Santoruvo et al. |
| 2004/0124446 A1 | 7/2004 | Borger et al. |
| 2004/0183078 A1 | 9/2004 | Wang |
| 2005/0139952 A1 | 6/2005 | Koh |
| 2005/0176222 A1 | 8/2005 | Ogura |
| 2006/0028305 A1 | 2/2006 | Dutta et al. |
| 2006/0043515 A1 | 3/2006 | Ford |
| 2006/0207972 A1 | 9/2006 | D'arrigo et al. |
| 2007/0032092 A1 | 2/2007 | Shibata et al. |
| 2007/0249138 A1 | 10/2007 | Li et al. |
| 2008/0044979 A1 | 2/2008 | Wells et al. |
| 2008/0048196 A1 | 2/2008 | Strittmatter et al. |
| 2008/0085587 A1 | 4/2008 | Wells et al. |
| 2008/0113483 A1 | 5/2008 | Wells |
| 2008/0173964 A1 | 7/2008 | Akram |
| 2008/0185647 A1 | 8/2008 | Wells |
| 2008/0187463 A1 | 8/2008 | Wells |
| 2008/0188019 A1 | 8/2008 | Wells |
| 2008/0188051 A1 | 8/2008 | Wells |
| 2008/0188073 A1 | 8/2008 | Wells |
| 2008/0261349 A1 | 10/2008 | Abatchev et al. |
| 2008/0272396 A1 | 11/2008 | Fournel et al. |
| 2008/0317423 A1 | 12/2008 | Stepanov et al. |
| 2009/0236666 A1 | 9/2009 | Wells et al. |
| 2010/0171176 A1 | 7/2010 | Wells |
| 2011/0233734 A1 | 9/2011 | Wells |
| 2011/0256694 A1 | 10/2011 | Wells |
| 2013/0337630 A1 | 12/2013 | Wells |
| 2015/0249032 A1 | 9/2015 | Wells |
| 2016/0365464 A1* | 12/2016 | Frey ............... H01L 31/107 |
| 2017/0372940 A1 | 12/2017 | Wells |
| 2017/0372941 A1 | 12/2017 | Wells |
| 2017/0372943 A1* | 12/2017 | Wells ............. H01L 21/2015 |
| 2018/0301370 A1 | 10/2018 | Wells |

FOREIGN PATENT DOCUMENTS

| | | |
|---|---|---|
| EP | 1427011 | 6/2004 |
| TW | 097102554 | 5/2012 |
| TW | 101136073 | 8/2014 |
| TW | 104115103 | 3/2016 |
| WO | WO 2007/074027 | 7/2007 |
| WO | PCT/US07/016150 | 4/2008 |
| WO | PCT/US2007/016150 | 4/2008 |
| WO | WO PCT/US2007/016150 | 2/2009 |
| WO | PCT/US2008/001126 | 8/2009 |

OTHER PUBLICATIONS

WO PCT/US2008/001126 Search Rept., Feb. 2, 2009, Micron Technology, Inc.

WO PCT/US2008/001126 Writ. Opin., Feb. 2, 2009, Micron Technology, Inc.

U.S. Appl. No. 11/657,013, filed Jan. 24, 2007, Akram.

Bashir et al., Characterization of sidewall defects in selective epitaxial growth of silicon, J. Vac. Sci. Technol. B, vol. 13, No. 3, pp. 923-927 (May/Jun. 1995).

Bashir et al., Reduction of sidewall defect induced leakage currents by the use of nitrided field oxides in silicon selective epitaxial growth isolation, J. Vac. Sci. Technol. B, vol. 18, No. 2, pp. 695-699 (Mar./Apr. 2000).

Bernstein et al., Chapter 3: SOI Device Electrical Properties, §3.4 Floating Body Effects, SOI Circuit Design Concepts, pp. 34-53 (Kluwer Academic Publishers, pre-Aug. 2001).

Fitzgerald et al., Dislocation Engineering in Strained MOS Materials, IEEE, 4 pages (2005).

Forbes et al., "The effect of reactor pressure on selective area epitaxy of GaAs in a close-coupled showerhead reactor", Jornal of Crystal Growth 261 (2004), pp. 427-432.

(56) References Cited

OTHER PUBLICATIONS

Guo et al., "Fabrication of Size-Controllable Nanofluidic Channels by Nanoimprinting and Its Application for DNA Stretching", 2004 American Chemical Society, Nano Letters, vol. 4, No. 1, pp. 69-73.
Hammad et al., The Pseudo-Two-Dimensional Approach to Model the Drain Section in SIO MOSFETs, IEEE Transactions on Electron Devices, vol. 48, No. 2, pp. 386-387 (Feb. 2001).
Jastrzebski et al., "Device Characterization on Monocrystalline Silicon Grown Over SiO2 by the ELO (Epitaxial Lateral Overgrowth) Process", 1983 IEEE, vol, EDL-4, No. 2, pp. 32-35.
Jurczak et al., "Silicon-on-Nothing (SON)—an Innovated Process for Advanced CMOS," IEEE Transactions on Electron Devices, vol. 47, No. 11 (Nov. 2000).
L. Jastrzebski et al., Device Characterization on Monocrystalline Silicon Grown Over SiO2, by the ELO (Epitaxial Lateral Overgrowth) Process, IEEE Electron Device Letters, vol. EDL-4, No. 2 (Feb. 1983).
Mazure et al., "Advanced SOI Substrate Manufacturing", 2004 IEEE, pp. 105-110.
Medis, et al., "CMOS Active Pixel Image Sensor" IEE Transactions on Electron Devices vol. 41, No. 3. pp. 452-453 (Mar. 1994).
Mendis et al.; CMOS Active Pixel Image Sensor; IEEE Transactions on Electron Devices vol. 41, No. 3; Mar. 1994; pp. 452-453.
Nixon et al., "256 × 256 Active Pixel Sensor Camera-on-a-Chip" IEEE Journal of Solid-State Circuits vol. 31, No. 12, pp. 2045-2050 (Dec. 1996).a
Nixon et al., "256 × CMOS Active Pixel Sensor Camera-on-a-Chip" IEEE Journal of Solid State Circuits, vol. 31, No. 12, pp. 2046-2050 (Dec. 1996).
Parng et al., DNA Extraction With Parallel Electrodes on Microfluidic System, Technical Proceedings of the 2006 NSTI Nanotechnology Conference and Trade Show, vol. 2, Chapter 8, 2006; 4 p.
Parng et al., DNA Extraction With Parallel Electrodes on Microfluidic System, Technical Proceedings of the 2006 NSTI Nanotechnology Conference and Trade Show, vol. 2, Chapter 8, 4 pp. (2006).
PCT Form 206, "Invitation to Pay Additional Fees and Where Applicable, Protest Fee", Nov. 12, 2008, 9 pgs.
Sato et al., "SON (Silicon on Nothing) MOSFET using ESS (Empty Space in Silicon) technique for SoC applications," IEEE (2001).
Seethaler, Nanopore method could revolutionize genome sequencing, EurkAlert!, 2 pages (Apr. 6, 2006).
Selvaganapathy et al., "Recent Progress in Microfluidic Devices for Nucleic Acid and Antibody Assays", 2003 IEEE, vol. 91, No. 6, pp. 954-975.
Simonite, Nanopore will make for speedy DNA sequencing, NewScientistTech, 3 pages (Apr. 10, 2006).
Sivagnaname et al., Stand-by Current in PD-SOI Pseudo-nMOS Circuits, IEEE, pp. 95-96 (2003).
Technical Proceedings of the 2006 NSTI Nanotechnology Conference and Trade Show, vol. 2, Nanotech 2006, pp. 1-4.
Terada et al., "A New DRAM cell with a Transistor on a Lateral Epitaxial Silicon Layer (TOLE Cell)," IEEE Transactions on Electron Devices, vol. 37, No. 9 (Sep. 1990).
Wang et al., Achieving Low Junction Capacitance on Bulk Si MOSFET Using SDOI Process, Micro Technology, Inc., 12 pages (pre-2004).
Wang et al., Nanofluidic channels fabrication and manipulation of DNA molecules, IEEE Proc.-Nanobiotechnol., vol. 153, No. 1, pp. 11-15 (Feb. 2006).
Wittkower et al., "Smart-Cut Technology for SOI: A new high volume application for ion implantation", 2000 IEEE, pp. 269-272.
Yeo et al., "80nm 512M DRAM with Enhanced Data Retention Time Using Partially-Insulated Cell Array Transistor (PICAT)," 2004 Symposium on VLSI Technology, Digest of Technical Papers, pp. 30-31 (2004).
Yeo et al., "A Partially Insulated Field-Effect Transistor (PiFET) as a Candidate for Scaled Transistors," IEEE Electron Device Letters, vol. 25, No. 6 (Jun. 2004).

* cited by examiner

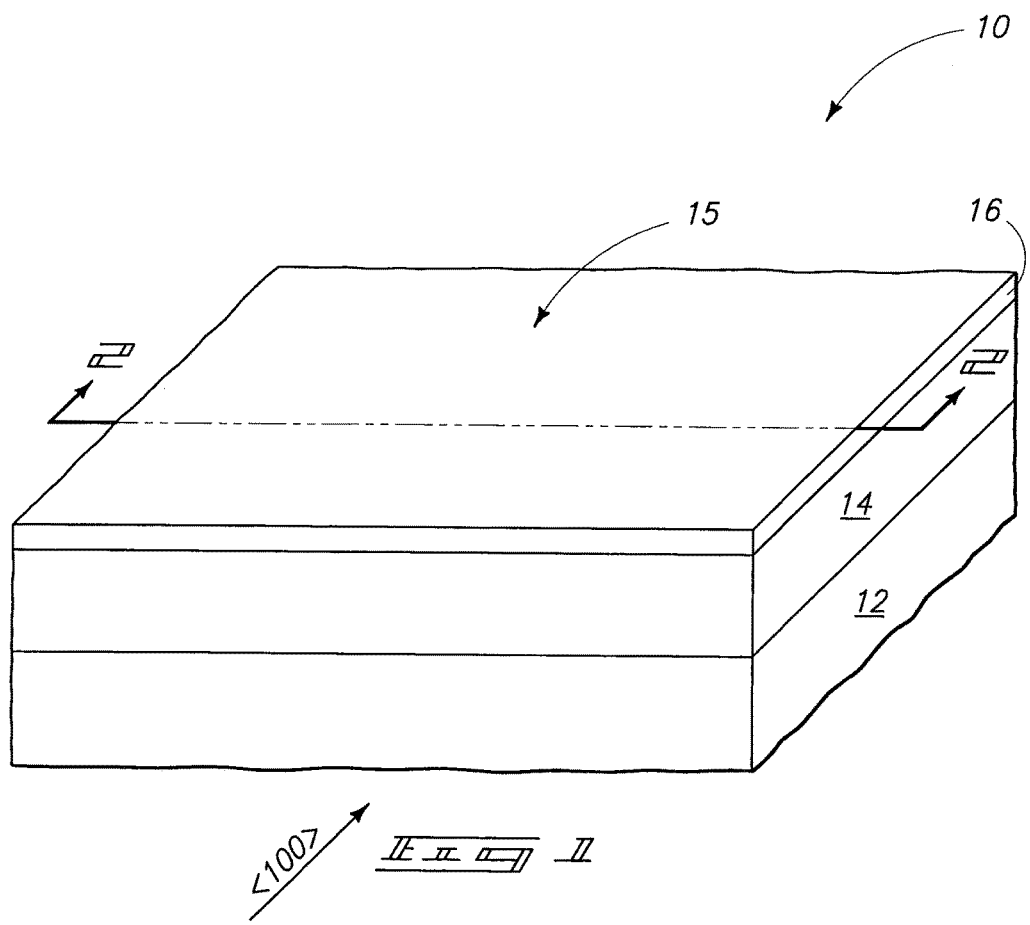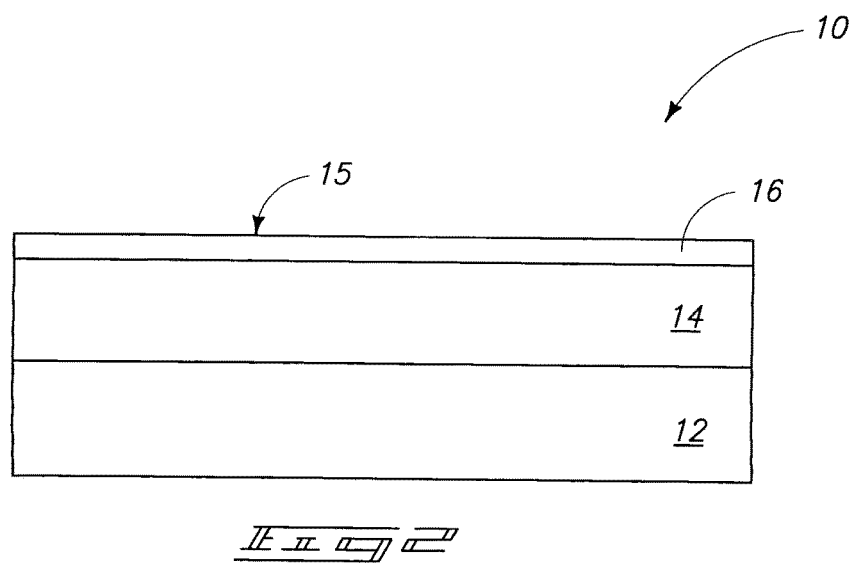

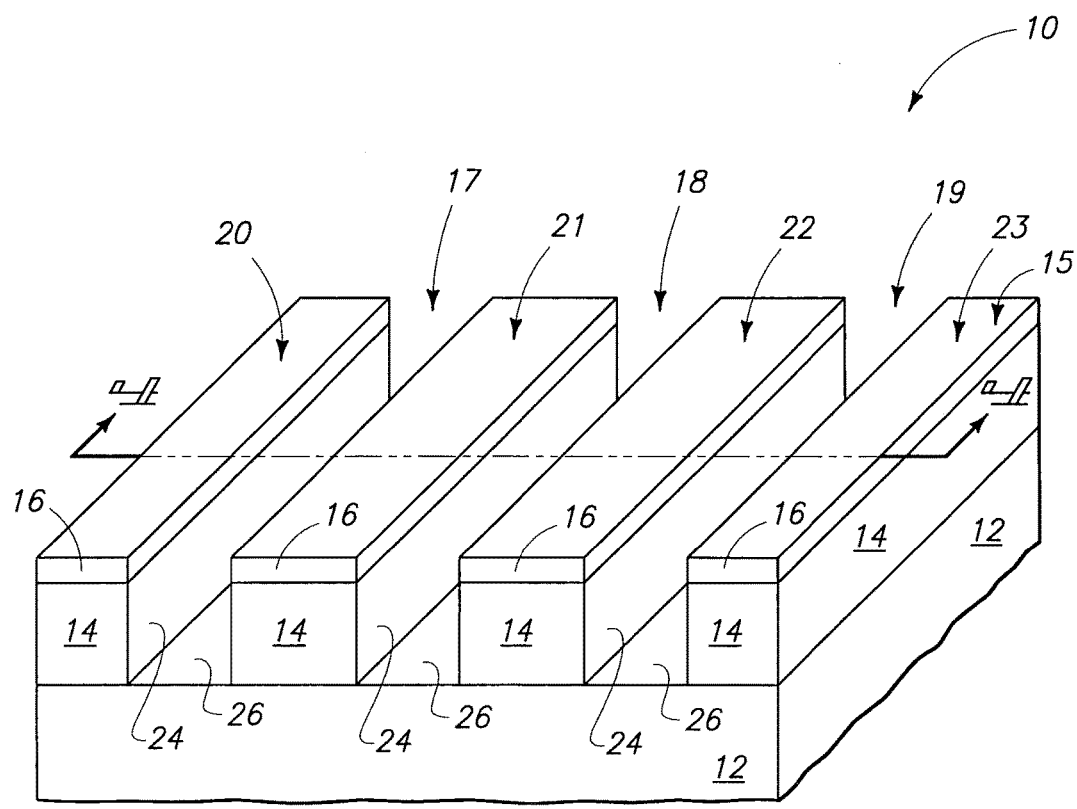
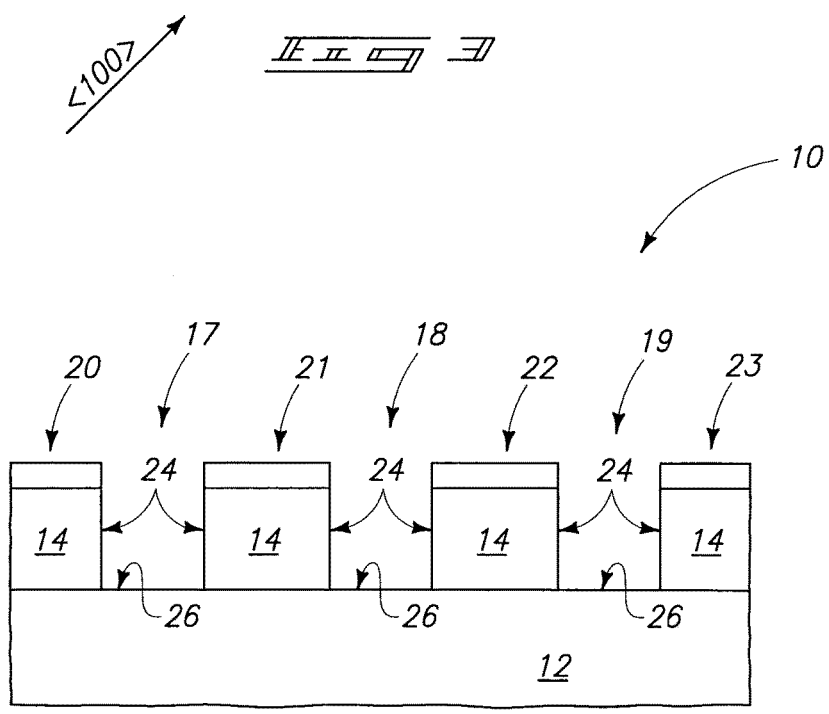

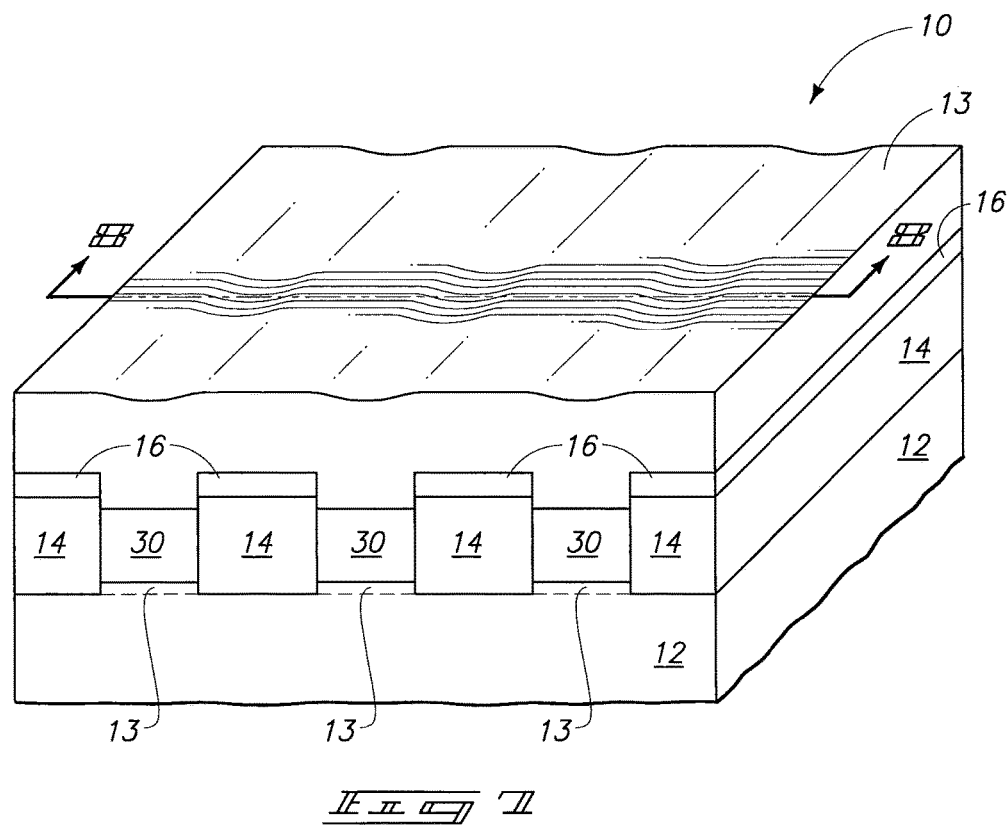
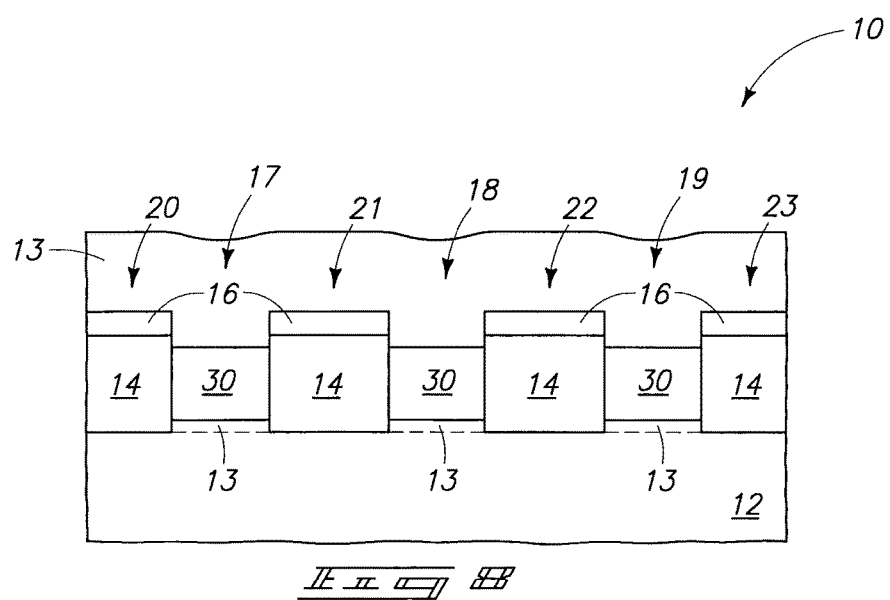

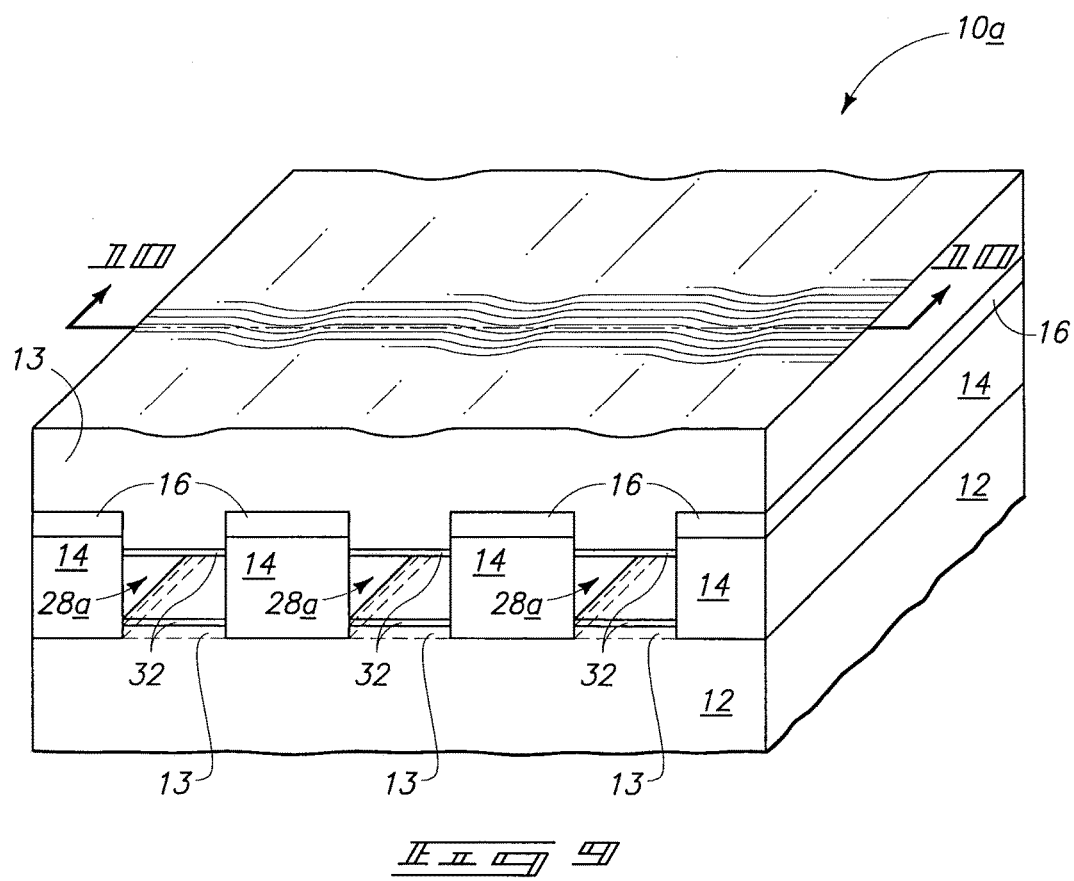
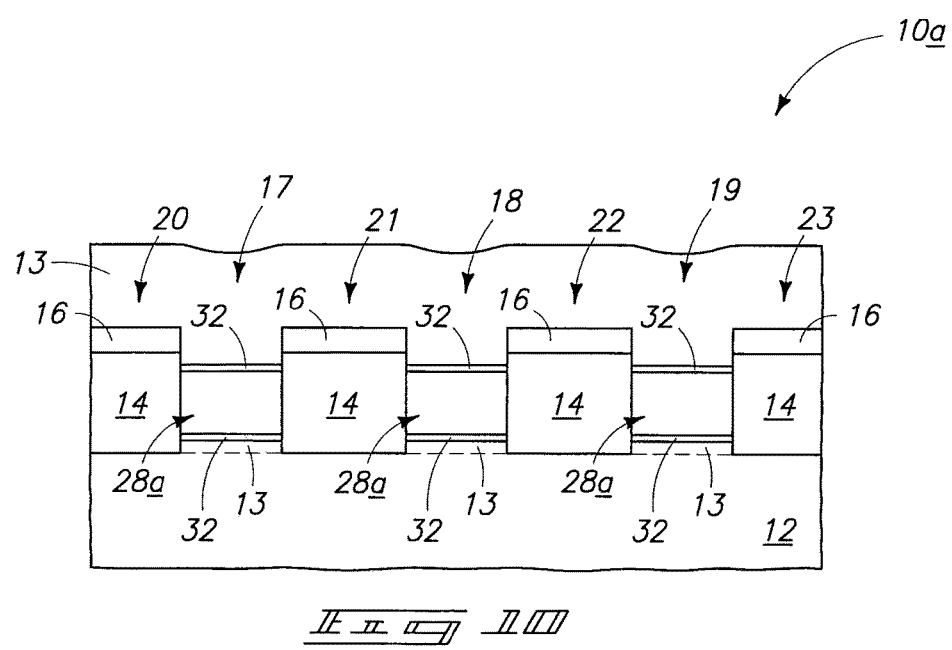

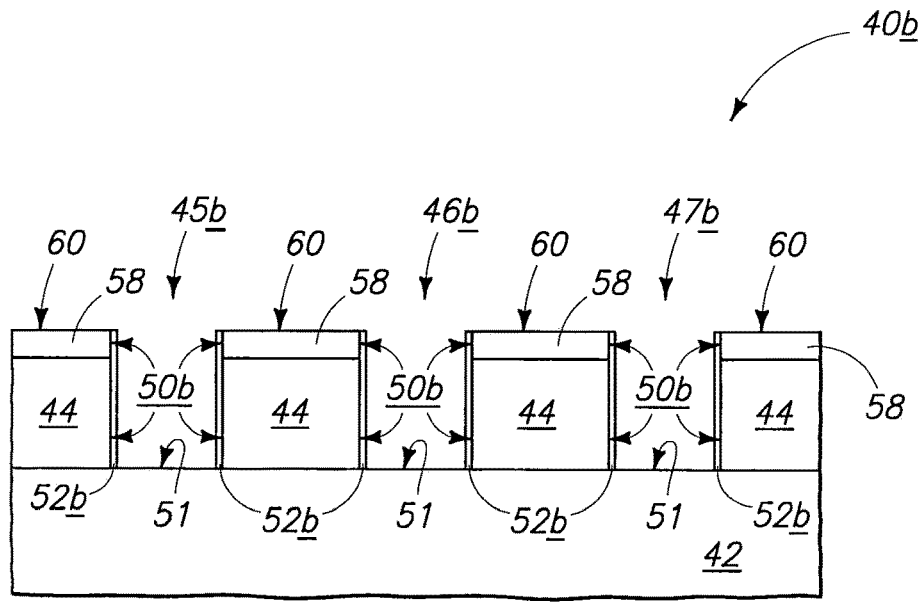
_FIG. 25_
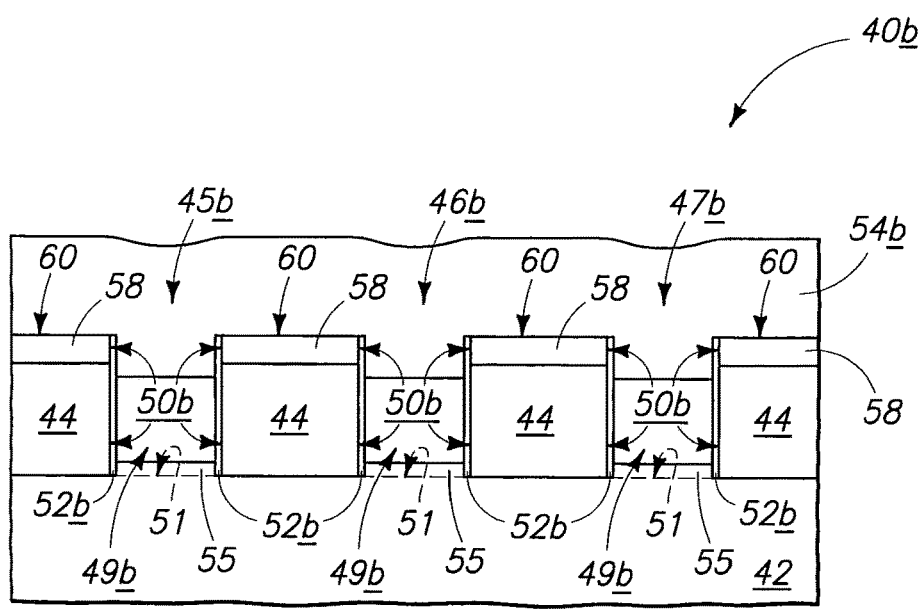
_FIG. 26_

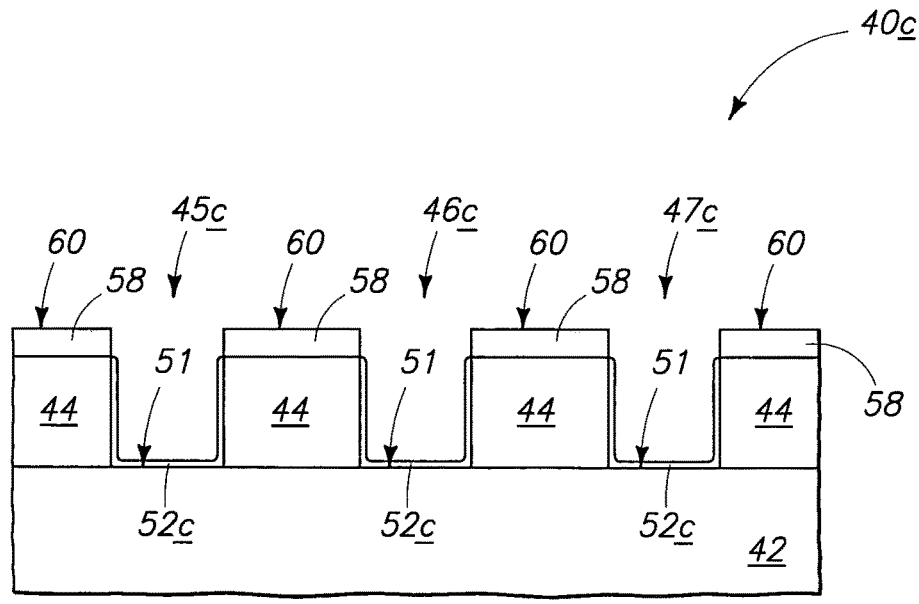
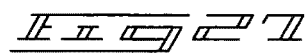
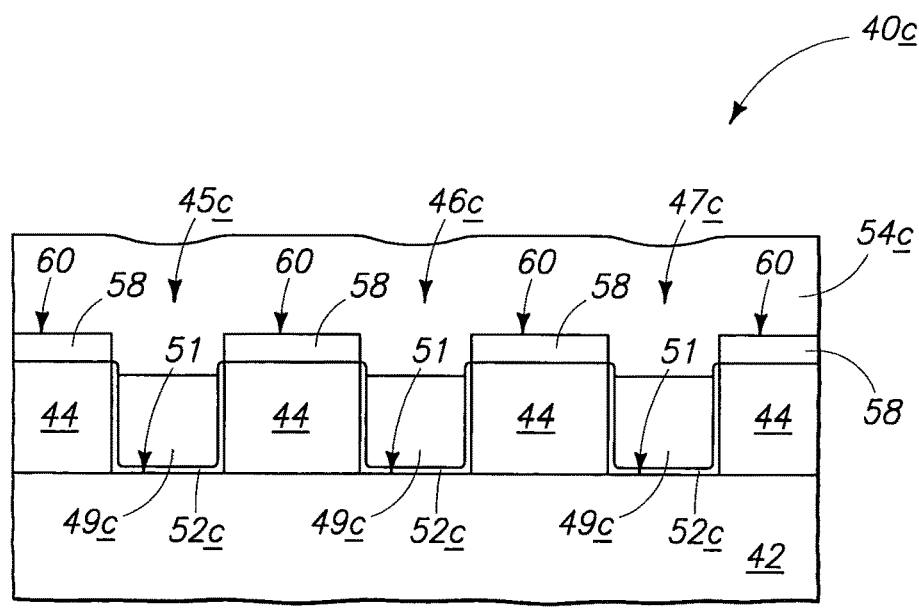

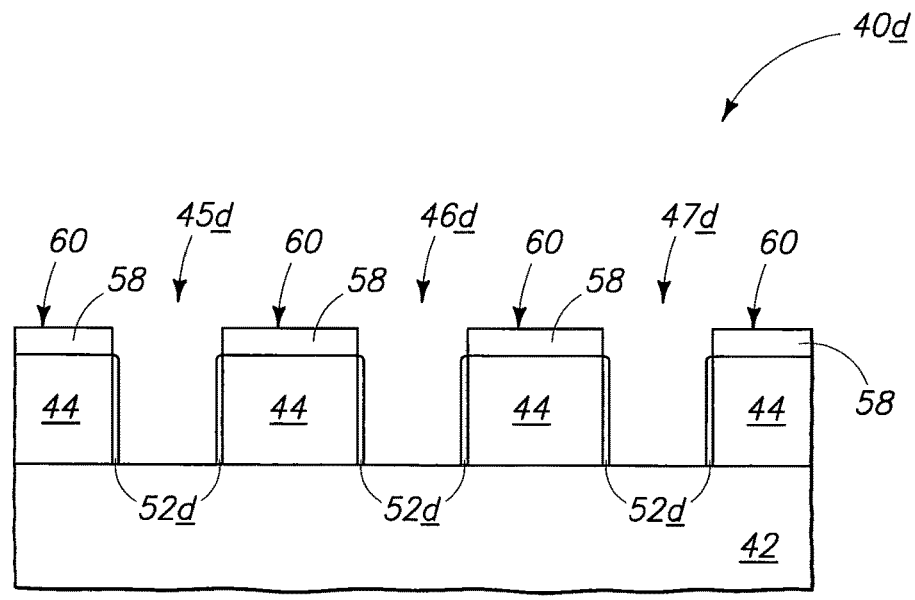
_FIG 29_
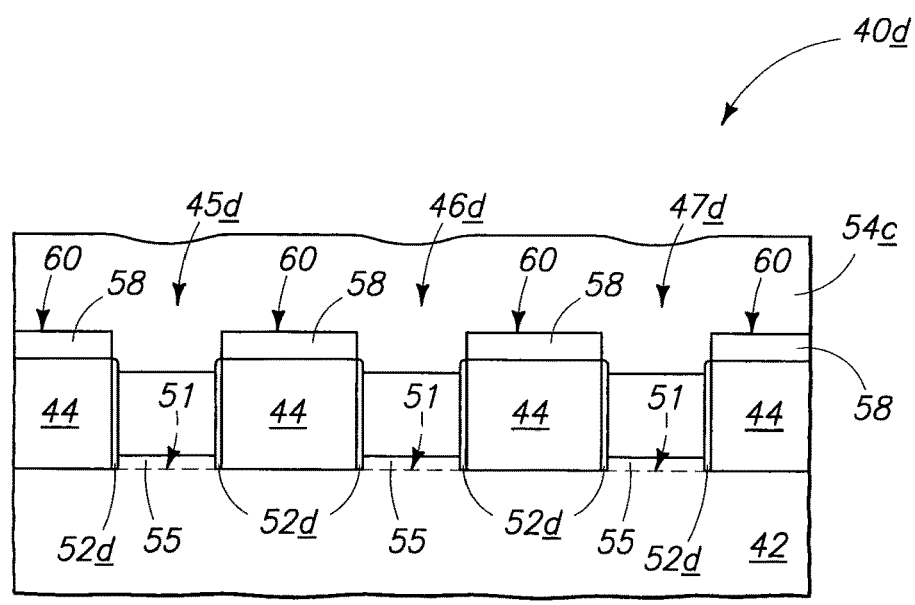
_FIG 30_

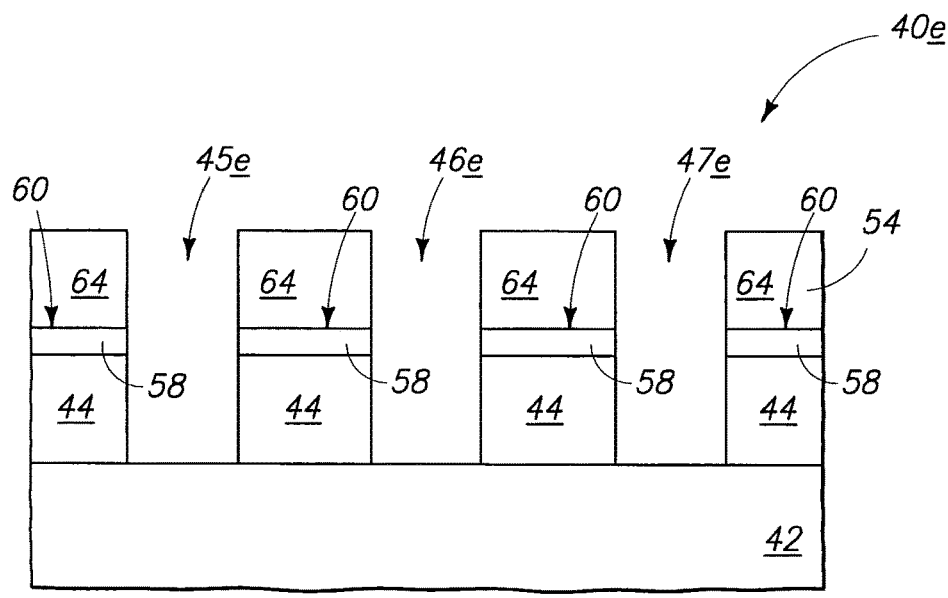
F I G 31
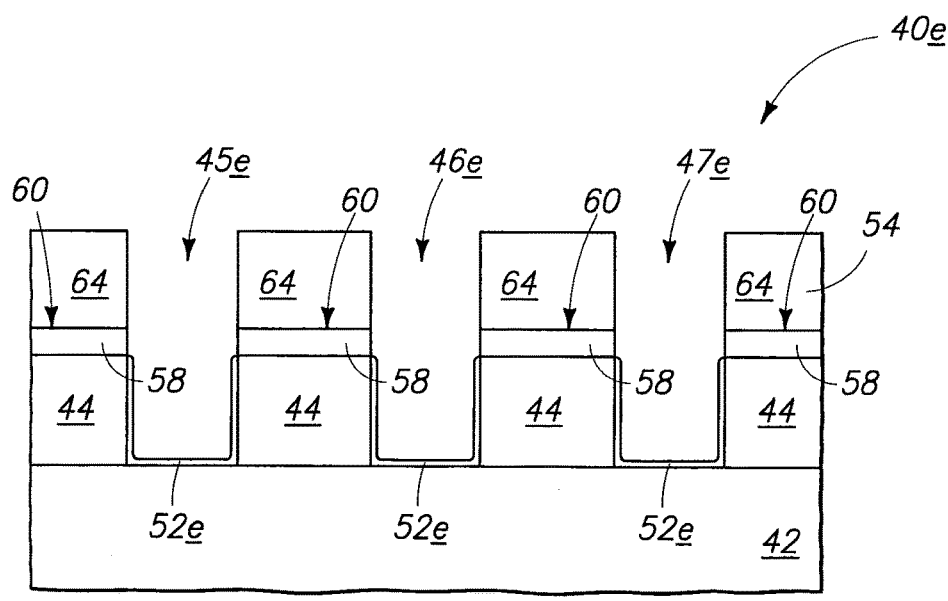
F I G 32

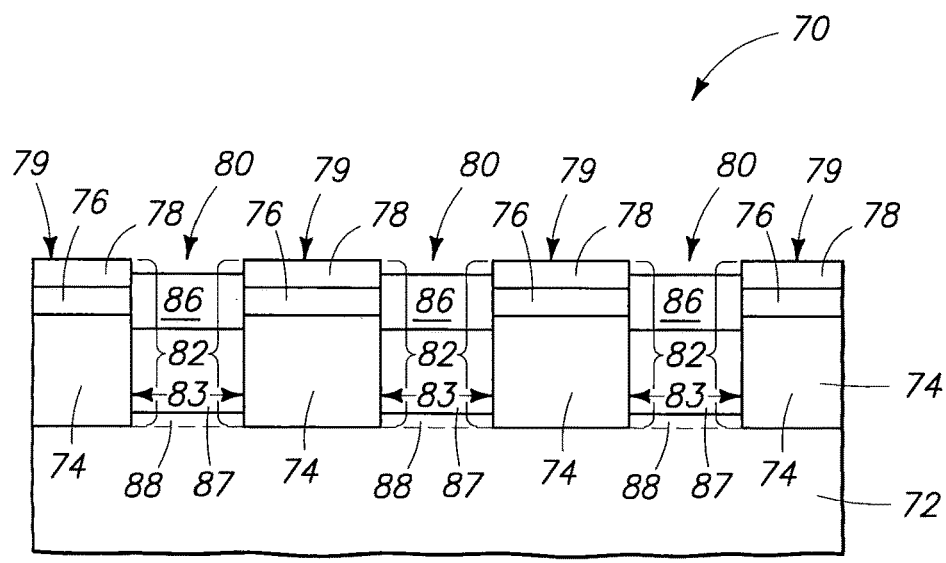
_Fig 41_
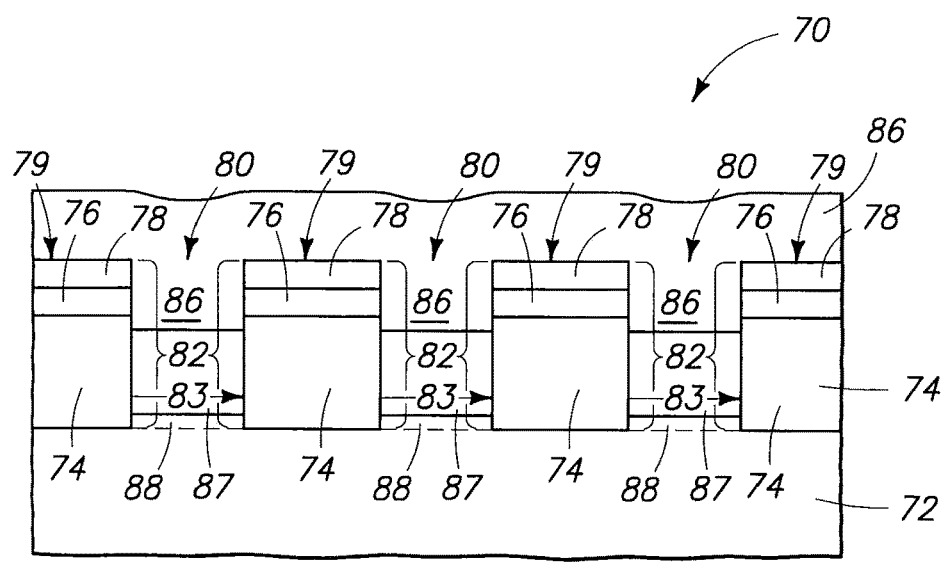
_Fig 42_

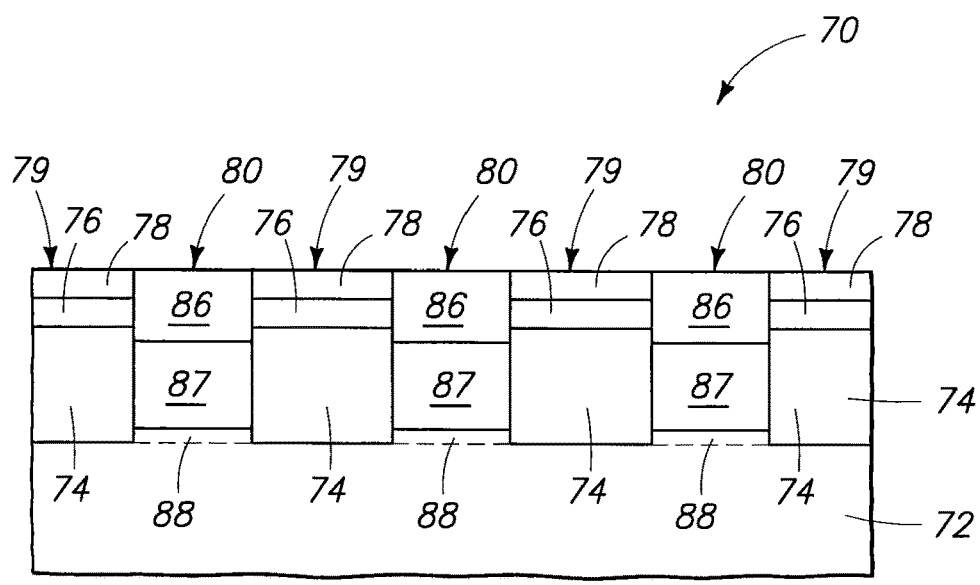
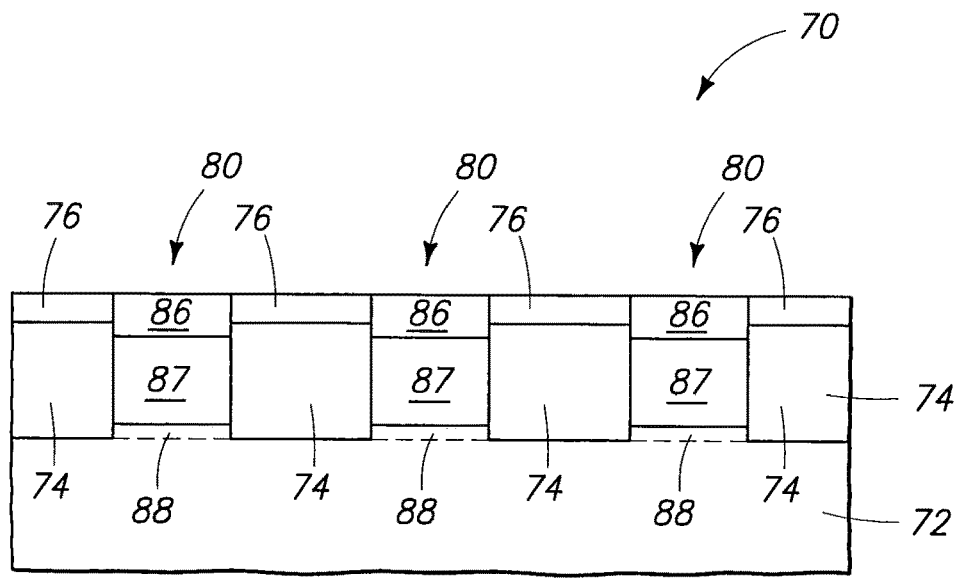

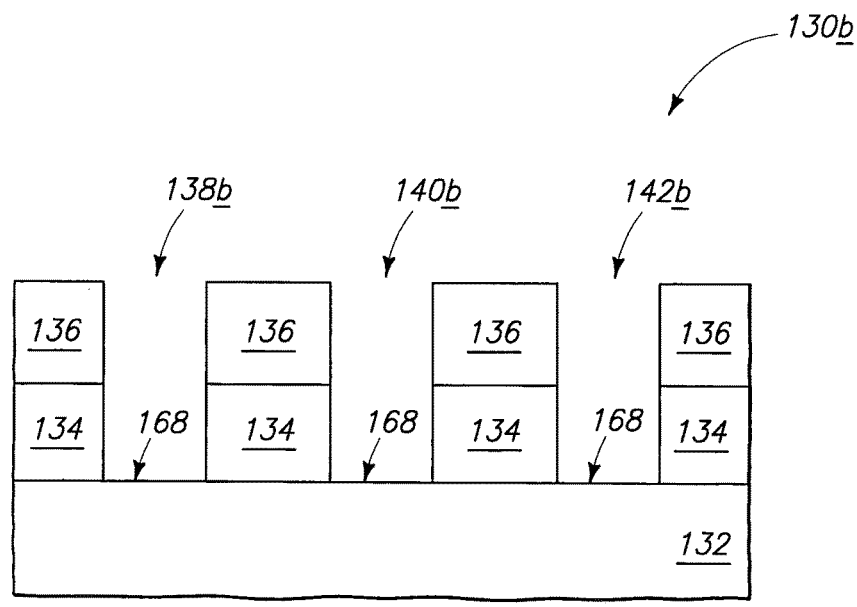
F I G 6 1
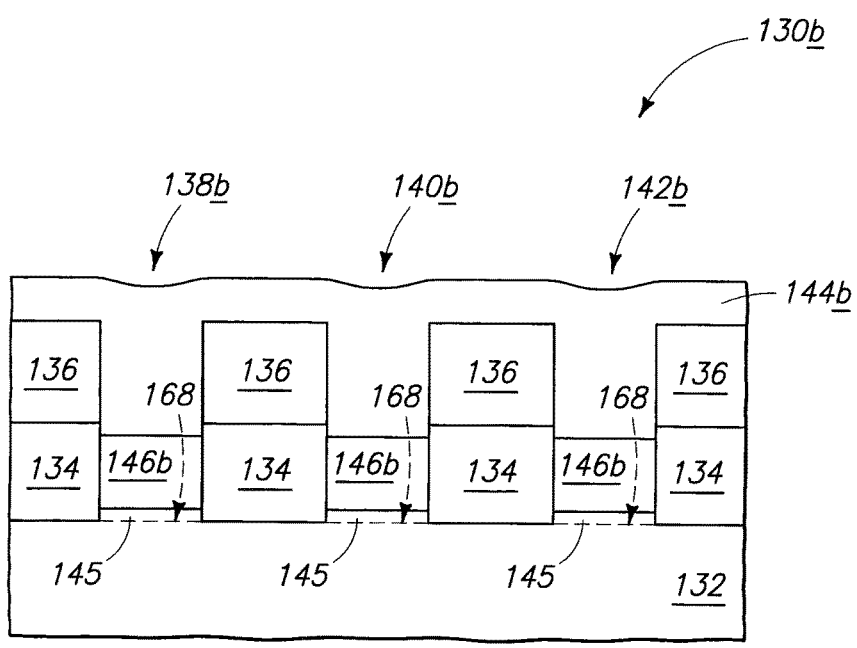
F I G 6 2

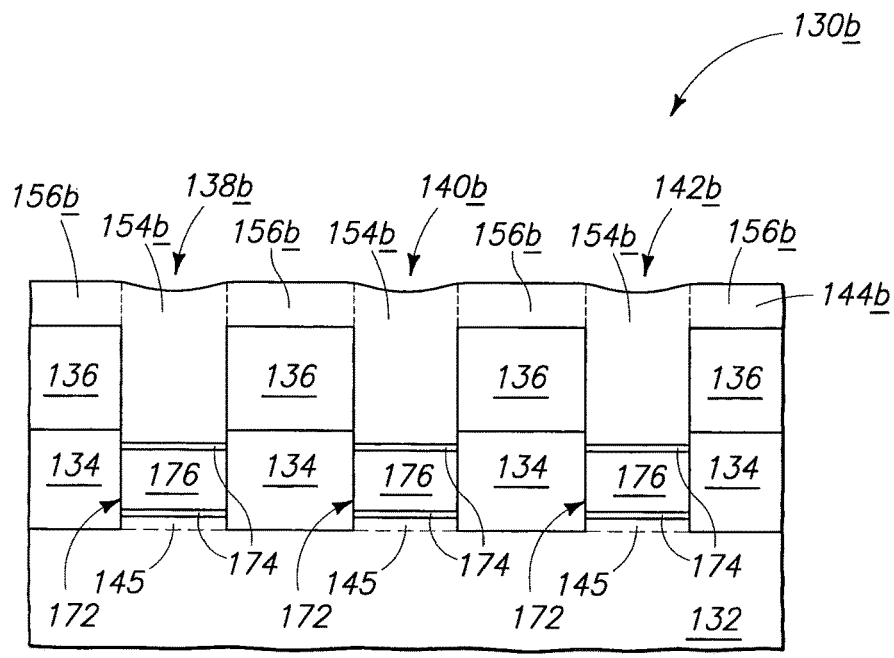
_FIG 63_
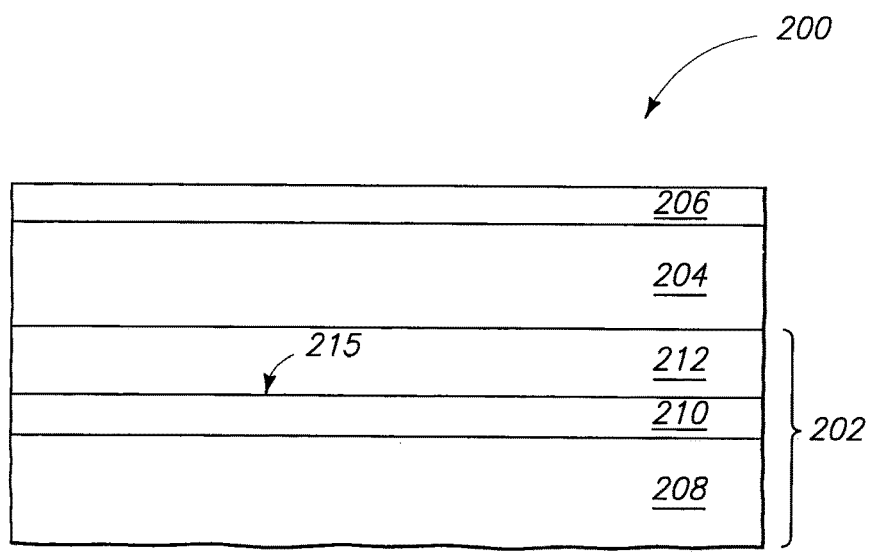
_FIG 64_

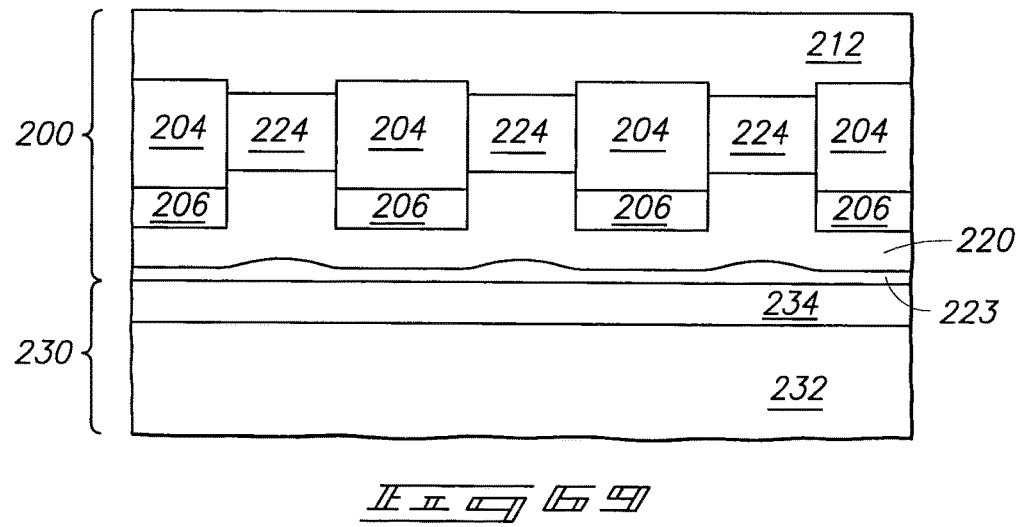
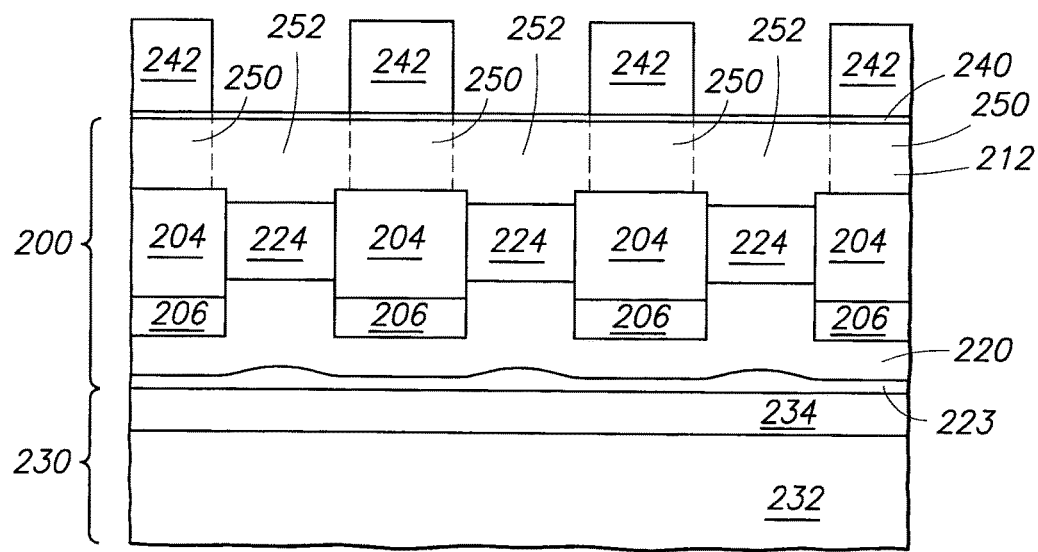

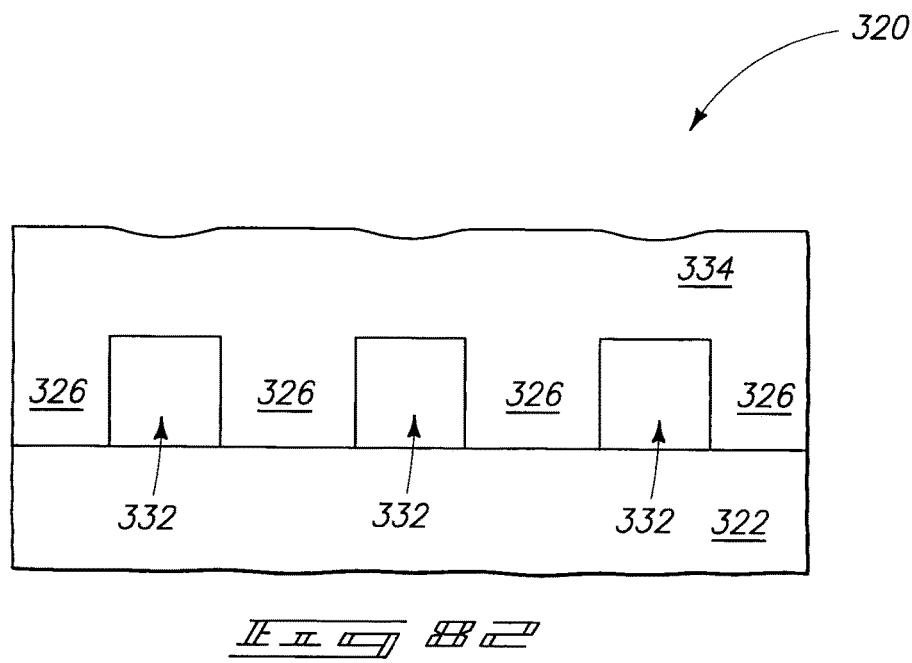
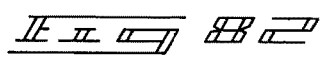
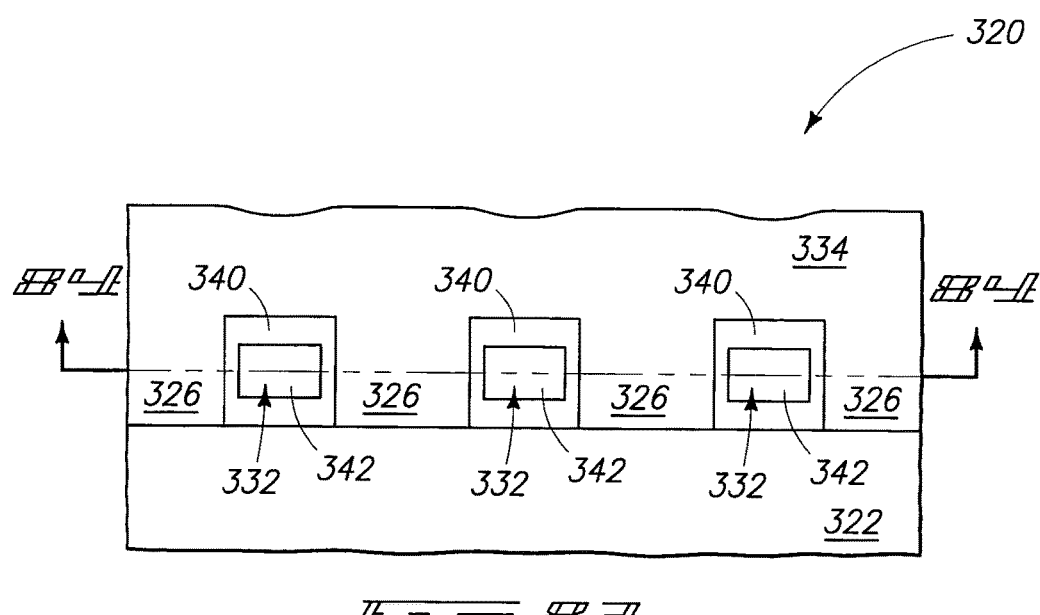

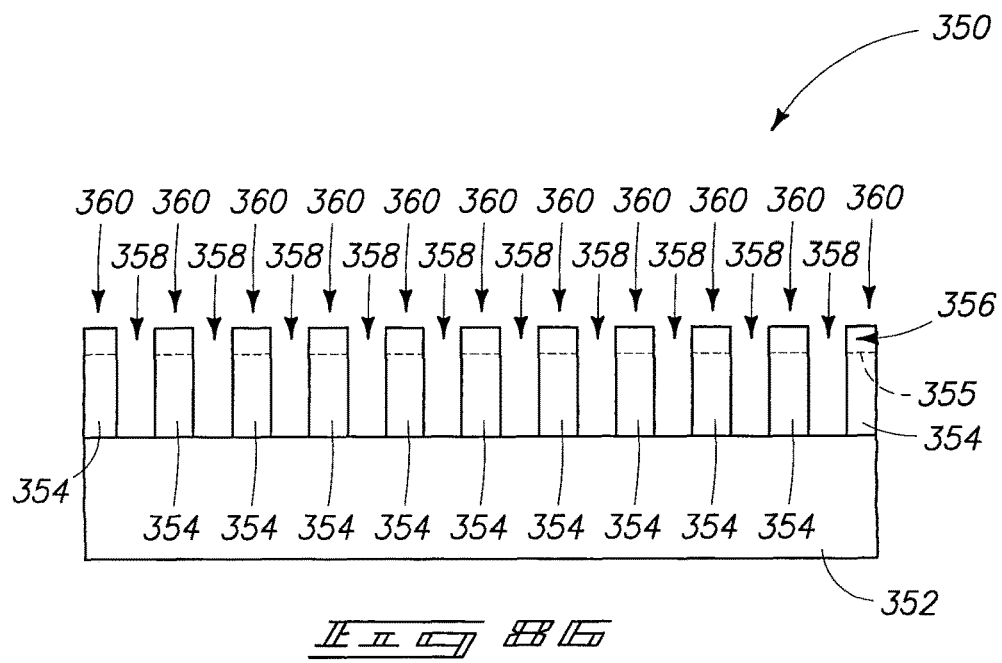
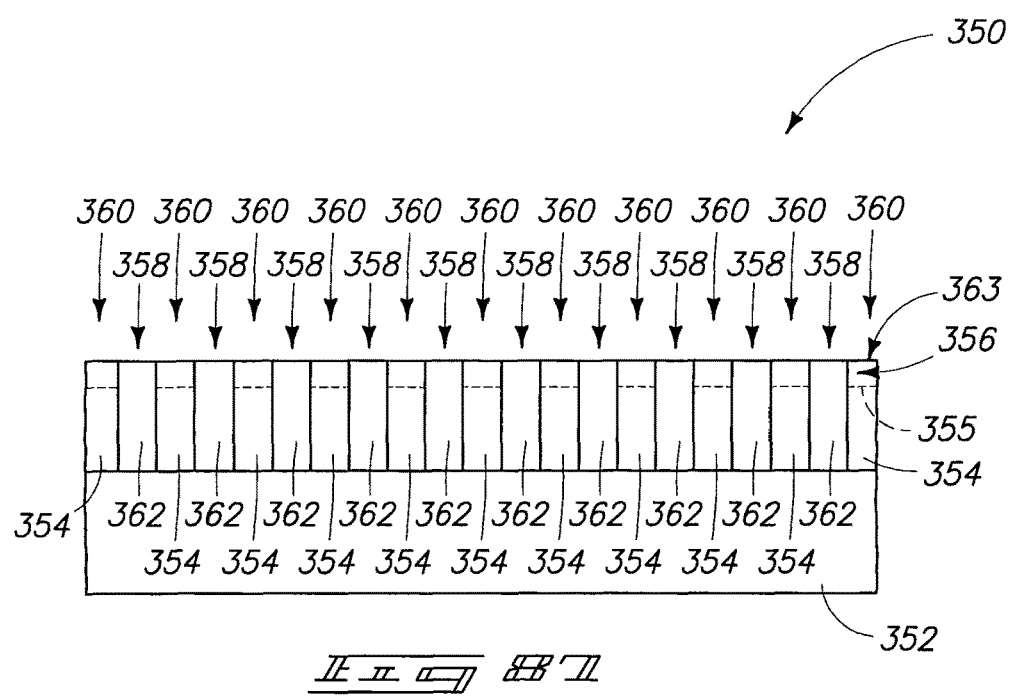

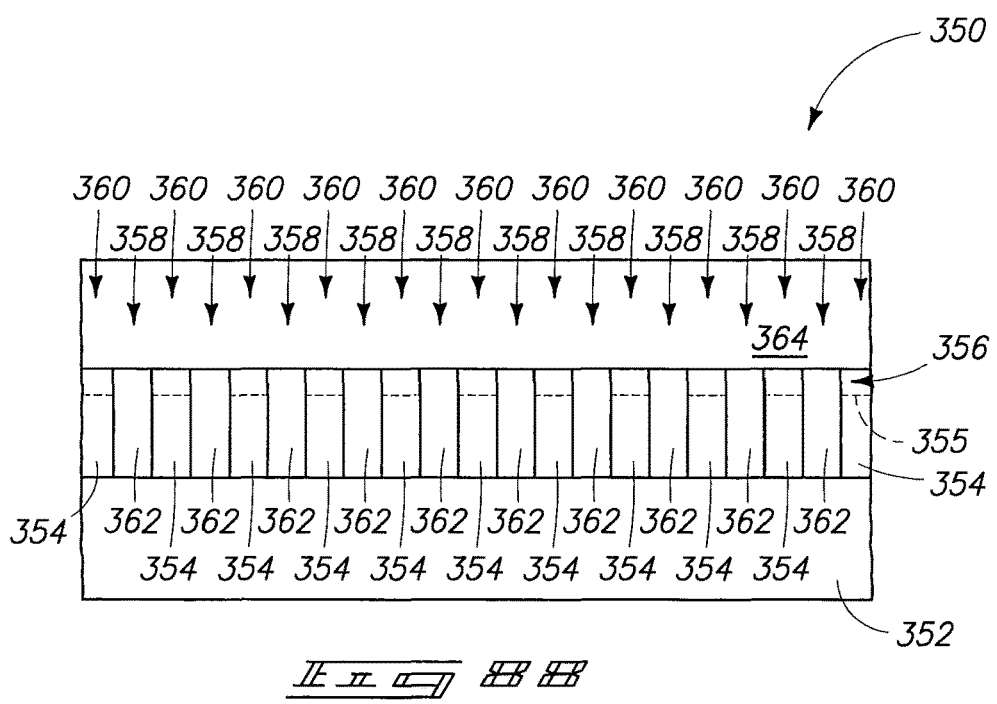
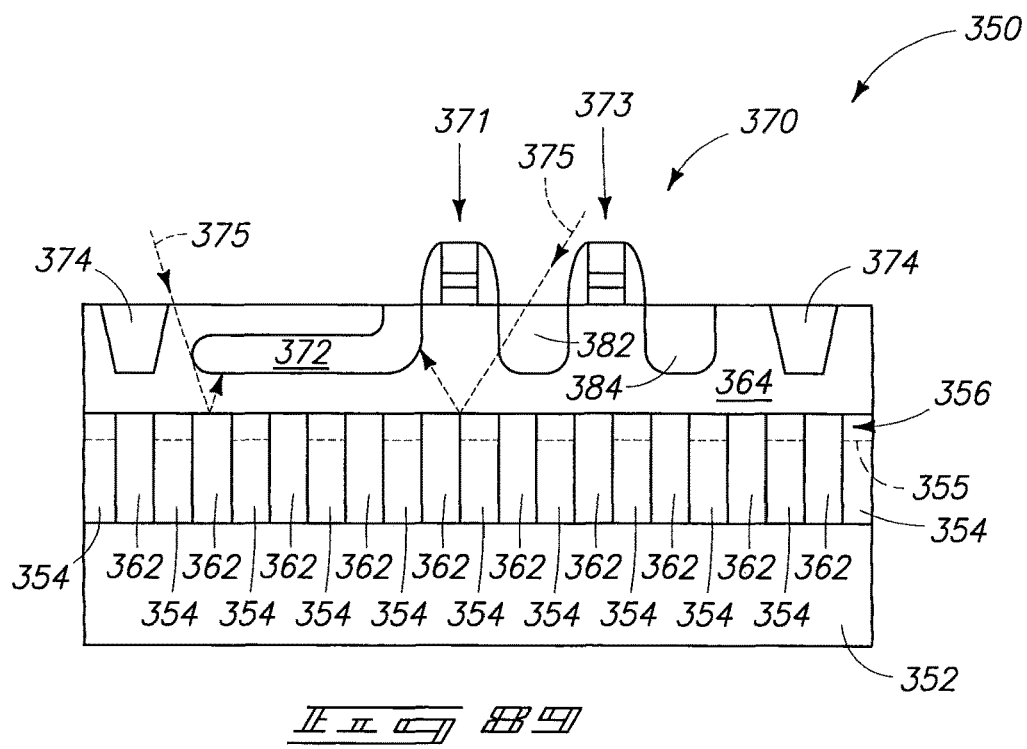

FLUORIMETRY SYSTEMS

RELATED PATENT DATA

This patent resulted from a divisional application of U.S. patent application Ser. No. 14/712,219, filed May 14, 2015, entitled "Methods of Forming One Or More Covered Voids In A Semiconductor Substrate", naming David H. Wells as inventor, which is a divisional application of U.S. patent application Ser. No. 13/971,169, filed Aug. 20, 2013, now U.S. Pat. No. 9,117,744, entitled "Methods of forming a Span Comprising Silicon Dioxide", naming David H. Wells as inventor, which is a divisional application of U.S. patent application Ser. No. 11/724,654, filed Mar. 14, 2007, now U.S. Pat. No. 8,617,966, entitled "Methods of Forming a Span Comprising Silicon Dioxide", naming David H. Wells as inventor, which is a continuation application of U.S. patent application Ser. No. 11/704,466, filed Feb. 7, 2007, now U.S. Pat. No. 7,989,322, entitled "Methods of Forming One or More Covered Voids in a Semiconductor Substrate, Methods of Forming Field Effect Transistor, Methods of Forming Semiconductor-on-Insulator Substrates, Methods of Forming a Span Comprising Silicon Dioxide, Methods of Cooling Semiconductor Devices, Methods of Forming electromagnetic Radiation Emitters and Conduits, Methods of Forming Imager Systems, Methods of Forming Nanofluidic Channels, Fluorimetry Methods, and Integrated Circuitry", naming David H. Wells as inventor, the disclosures of which are incorporated by reference.

TECHNICAL FIELD

Embodiments disclosed herein pertain to methods of forming one or more covered voids in semiconductor substrates, to methods of forming field effect transistors, to methods of forming semiconductor-on-insulator substrates, to methods of forming spans comprising silicon dioxide, to methods of forming electromagnetic radiation emitters and conduits, to methods of forming imager systems, to methods of forming nanofluidic channels, to fluorimetry methods, to methods of cooling semiconductor devices, and to integrated circuitry.

BACKGROUND OF THE INVENTION

A continuing goal in semiconductor device fabrication is to make the devices smaller and positioned closer to one another while maintaining the integrity and desired performance characteristics of the individual devices. Such has led to the development and improvement of various semiconductor constructions, including, for example, recessed access devices (RADs), semiconductor-on-insulator constructions, partial and/or pseudo semiconductor-on-insulator constructions, fin field effect transistors (FinFET) and others. Such may be used in logic, memory, or other circuitry, for example for use in dynamic random access memory (DRAM), NOR, NAND, FLASH memory, and floating body memory, among other semiconductor devices and circuitry. Semiconductor device fabrication has also been applied to the development of a diversity of micro-structures. For example, such include the development of optical wave guides fabricated in semiconductor materials and the development of micro-electro-mechanical systems (MEMS).

During fabrication, circuitry or micro-structures may be formed to have voids formed therein. Such may be wholly or partially filled with one or more materials during subsequent processing, left empty, or evacuated, and any remaining voids may be used for various purposes. Regardless, forming desired voids may be a challenge in achieving desired position and size of the voids.

A continuing goal of analytical sciences is to develop tools and methods for rapid separation and/or characterization of materials. For example, there is a continuing goal to develop tools for rapid separation and/or characterization of biomaterials, such as nucleotide sequences and amino acid sequences. There has been interest in developing microstructures suitable for utilization in the separation and/or characterization of materials, but there remains a need for improved methods for making and using such micro-structures.

BRIEF DESCRIPTION OF THE DRAWINGS

FIG. 1 is a diagrammatic perspective view of a portion of a substrate in process in accordance with an embodiment of the invention.

FIG. 2 is a view of the FIG. 1 substrate taken through line 2-2 in FIG. 1.

FIG. 4 is a view of the FIG. 3 substrate taken through line 4-4 in FIG. 3.

FIG. 7 is a view of the FIG. 5 substrate at a processing step subsequent to that shown by FIG. 5.

FIG. 8 is a view of the FIG. 7 substrate taken through line 8-8 in FIG. 7.

FIG. 10 is a view of the FIG. 9 substrate taken through line 10-10 in FIG. 9.

FIG. 25 is a view of the FIG. 24 substrate at a processing step subsequent to that shown by FIG. 24.

FIG. 26 is a view of the FIG. 25 substrate at a processing step subsequent to that shown by FIG. 25.

FIG. 27 is a diagrammatic sectional view of a portion of a substrate in process in accordance with an embodiment of the invention.

FIG. 28 is a view of the FIG. 27 substrate at a processing step subsequent to that shown by FIG. 27.

FIG. 29 is a diagrammatic sectional view of a portion of a substrate in process in accordance with an embodiment of the invention.

FIG. 30 is a view of the FIG. 29 substrate at a processing step subsequent to that shown by FIG. 29.

FIG. 31 is a diagrammatic sectional view of a portion of a substrate in process in accordance with an embodiment of the invention.

FIG. 32 is a view of the FIG. 31 substrate at a processing step subsequent to that shown by FIG. 31.

FIG. 37 is a diagrammatic sectional view of a portion of a substrate in process in accordance with an embodiment of the invention.

FIG. 38 is a view of the FIG. 37 substrate at a processing step subsequent to that shown by FIG. 37.

FIG. 41 is a view of the FIG. 40 substrate at a processing step subsequent to that shown by FIG. 40.

FIG. 42 is a view of the FIG. 41 substrate at a processing step subsequent to that shown by FIG. 41.

FIG. 43 is a view of the FIG. 42 substrate at a processing step subsequent to that shown by FIG. 42.

FIG. 44 is a view of the FIG. 43 substrate at a processing step subsequent to that shown by FIG. 43.

FIG. 61 is a diagrammatic sectional view of a portion of a substrate in process in accordance with an embodiment of the invention.

FIG. 62 is a view of the FIG. 61 substrate at a processing step subsequent to that shown by FIG. 61.

FIG. 63 is a view of the FIG. 62 substrate at a processing step subsequent to that shown by FIG. 62.

FIG. 64 is a diagrammatic sectional view of a portion of a substrate in process in accordance with an embodiment of the invention.

FIG. 69 is a view of the FIG. 68 substrate at a processing step subsequent to that shown by FIG. 68.

FIG. 70 is a view of the FIG. 69 substrate at a processing step subsequent to that shown by FIG. 69.

FIG. 78 is a view of the FIG. 77 substrate at a processing step subsequent to that of FIG. 77.

FIG. 79 is a top sectional view of the FIG. 78 substrate along the line 79-79; with the FIG. 78 view being along the line 78-78 of FIG. 79.

FIG. 82 is a view of the FIG. 81 substrate at a processing step subsequent to that of FIG. 81.

FIG. 83 is a view of the FIG. 82 substrate at a processing step subsequent to that of FIG. 82.

FIG. 86 is a view of the FIG. 85 substrate at a processing step subsequent to that of FIG. 85.

FIG. 87 is a view of the FIG. 86 substrate at a processing step subsequent to that of FIG. 86.

FIG. 88 is a view of the FIG. 87 substrate at a processing step subsequent to that of FIG. 87.

FIG. 89 is a view of the FIG. 88 substrate at a processing step subsequent to that of FIG. 88.

FIG. 90 is a diagrammatic sectional view of a portion of a substrate in process in accordance with an embodiment of the invention.

FIG. 91 is a view of the FIG. 90 substrate at a processing step subsequent to that of FIG. 90.

FIG. 98 is a diagrammatic perspective view of the substrate of FIGS. 96 and 97.

DETAILED DESCRIPTION OF EMBODIMENTS

Figure 5:
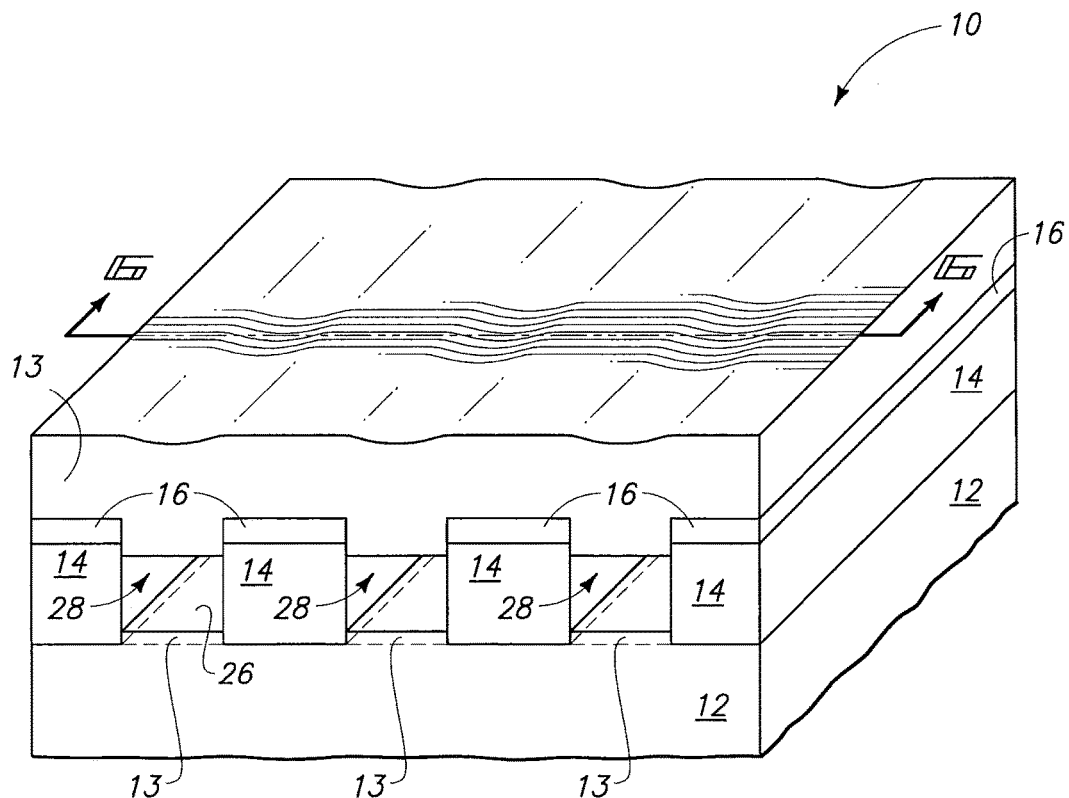
FIG. 5 is a view of the FIG. 3 substrate at a processing step subsequent to that shown by FIG. 3.

Example embodiments of methods of forming one or more covered voids in a semiconductor substrate are initially described. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. The covered void(s) may be subsequently filled in whole or in part with solid, liquid, and/or gaseous material(s). One or more remaining voids may be evacuated of gas therein. Further, a covered void may exist in the final construction being fabricated, a void may be partially filled, or a void may be completely filled such that no portion of the void exists in the final construction being fabricated. Further and regardless, the one or more covered voids may be wholly or partially formed within semiconductive material of the semiconductor substrate or be received entirely outside of any semiconductor material of the semiconductor substrate.

Referring initially to FIGS. 1 and 2, a portion of a semiconductor substrate is indicated generally with reference numeral 10. In one embodiment, substrate portion 10 may be considered as comprising a first material 12, a second material 14, and a third material 16. In one embodiment, first material 12 comprises a semiconductor material. For example and by way of example only, material 12 may comprise, consist essentially of, or consist of one or more of Si, Ge, Ga, Ga/Al, Si/Ge, Ga/As, SiC, and Ga/Al/N, and may be monocrystalline, polycrystalline, or amorphous. For instance, semiconductive material 12 may comprise elemental form silicon, for example monocrystalline silicon such as bulk monocrystalline silicon of a bulk wafer. In one embodiment, substrate 12 comprises a monocrystalline-containing substrate comprising a <100> plane direction as shown (FIG. 1).

Second material 14 is formed over first material 12, and is in whole or in part compositionally different from first material 12. Second material 14 may be one or more of insulative, conductive, or semiconductive. Example semiconductive materials include those described above for first substrate material 12. Example conductive materials include any conductive metal, alloy of conductive metals, or any suitable conductive metal compound. Example insulative materials include at least one of silicon dioxide or silicon nitride. An example thickness range for second material 14 is from about 1,500 Angstroms to about 3,000 Angstroms.

Third material 16 is received over second material 14, and is in whole or in part compositionally different from second material 14. An example thickness range for material 16 is from about 200 Angstroms to about 800 Angstroms. Third material 16 may be compositionally the same as or different from first material 12. Regardless, example third materials include elemental-form silicon, including for example elemental-form amorphous silicon and/or monocrystalline silicon, and any one or more of elemental-form W, elemental-form Ti, a silicide, elemental-form Ge, and a combination of Ga and As. In some embodiments, material 16 may be considered as an "epitaxial seed material" which is different compositionally from second material 14. In the context of this document, an "epitaxial seed material" is a material which will seed epitaxial growth of a material of the same composition as or different composition from the epitaxial seed material, with some example epitaxial growth being described in examples below. The epitaxial seed material may or may not have been epitaxially grown itself. In some embodiments, material 16 may be considered as a "seed material" (not preceded by "epitaxial") which is different compositionally from second material 14. In the context of this document, a "seed material" (not preceded by "epitaxial") is a material which will facilitate growth of a material of the same composition as or different composition from the seed material. In one embodiment, semiconductor substrate 10 may be considered as comprising or defining some mean outermost global surface 15 which may or may not be substantially planar.

Figure 3F:
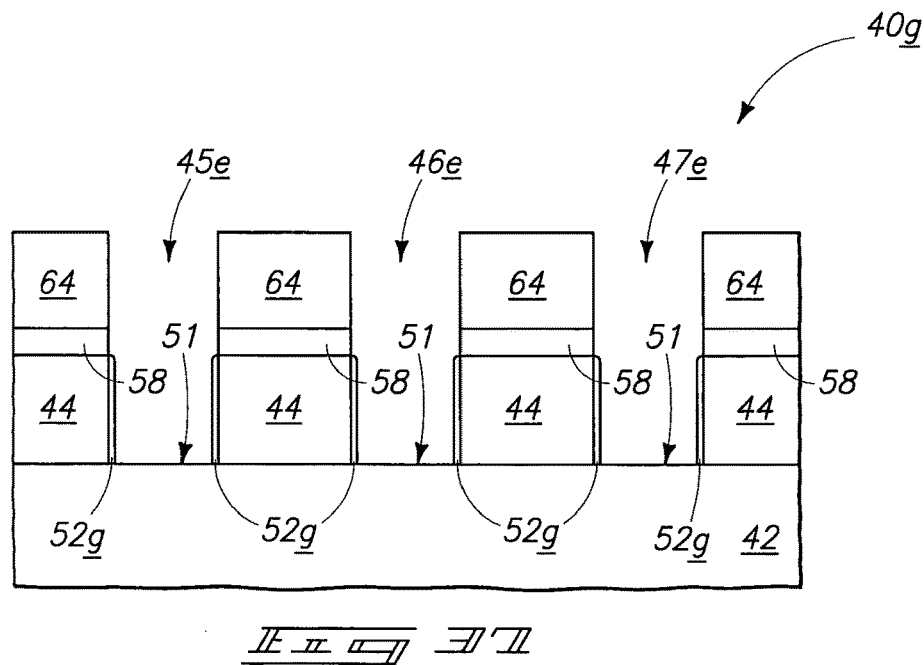
FIG. 3 is a view of the FIG. 1 substrate at a processing step subsequent to that shown by FIG. 1.
Figure 3H:
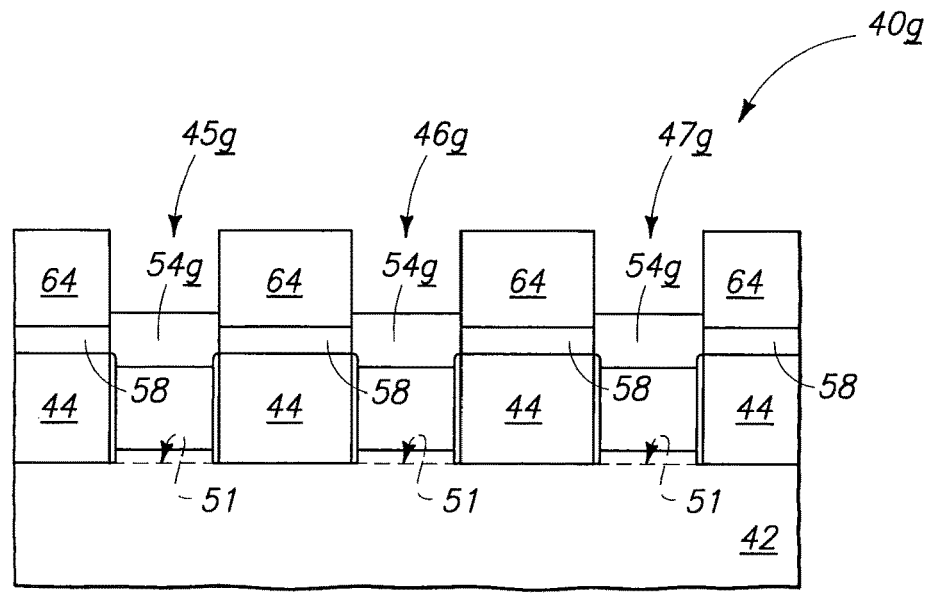

Referring to FIGS. 3 and 4, a plurality of openings 17, 18, and 19 have been formed through third material 16 and second material 14 to first material 12. In one embodiment, such may be considered as forming or providing substrate projections 20, 21, 22, and 23. In one embodiment, any two immediately adjacent of such projections may be considered as comprising a pair of projections comprising second material 14 which projects upwardly from or relative to first material 12, and which comprises projection sidewalls 24. Openings 17, 18 and 19 may also, of course, be formed to extend into first material 12 (not shown) as opposed to immediately terminating at the outermost surface thereof.

Such provides but one example embodiment of providing exposed different first and second materials on a semiconductor substrate, where the second material comprises a pair of projections projecting upwardly relative to the first material and comprises sidewalls which in the depicted example comprise walls of an opening. An exposed third material is provided atop the second material projections. In one embodiment, a plurality of such openings may be formed by any suitable etching or other technique(s), and whether existing or yet-to-be developed. In the FIGS. 3 and 4 example, openings 17, 18, and 19 are provided to comprise elongated trenches running generally parallel mean outermost global surface 15. In one embodiment, trenches 17, 18 and 19 may comprise monocrystalline-containing material bases 26 which run parallel the <100> plane direction.

Figure 6:
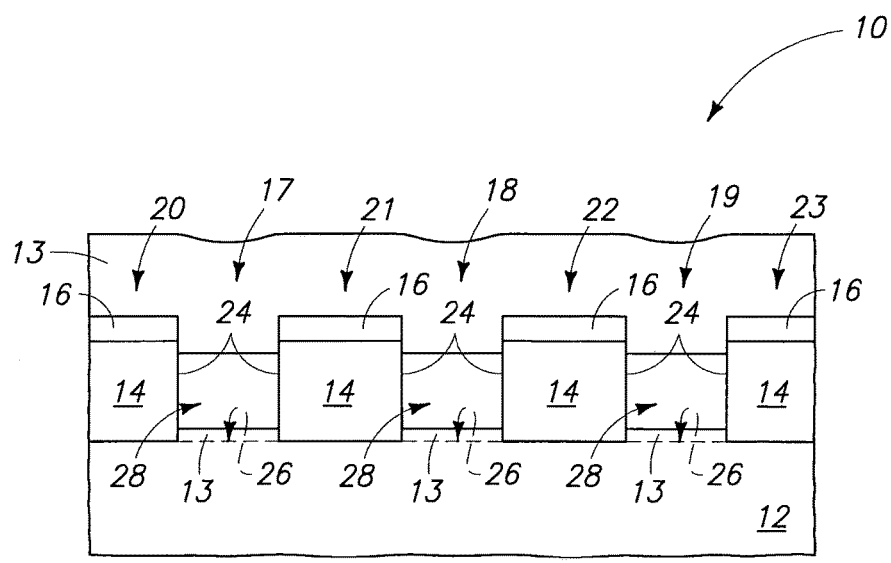
FIG. 6 is a view of the FIG. 5 substrate taken through line 6-6 in FIG. 5.

Referring to FIGS. 5 and 6, additional first material 13 has been selectively grown (relative to the second material, at least) from exposed first material 12 and selectively (relative to the second material, at least) from exposed third material 16 effective to bridge across the respective pairs of second material projections to form covered voids 28 between the respective pairs of projections. In the context of this document, selective growth defines a rate of growth which is at least 2:1 compared to all other different composition exposed material, or at least to some other different composition exposed material to which the selectively grown material is being compared, for at least about 100 Angstroms of growth. By way of example only, the selectively growing may be of conductive material or semiconductive material. In one embodiment, the selectively growing is devoid of growing detectable first material 13 from at least a majority of second material sidewalls 24. In the example FIGS. 5 and 6 embodiment, essentially no additional first material 13 grows from sidewalls 24, with the depicted covering of portions of sidewalls 24 by material 13 within openings 17, 18, and 19 only occurring as the result of upward growth of material 13 from first material 12 and itself, and downwardly of material 13 from third material 16 and itself. As material 12 and 13 are each of the first material, former bases 26 of material 12 within openings 17, 18, and 19 are shown as dashed lines. Such interface of material 12 and 13 may or may not be perceptible. In one embodiment the selectively growing is at a selectivity relative to the second material of at least ten to one, and in one embodiment at least one hundred to one. In one embodiment, the selectively growing of the first material is of at least 100 Angstroms and achieves selectivity relative to the second material of at least one hundred to one.

In one embodiment, the selectively growing comprises epitaxial silicon-comprising growth. For example and by way of example only, a manner of selectively growing epitaxial silicon from example monocrystalline silicon material 12 and where third material 16 comprises monocrystalline silicon, and/or any one or more of elemental-form W, elemental-form Ti, or a silicide, includes chemical vapor deposition using dichlorosilane, hydrogen chloride, and hydrogen at a temperature of 850° C. and at a pressure of 40 Torr. In one embodiment, the selectively growing comprises growing any one or more of elemental-form W or a silicide. For example, where third material 16 comprises elemental-form silicon, elemental-form W may be selectively grown from material 16 by chemical vapor deposition using $WF_6$ and a silane as precursors at 350 degrees C. and 20 mTorr, and otherwise as described in U.S. Pat. No. 5,043,299. For example, where third material 16 comprises elemental-form silicon, titanium silicide may be selectively grown from material 16 by plasma enhanced chemical vapor deposition including simultaneously flowing titanium tetrachloride and hydrogen to the substrate at a temperature of from about 550 degrees C. to about 680 degrees C. at a pressure of about 5 Torr to about 8 Torr (with or without plasma).

In one embodiment, the selectively growing comprises polysilicon-comprising growth.

In one embodiment where the first material comprises monocrystalline elemental-form silicon comprising a <100> plane direction, third material comprises elemental-form monocrystalline silicon comprising a <100> plane direction which is parallel that of the first material. Regardless, in one embodiment where the first material comprises monocrystalline elemental-form silicon comprising a <100> plane direction, openings (which may include trenches) are etched to have sides running parallel such <100> plane direction.

In one embodiment, a method of forming a covered void in a semiconductor substrate comprises forming a pair of projections projecting upwardly from a semiconductor substrate. By way of example only, any two adjacent of projections 20, 21, 22, and 23 may constitute an example pair of such projections. Elemental-form silicon is provided atop the pair of projections. For example, material/layer 16 may comprise any elemental-form silicon. A polysilicon-comprising material is selectively grown relative to at least portions of the projection sidewalls from the elemental-form silicon effective to bridge across the pair of openings to form a covered void between the pair of projections. In one embodiment, at least some of the selectively grown polysilicon-comprising material is oxidized to form a silicon dioxide-comprising bridge atop the covered void. In one embodiment, all such material is oxidized.

Figure 103:
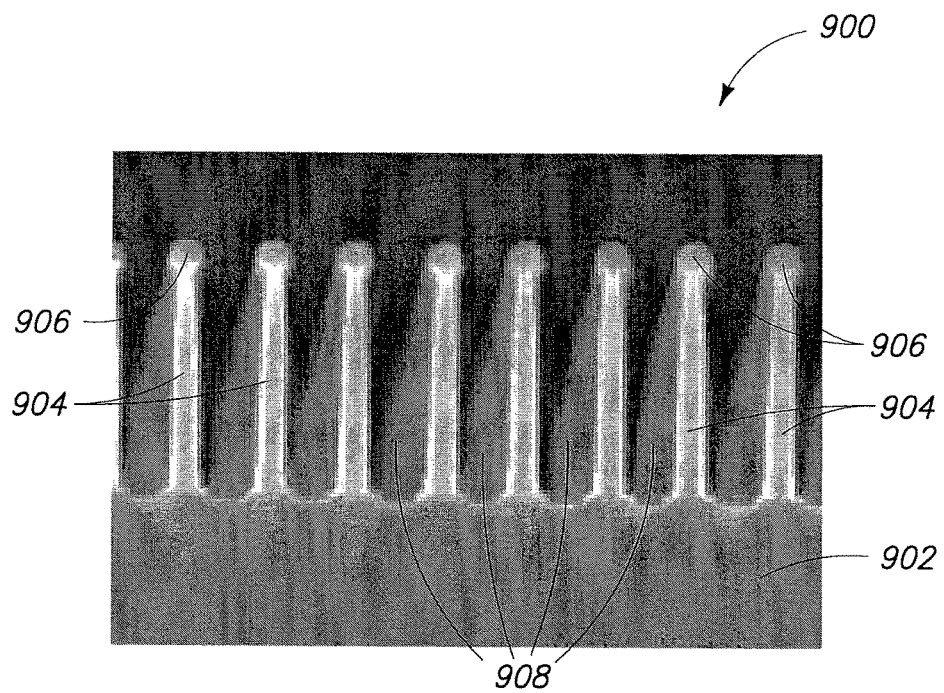
FIG. 103 is a photomicrograph of a substrate in process in accordance with one embodiment of the invention.
Figure 104:
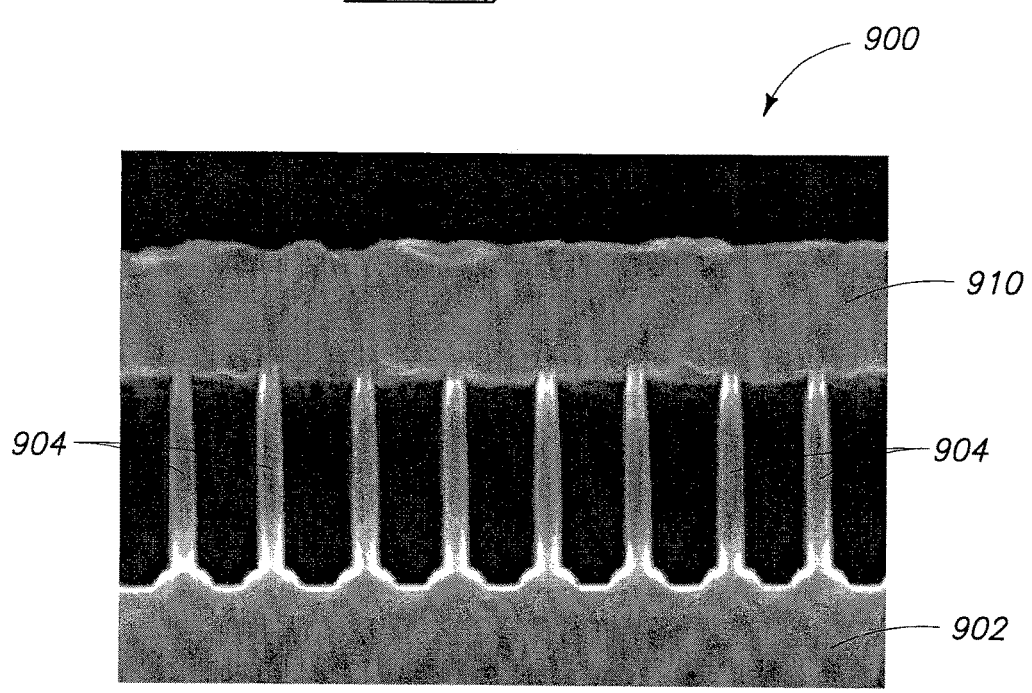
FIG. 104 is a photomicrograph of the FIG. 103 substrate at a processing step subsequent to that of FIG. 103.

In one embodiment, the elemental-form silicon is formed by depositing amorphous silicon and annealing such to be polycrystalline and from which the selectively growing of polysilicon-comprising material occurs. For example, FIG. 103 depicts a photomicrograph of a substrate 900 comprising monocrystalline silicon 902, silicon dioxide projections 904, and amorphous silicon 906. Such was formed by deposition of amorphous silicon, over silicon dioxide, over monocrystalline silicon substrate 902. The amorphous silicon and silicon dioxide were etched to form projections 904 having amorphous silicon 906 thereover, with trenches 908 being formed between the projections. Referring to FIG. 104, such was annealed at a temperature of about 625° C. which rendered the amorphous silicon polycrystalline. Polysilicon 910 was grown therefrom at a temperature of about 850° C. and a pressure of about 40 Torr using $H_2$, HCl, and $SiH_2Cl_2$ as precursors.

In one embodiment, a method of forming a covered void in a semiconductor substrate comprises forming a pair of projections projecting upwardly from a semiconductor substrate. By way of example only, any two adjacent of projections 20, 21, 22, and 23 may constitute an example pair of such projections. Elemental-form silicon is provided atop the pair of projections. For example, material/layer 16 may comprise any elemental-form silicon. At least one of elemental-form W or a silicide is selectively grown relative to at least portions of the projection sidewalls from the elemental-form silicon effective to bridge across the pair of projections to form a covered void between the pair of projections. By way of example only and with respect to the above-described embodiment, any of covered voids 28 constitute example such covered voids.

In one embodiment, a method of forming a plurality of covered voids in a semiconductor substrate includes depositing insulative material over an elemental-form silicon-containing material. For example and by way of example only, material 12 in the above-described embodiment may comprise an elemental-form silicon-containing material over which an insulative material 14 is deposited. Amorphous silicon is deposited over the insulative material. For example with respect to the above-described embodiment, material/layer 16 may comprise amorphous silicon which is deposited over an insulative material 14. An elemental-form silicon-comprising material is selectively grown relative to the insulative material from the elemental-form silicon-containing material and from the amorphous silicon effective to bridge across the plurality of openings to cover the plurality of openings. For example with respect to the above-described embodiments, material 13 constitutes an example elemental-form silicon-comprising material which has been so selectively grown.

In one embodiment, a method of forming a plurality of covered voids in a semiconductor substrate comprises depositing insulative material over a first elemental-form silicon-containing material. A second elemental-form silicon-containing material is formed over the insulative material. A plurality of openings is etched through the second elemental-form silicon-containing material and the insulative material to the first elemental-form silicon-containing material. A first elemental-form silicon-comprising material is epitaxially grown from the first elemental-form silicon-containing material. A second elemental-form silicon-comprising material is selectively grown relative to the insulative material from the second elemental-form silicon-containing material effective to bridge across the plurality of openings to cover the plurality of openings. Any other of the above and below attributes with respect to any other of the disclosed embodiments are of course contemplated.

In one embodiment, a method of forming a plurality of covered voids in a semiconductor substrate comprises depositing insulative material over a first elemental-form silicon-containing material. An amorphous elemental-form silicon-containing material is formed over the insulative material. A plurality of openings is etched through the amorphous elemental-form silicon-containing material and the insulative material to the elemental-form silicon-containing material. The amorphous elemental-form silicon-containing material is annealed effective to form a polycrystalline silicon-containing material. A first elemental-form silicon-comprising material is epitaxially grown from the elemental-form silicon-containing material while selectively growing relative to the insulative material a polysilicon-comprising material from the polycrystalline silicon-containing material effective to bridge across the plurality of openings to cover the plurality of openings. Any other of the above and below attributes with respect to any other of the disclosed embodiments are of course contemplated.

Referring to FIGS. 7 and 8, at least a majority of each covered trench 28 (not designated in FIGS. 7 and 8) has been filled with one or more conductive materials 30, whereby for example, the voids exist no more as having been completely filled with solid material. Such may be used to form elongated conductive lines therefrom. For example, individual of the elongated trenches may be provided to have at least one open end into or through which conductive material may be deposited to within the covered elongated trenches effective to form conductive lines within the trenches. For example, suitable chemical vapor deposition and/or atomic layer deposition techniques may be utilized to isotropically fill covered elongated trenches from one or more ends, or from other access location(s) thereto. Such conductive lines may be utilized as local interconnects, substantially globally running conductive lines, field effect transistor gate lines, and/or other conductive lines.

Figure 11:
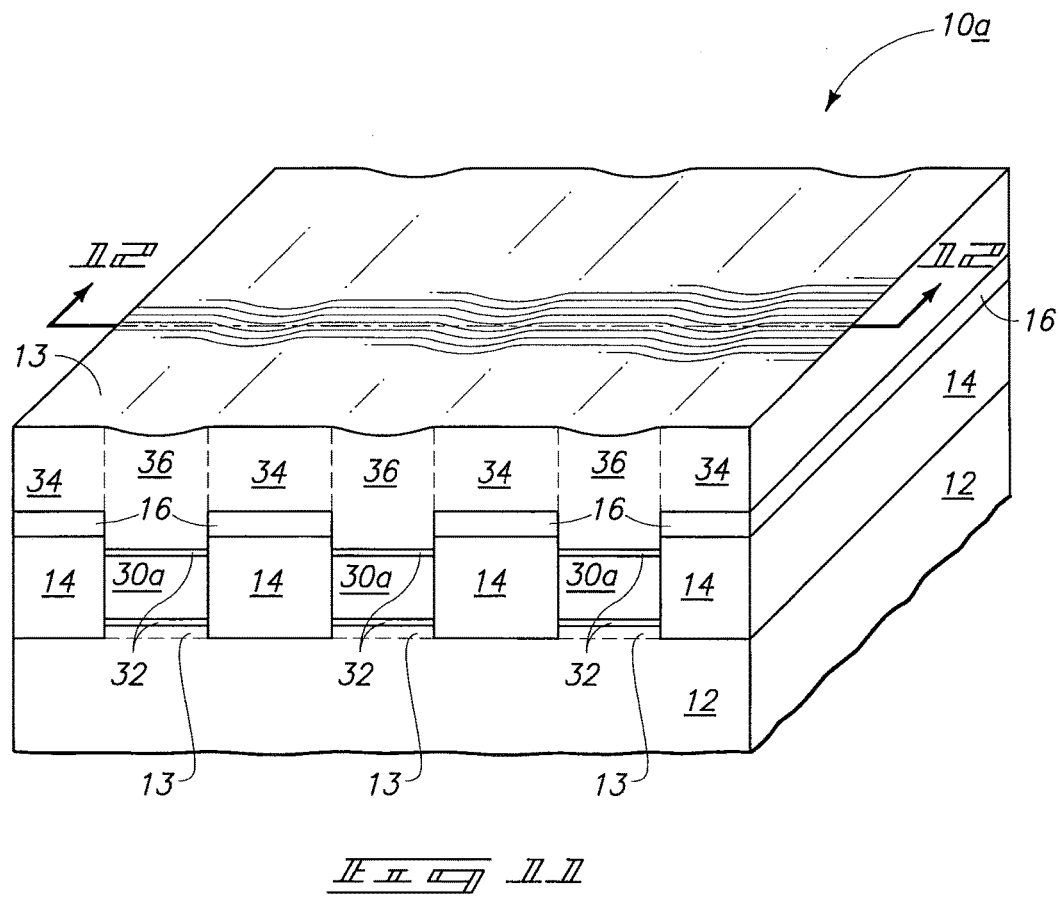
FIG. 11 is a view of the FIG. 9 substrate at a processing step subsequent to that shown by FIG. 9.
Figure 12:
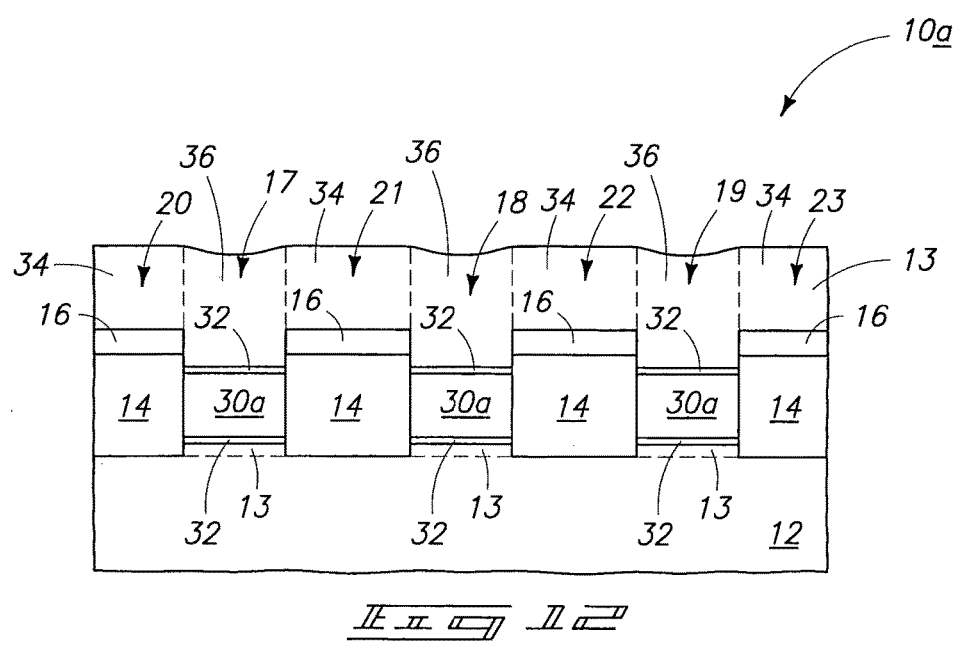
FIG. 12 is a view of the FIG. 11 substrate taken through line 12-12 in FIG. 11.
Figure 9H:
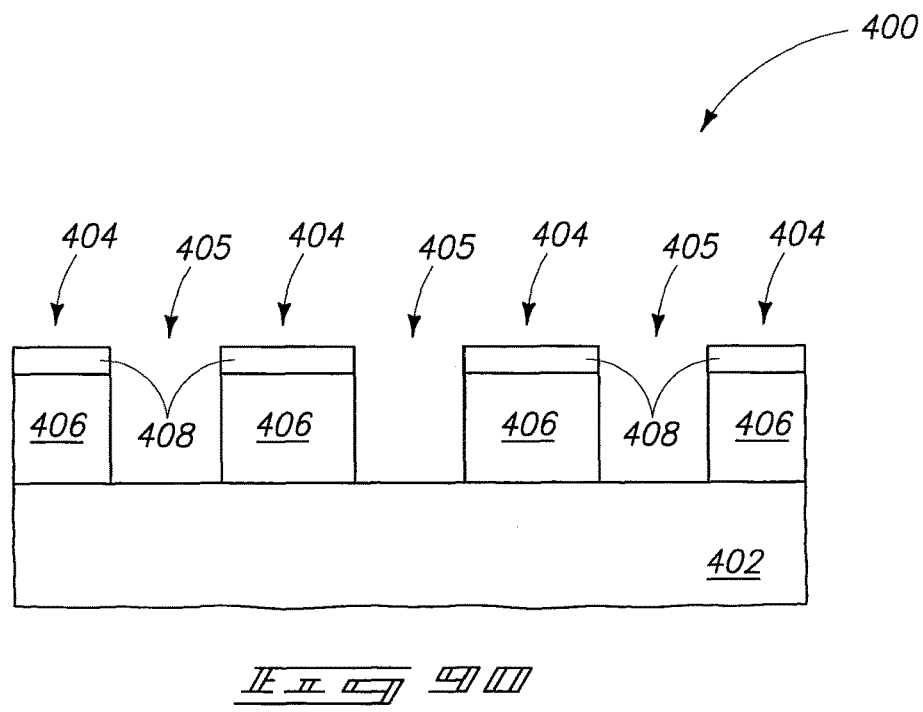
FIG. 9 is a diagrammatic perspective view of a portion of a substrate in process in accordance with an embodiment of the invention.
Figure 9I:
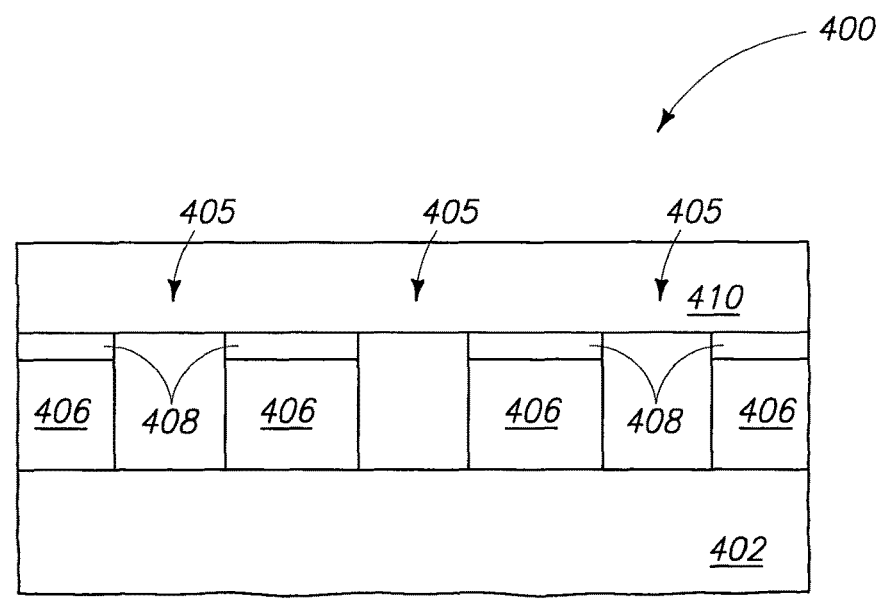
Figure 9B:
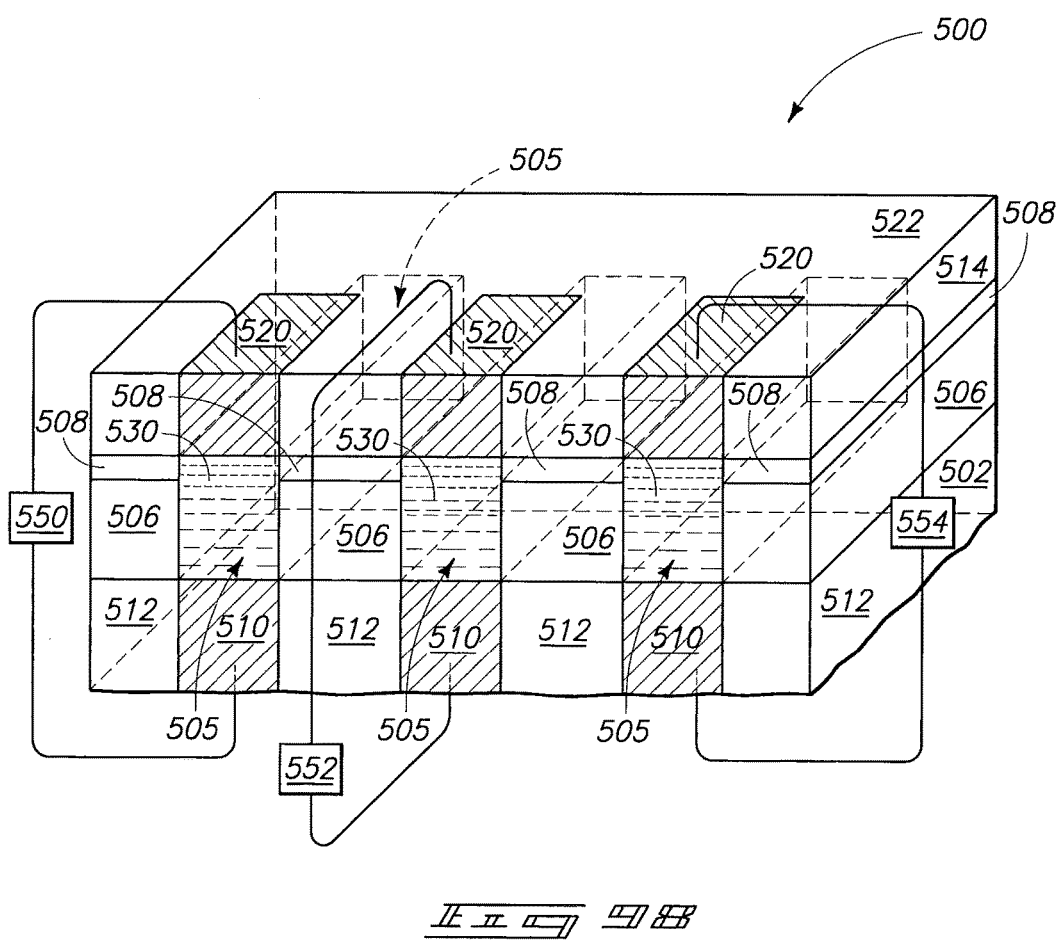

For example and by way of example only, FIGS. 9-12 depict an alternate embodiment portion of a substrate 10a. Like numerals from the FIGS. 5-8 embodiment substrate have been utilized where appropriate, with differences being indicated with the suffix "a" or with different numerals. FIGS. 9 and 10 depict the forming of a gate dielectric 32 within covered elongated trenches 28a. An example such material is silicon dioxide, which may be formed for example by a thermal oxidation of material 13 where such comprises at least some elemental-form silicon. FIGS. 11 and 12 depict conductive material 30a as having been deposited to within the covered elongated trenches over gate dielectric 32 from at least one open end effective to form conductive gate lines within the trenches. Field effect transistor source/drain regions 34 and field effect transistor channel regions 36 have been formed within example selectively grown semiconductive material 13. Such may be fabricated by suitable masked or maskless conductivity-modifying doping of material 13 which extends over projections 20, 21, 22, and 23 and bridges over former voids 28.

In one embodiment, a method of forming field effect transistors includes providing a monocrystalline silicon-containing substrate which comprises a <100> plane direction. Insulative material is deposited over the monocrystalline silicon-containing substrate. A plurality of trenches are etched through the insulative material to silicon-containing material of the substrate parallel the <100> plane direction to provide monocrystalline silicon-containing material bases of the trenches which run parallel the <100> plane direction.

An elemental-form silicon-comprising material is epitaxially grown from the monocrystalline silicon-containing material of the trench bases and over the insulative material effective to bridge across the trenches with elemental-form silicon-comprising material and form covered trench voids within the trenches. In one embodiment, the monocrystalline silicon-containing material bases may be wet etched prior to the epitaxially growing. By way of example only, an exposure to a dilute HF solution comprises an example such wet etching. Regardless and in one embodiment, an exposed epitaxial seed material different from the insulative material may be provided over the insulative material prior to the epitaxially growing and from which the elemental-form silicon-comprising material bridging across the trenches is grown during the epitaxially growing. In one embodiment, the epitaxial seed material and the monocrystalline silicon-containing material bases may be wet etched prior to the epitaxially growing, for example utilizing a dilute HF solution as described above, or using some other solution.

At least one of field effect transistor channel regions or field effect transistor source/drain regions are formed within the elemental-form silicon-comprising material which bridges across the trenches. By way of example only, FIG. 12 depicts both such field effect transistor regions and field effect transistor source/drain regions being so formed in material 13 received over material 16. Further in one example embodiment, field effect transistor gates are formed within the trench voids. In one embodiment, an underside of the elemental-form silicon-comprising material bridging across the trenches is oxidized to at least partially form a gate dielectric on such underside within the covered trench voids. After such oxidizing, conductive material is deposited within the covered trench voids to form field effect transistor gates within the covered trench voids.

Figure 13:
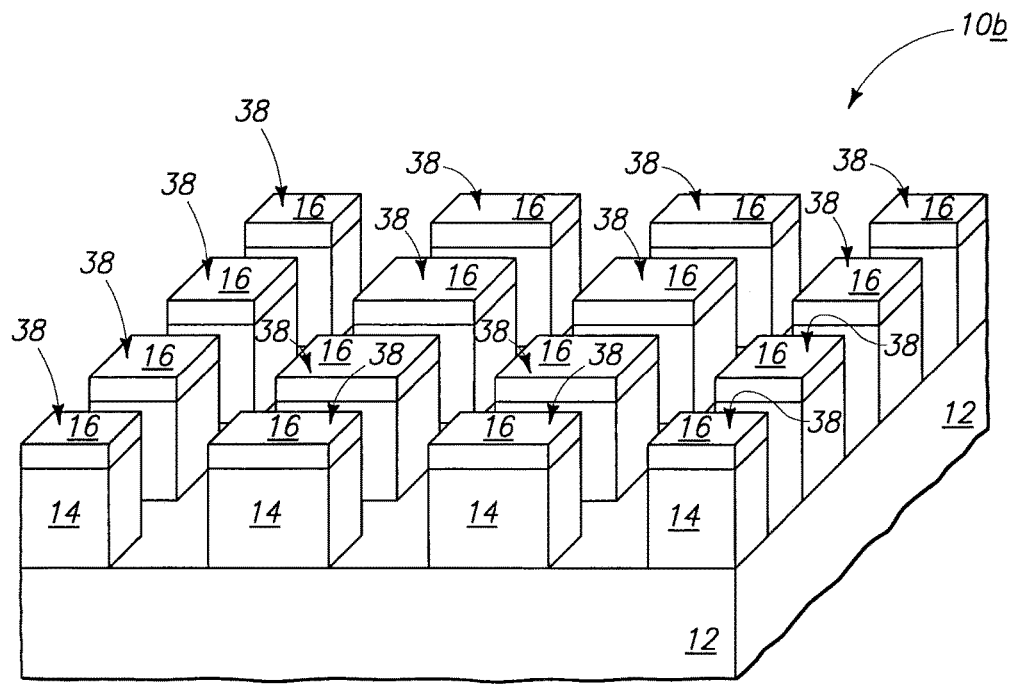
FIG. 13 is a diagrammatic perspective view of a portion of a substrate in process in accordance with an embodiment of the invention.
Figure 14:
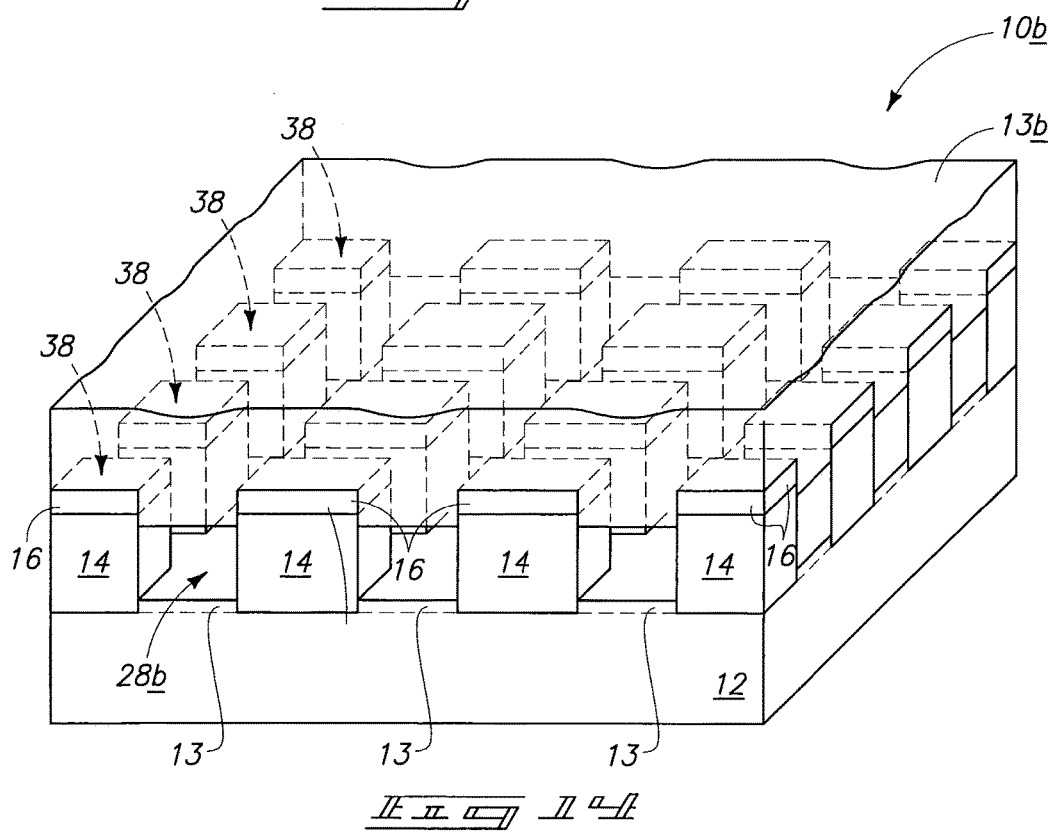
FIG. 14 is a view of the FIG. 13 substrate at a processing step subsequent to that shown by FIG. 13.

The above-described embodiments depict example second material-comprising projections which resulted in the formation of elongated trenches. Any alternative forms of projections, including combination of different shaped projections, are of course contemplated. For example, alternate example projections 38 are depicted in FIGS. 13 and 14 with respect to an alternate embodiment substrate portion 10b. Like numerals from the first-described embodiment substrate have been utilized where appropriate, with differences being indicated with the suffix "b" or with different numerals. FIGS. 13 and 14 depict projections 38 as comprising spaced free-standing pillars. FIG. 14 depicts the selectively growing to form material 13b to comprise a ceiling which covers a void 28b, with the ceiling be supported at least in part by the plurality of pillars 38 which are received within void 28b.

Figure 15:
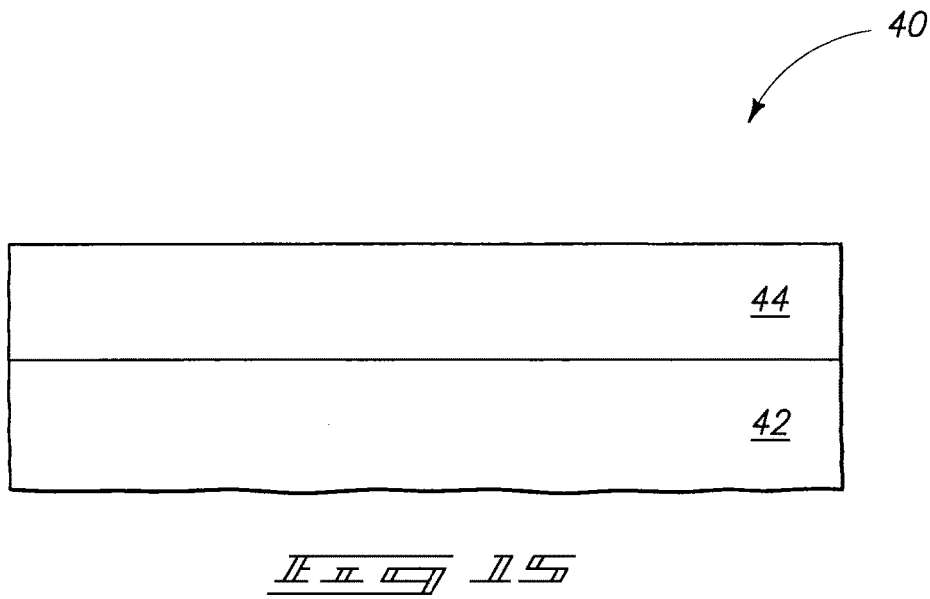
FIG. 15 is a diagrammatic sectional view of a portion of a substrate in process in accordance with an embodiment of the invention.

The above-depicted embodiments include but example methods of forming a covered void in a semiconductor substrate including the provision of exposed first, second, and third materials and projections. Alternate methods and constructions are of course contemplated independent of provision of exposed first, second, and third materials. For example and by way of example only, another embodiment substrate portion is indicated generally with reference numeral 40 in FIG. 15. Such includes an example elemental-form silicon-containing material 42 having a conductive material 44 deposited thereover. Example elemental-form silicon-containing materials include monocrystalline, polycrystalline, or amorphous silicon alone or in combination with other materials. Example conductive materials 44 include any one or combination of elemental metals, alloys of elemental metals, and/or conductive metal compounds. An example thickness range for conductive material 44 is from about 1,500 Angstroms to about 3,000 Angstroms.

Figure 16:
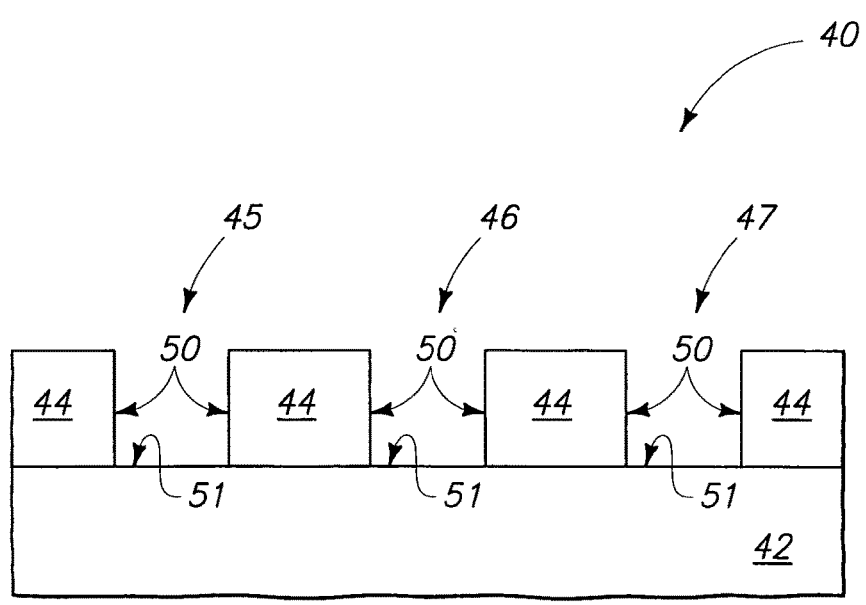
FIG. 16 is a view of the FIG. 15 substrate at a processing step subsequent to that shown by FIG. 15.

Referring to FIG. 16, a plurality of openings 45, 46, and 47 have been etched through conductive material 44 to elemental-form silicon-containing material 42. In one embodiment, openings 45, 46, and 47 comprise elongated trenches, for example which run generally parallel a mean outermost global surface of the semiconductor substrate, for example as described in some of the other embodiments. Regardless and for purposes of the continuing discussion, openings 45, 46, and 47 may be considered as comprising respective sidewalls 50 and bases 51. Of course, the etching to may also occur into material 42 (not shown) and not necessarily stop thereon.

Figure 17:
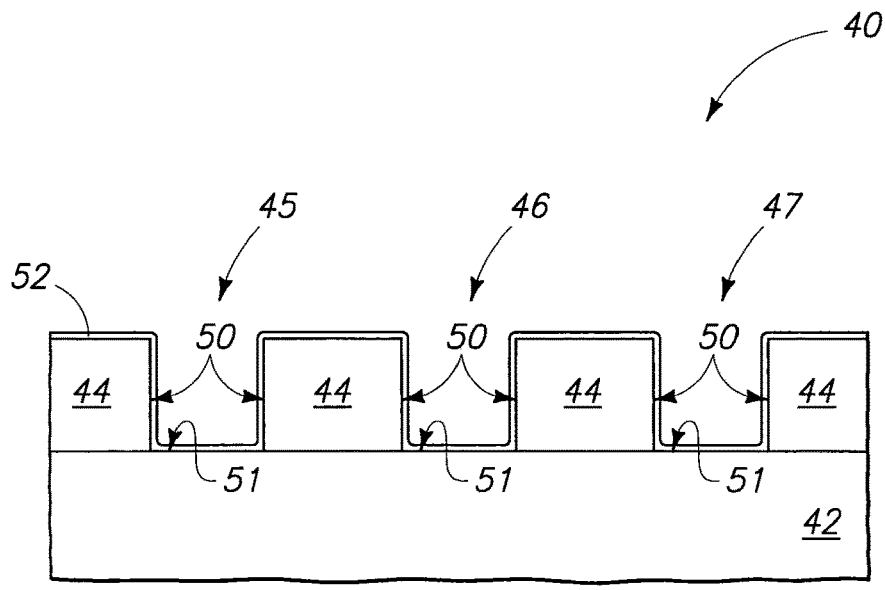
FIG. 17 is a view of the FIG. 16 substrate at a processing step subsequent to that shown by FIG. 16.

Referring to FIG. 17, at least sidewalls 50 of openings 45, 46, and 47 have been lined with an insulative material 52. By way of example only, materials include silicon dioxide and/or silicon nitride. An example thickness range for insulative material 52 is from 60 Angstroms to 300 Angstroms. In one embodiment, bases 51 are also lined with insulative material 52 while lining sidewalls 50 with insulative material 52. In one embodiment, material 52 is formed by chemical vapor deposition and/or atomic layer deposition.

Figure 18:
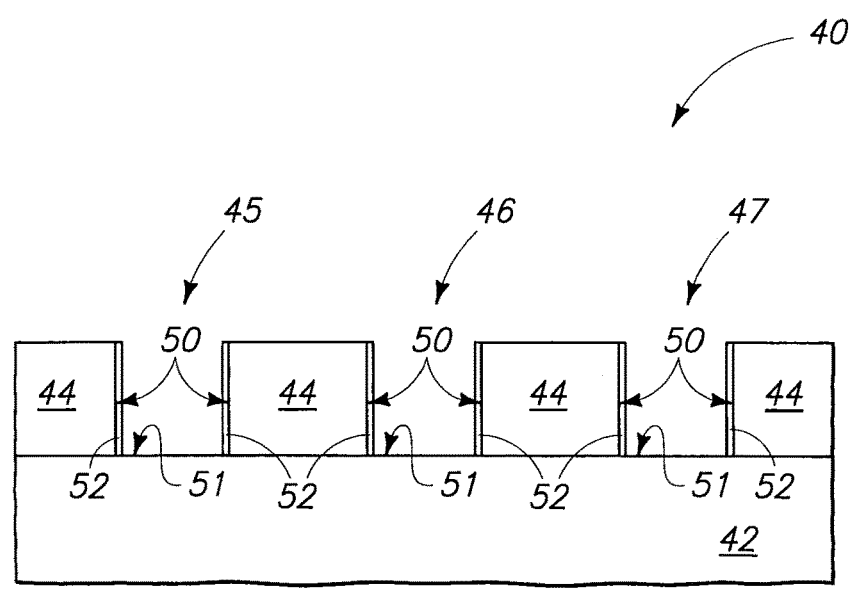
FIG. 18 is a view of the FIG. 17 substrate at a processing step subsequent to that shown by FIG. 17.

Referring to FIG. 18 and in but one embodiment, insulative material 52 has been etched from atop the elevational outermost surfaces of conductive material 44 and from bases 51 within openings 45, 46, and 47. An example technique for doing so includes utilizing a dry anisotropic fluorocarbon etching chemistry.

Figure 19:
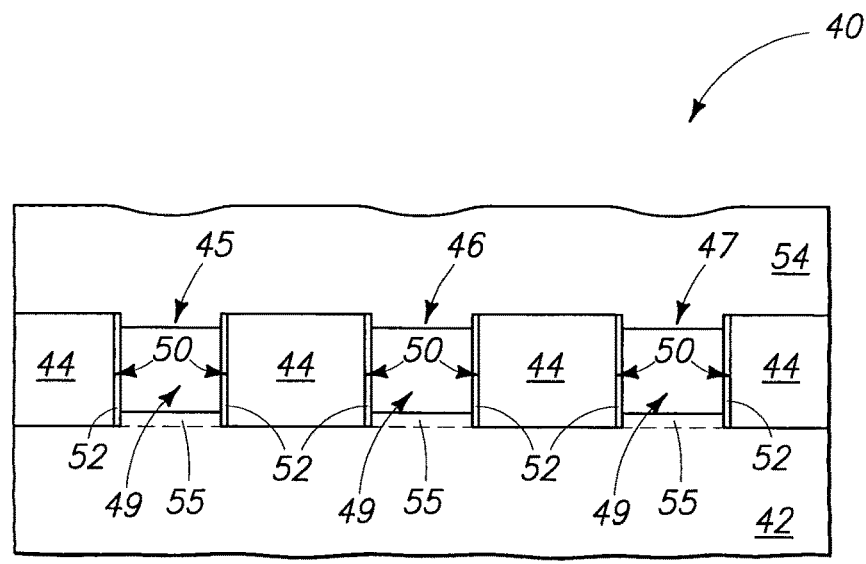
FIG. 19 is a view of the FIG. 18 substrate at a processing step subsequent to that shown by FIG. 18.

Referring to FIG. 19, an elemental-form silicon-comprising material 54 has been selectively grown relative to the insulative material over a plurality of openings 45, 46, and 47 effective to bridge across such openings to cover such openings, thereby forming covered openings or covered voids 49. In one embodiment, elemental-form silicon-comprising material 55 has also been epitaxially grown from bases 51 within openings 45, 46, and 47 while selectively growing elemental-form silicon-comprising material 54. By way of examples only, materials 54 and 55 may comprise the same or different compositions, and an elemental-form silicon-containing material may be so selectively grown to bridge across the plurality of openings for example as described above where conductive material 44 comprises any one or combination of elemental-form W or a silicide.

Figure 20:
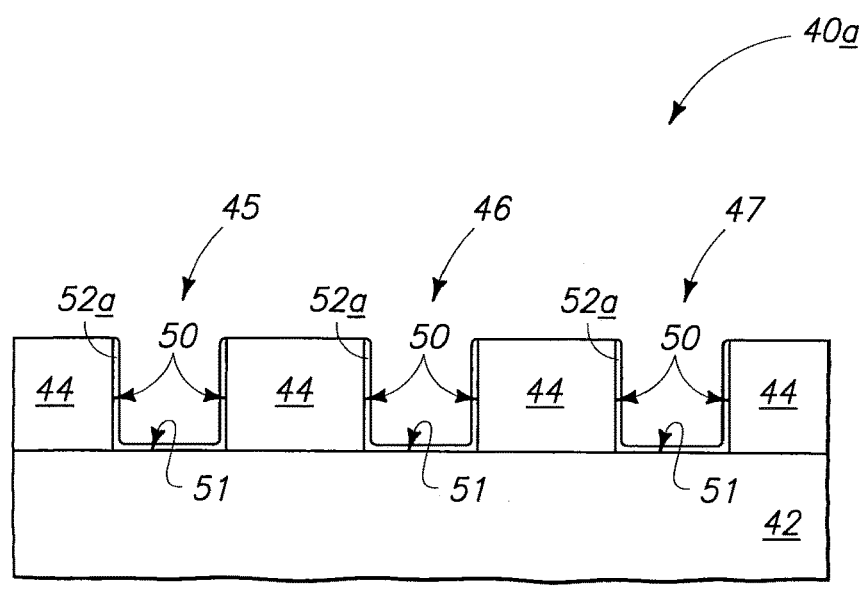
FIG. 20 is a diagrammatic sectional view of a portion of a substrate in process in accordance with an embodiment of the invention.

In one embodiment, the selectively growing of an elemental-form silicon-comprising material effective to bridge across the plurality of openings may be devoid of epitaxially growing elemental-form silicon-comprising material from bases of the plurality of openings. FIG. 20 depicts an example alternate embodiment substrate portion 40a compared to that of FIG. 18. Like numerals from the FIGS. 15-19 embodiment have been utilized where appropriate, with differences being indicated with the suffix "a" or with different numerals. FIG. 20 depicts alternate processing of a substrate portion 40a prior or subsequent to that of FIG. 17. In FIG. 20, the insulative material 52 of FIG. 17 has been removed from atop conductive material 44 or never provided thereover, but remains as an insulative material lining 52a within openings 45, 46, and 47 over bases 51. Such may be accomplished by any suitable etch or mechanical and/or chemical mechanical polishing process of material 52 of FIG. 17 at least to conductive material 44. Alternately by way of example only, some form of selective growth of material 52a may be conducted over sidewalls 50 and 51 but not over the tops of material 44. For example and by way of example only, tops of material 54 may be masked with a suitable layer of material, while sidewalls 50 and bases 51 are left unmasked during a selective growth of material 52a.

Figure 21:
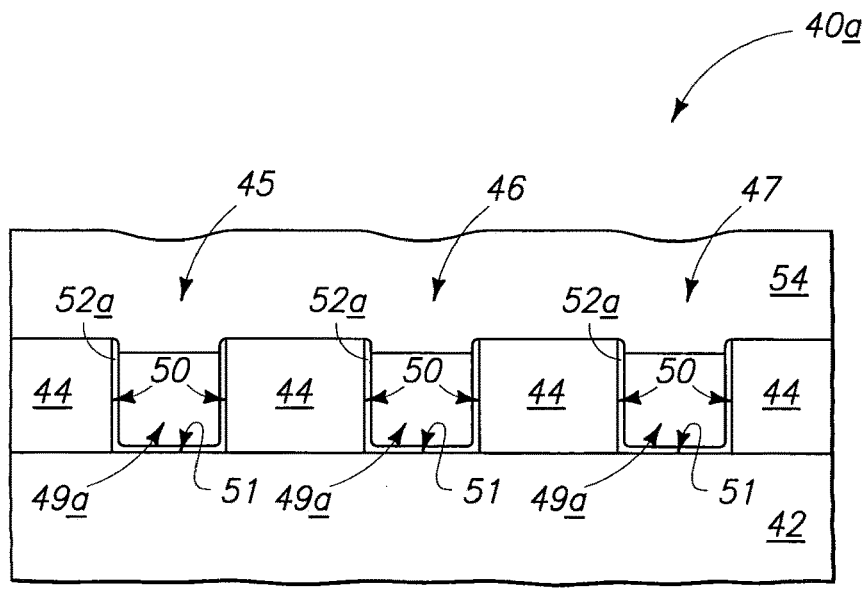
FIG. 21 is a view of the FIG. 20 substrate at a processing step subsequent to that shown by FIG. 20.

Referring to FIG. 21, elemental-form silicon-comprising material 54 has been selectively grown over the plurality of openings 45, 46, and 47 to bridge across and cover such openings, forming covered openings or covered voids 49a.

Figure 22:
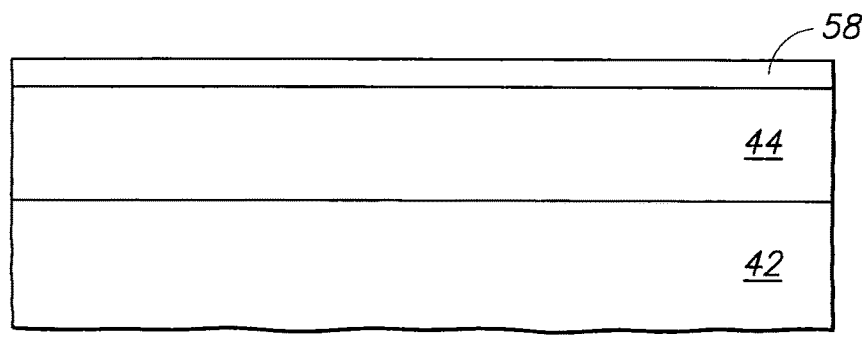
FIG. 22 is a diagrammatic sectional view of a portion of a substrate in process in accordance with an embodiment of the invention.

In one embodiment, an exposed seed material or an exposed epitaxial seed material may be provided proximate the tops of the plurality of openings over the conductive material prior to the selective growth, with such selective growth being an epitaxial growth from the exposed epitaxial seed material. One alternate example such embodiment is initially described in connection with a substrate portion 40b in FIGS. 22-26. Like numerals from the FIGS. 15-19 embodiment have been utilized where appropriate, with differences being indicated with the suffix "b" or with different numerals. Referring to FIG. 22, an exposed seed material 58 or an exposed epitaxial seed material 58 has been provided over conductive material 44. Example materials include amorphous silicon, monocrystalline silicon, elemental-form W, elemental-form Ti, a silicide, and combinations thereof. An example thickness range for material 58 is from about 200 Angstroms to about 800 Angstroms.

Figure 23:
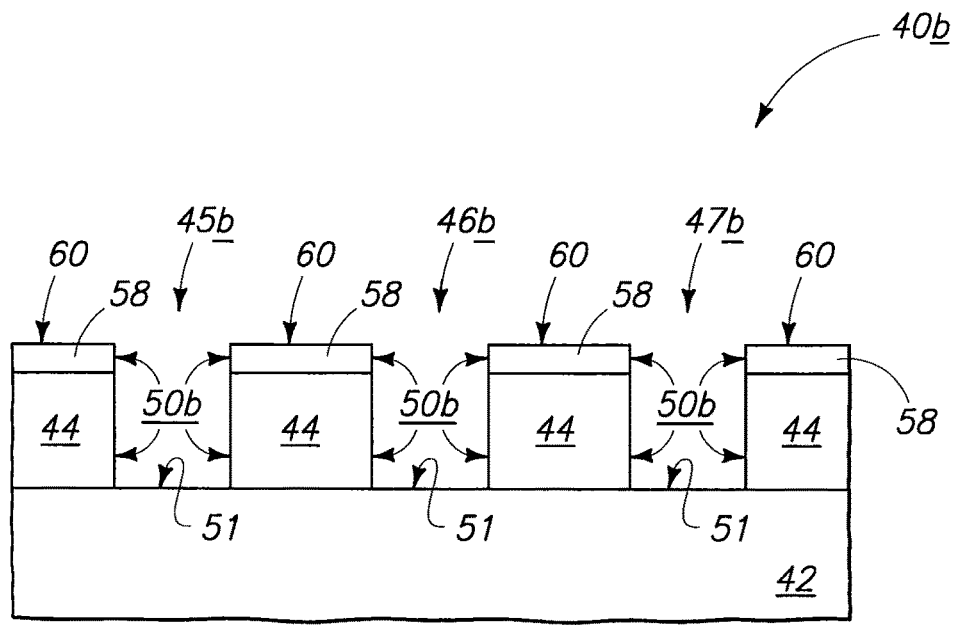
FIG. 23 is a view of the FIG. 22 substrate at a processing step subsequent to that shown by FIG. 22.

Referring to FIG. 23, openings 45b, 46b, and 47b have been etched through material 58 and conductive material 44 to elemental-form silicon-containing material 42. Accordingly in the depicted embodiment, opening sidewalls 50b encompass materials 44 and 58. Also for purposes of the continuing discussion, epitaxial seed material as received proximate the tops of plurality of openings 45b, 46b, and 47b may be considered as comprising elevationally outermost surfaces 60.

Figure 24:
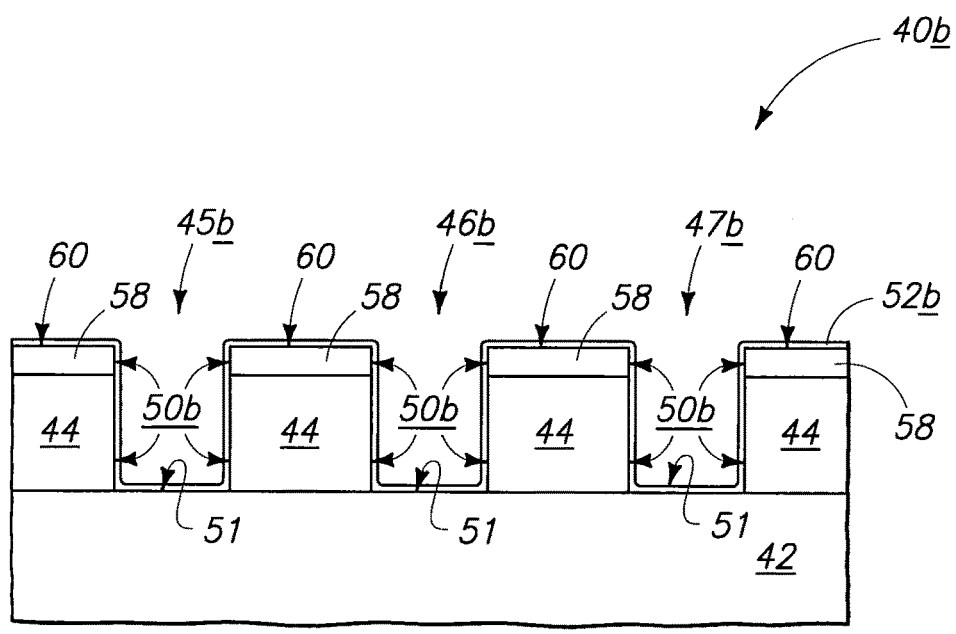
FIG. 24 is a view of the FIG. 23 substrate at a processing step subsequent to that shown by FIG. 23.

Referring to FIG. 24, an insulative material 52b has been formed to line openings 45b, 46b, and 47b. Referring to FIG. 25, insulative material 52b has been etched effective to remain lining at least sidewalls 50b of openings 45b, 46b, and 47b. Referring to FIG. 26, elemental-form silicon-comprising material 54b has been epitaxially grown over the plurality of openings 45b, 46b, and 47b effective to bridge across such openings to cover such openings, thereby forming covered openings or covered voids 49b. Elemental-form silicon-comprising material 55 has also been epitaxially grown from bases 51 of such openings in the depicted embodiment. Further, by way of example only in such embodiment, elevationally outermost surfaces 60 of material 58 were exposed during the selective growth and from which elemental-form silicon-comprising material 54 was grown during such epitaxial growth.

An alternate embodiment substrate 40c is depicted in FIGS. 27 and 28. Like numerals with respect to the 40/40a/40b embodiments are utilized where appropriate, with differences being indicated with the suffix "c" or with different numerals. Referring to FIG. 27, insulative material 52c has been formed over sidewalls of material 44 within openings 45c, 46c, and 47c as well as over bases 51, but not over the sidewalls of material 58. For example, material 52c may be formed utilizing a selective thermal oxidation process whereby a conductive material 44 and elemental-form silicon-containing material 42 are selectively oxidized relative to material 58. Such a selective oxidation may be sufficiently high or essentially infinite for the thickness growth of material 52c such that none forms on material 58. Alternately, some insulative material 52c may so form. In such instance, a timed etch of material 52c may be conducted to clear oxide from material 58 but not from conductive material 44 or elemental-form silicon-containing material 42. For example, many silicides (e.g., tungsten silicide, platinum silicide, and cobalt silicide) will oxidize at a considerably slower rate than either of elemental-form silicon-containing material 42 or an example conductive material 44 of TiN, Ru, or Pt, and a short dilute HF wet etch may be used to clear any resulting oxide from material 58.

Referring to FIG. 28, elemental-form silicon-comprising material 54c has been selectively and/or epitaxially grown over the plurality of openings 45c, 46c, and 47c effective to bridge across and cover such openings, thereby forming covered openings or covered voids 49c.

FIGS. 29 and 30 depict an alternate embodiment substrate 40d. Like numerals have been utilized where appropriate with respect to the 40/40a/40b/40c embodiments, with differences being depicted with the suffix "d" or with different numerals. Referring to FIG. 29, insulative material 52d has been formed over the sidewalls of conductive material 44 within openings 45d, 46d, and 47d selectively relative to materials 58 and 42. Referring to FIG. 30, elemental-form silicon-comprising material 54c has been selectively grown over the plurality of openings 45d, 46d, and 47d effective to bridge across such openings and cover such openings. Epitaxially grown elemental-form silicon-comprising material 55 has also been grown from opening bases 51.

The above-described 40/40a/40b/40c/40d embodiments provide elevationally outermost surfaces 60 of material 58 to be outwardly exposed and from which the elemental-form silicon-comprising material 54 was grown. An alternate example embodiment substrate 40e is initially described with reference to FIGS. 31-35. Like numerals from the above 40/40a/40b/40c/40d embodiments are utilized where appropriate, with differences being indicated with the suffix "e" or with different numerals. Referring to FIG. 31, and desirably prior to the formation openings 45e, 46e, and 47e, a masking or covering layer 64 has been formed over material 58. Some, none or all of such material may remain in the finished construction, and regardless some material composition other than the composition of material 58 is what is principally contemplated for material 64 in this particular embodiment. Such material may be insulative, conductive, and/or semiconductive. By way of example only, where material 42 comprises silicon, material 44 comprises amorphous silicon, and material 58 comprises tungsten silicide, an example material 64 comprises silicon nitride.

Referring to FIG. 32, at least the sidewalls of the plurality of openings 45e, 46e, and 47e through conductive material 44 are lined with an insulative material 52e, for example and by way of example only analogous to that depicted and described with respect to insulative material 52c in FIG. 27.

Figure 33:
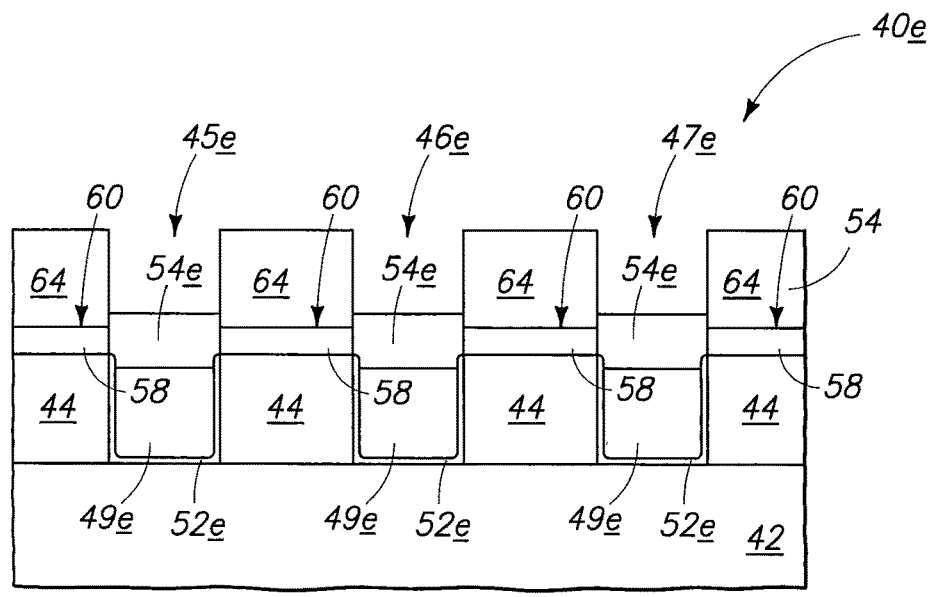
FIG. 33 is a view of the FIG. 32 substrate at a processing step subsequent to that shown by FIG. 32.

Referring to FIG. 33, elemental-form silicon-comprising material 54e has been selectively and/or epitaxially grown over the plurality of openings 45e, 46e, and 47e effective to bridge across and cover such openings, forming covered openings or covered voids 49e. Accordingly in the example FIG. 33 embodiment, elevationally outermost surfaces 60 of material 58 are covered during such epitaxial growth.

Figure 34:
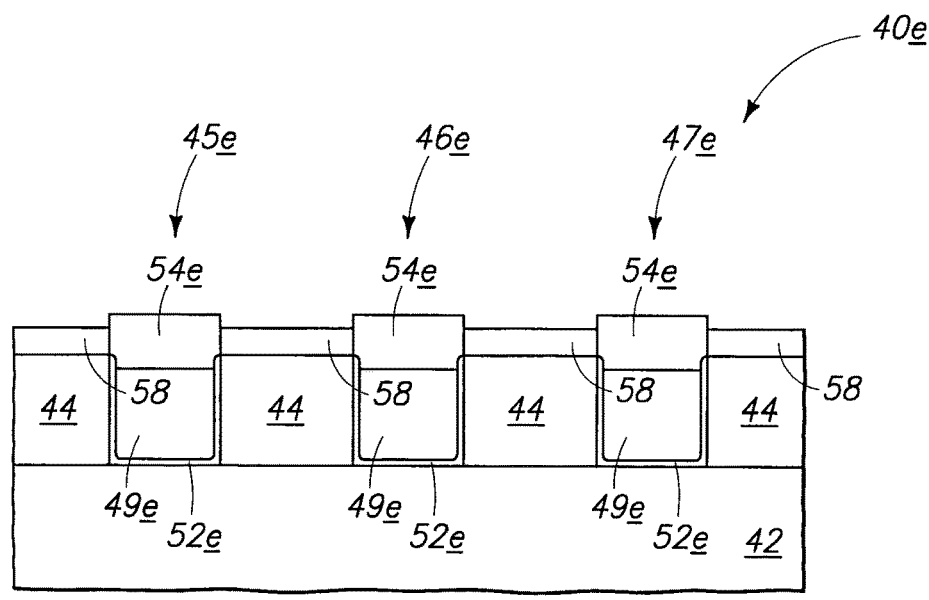
FIG. 34 is a view of the FIG. 33 substrate at a processing step subsequent to that shown by FIG. 33.
Figure 35:
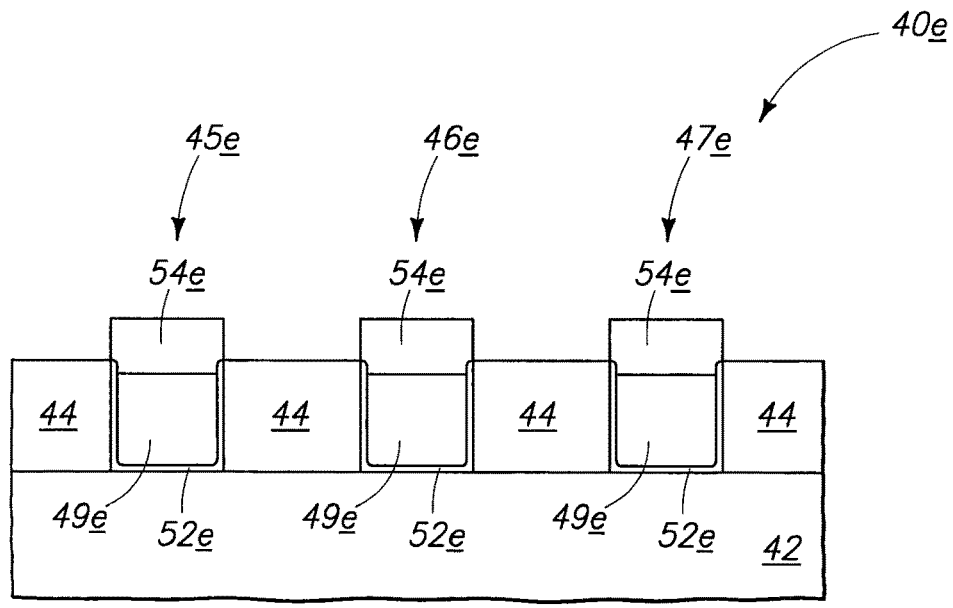
FIG. 35 is a view of the FIG. 34 substrate at a processing step subsequent to that shown by FIG. 34.

Referring to FIG. 34 and by way of example only, some subsequent processing of substrate 40e has been depicted. Specifically, masking material 64 is shown as having been removed substantially selectively relative to elemental-form silicon-comprising material 54e and material 58. Further possible subsequent processing is depicted in FIG. 35, whereby material 58 has been selectively removed relative to elemental-form silicon-comprising material 54e and conductive material 44.

Figure 36:
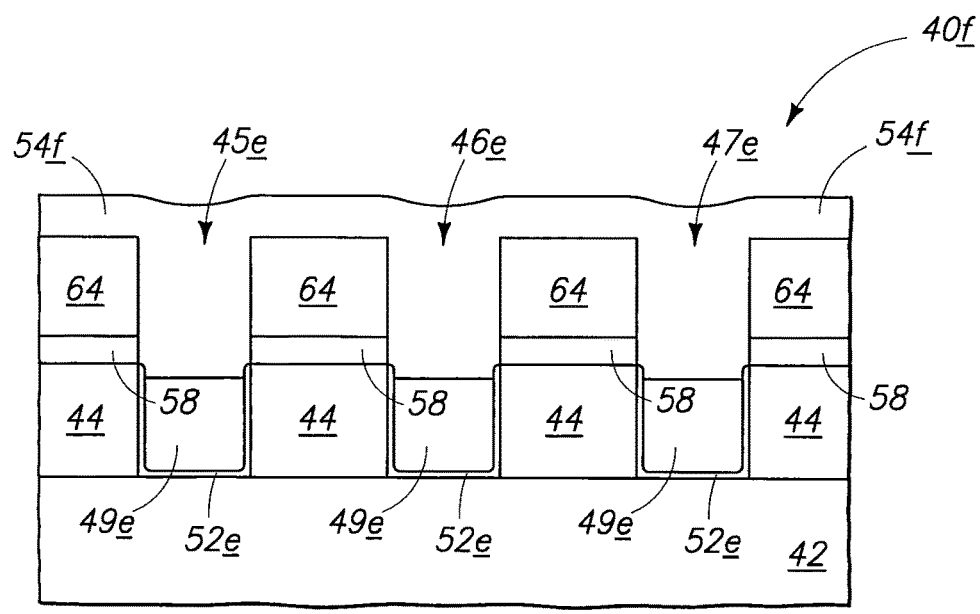
FIG. 36 is a diagrammatic sectional view of a portion of a substrate in process in accordance with an embodiment of the invention.

FIG. 36 illustrates alternate example subsequent processing with respect to the processing depicted by FIG. 33. Like numerals from the 40e embodiment have been utilized where appropriate, with differences being indicated with the suffix "f" or with different numerals. In FIG. 33, elemental-form silicon-comprising material 54e was not grown to the point of bridging over masking material 64. FIG. 36 depicts wafer portion 40f having been processed to grow elemental-form silicon-comprising material 54f to bridge over masking material 64.

By way of example only, FIGS. 37 and 38 depict an alternate embodiment substrate portion 40g analogous to that of FIG. 32, but wherein insulative material 52g is not formed, or has been removed from, over bases 51. Like numerals from the embodiment of FIGS. 32 and 33 have been utilized where appropriate, with differences being indicated with the suffix "g".

Figure 39:
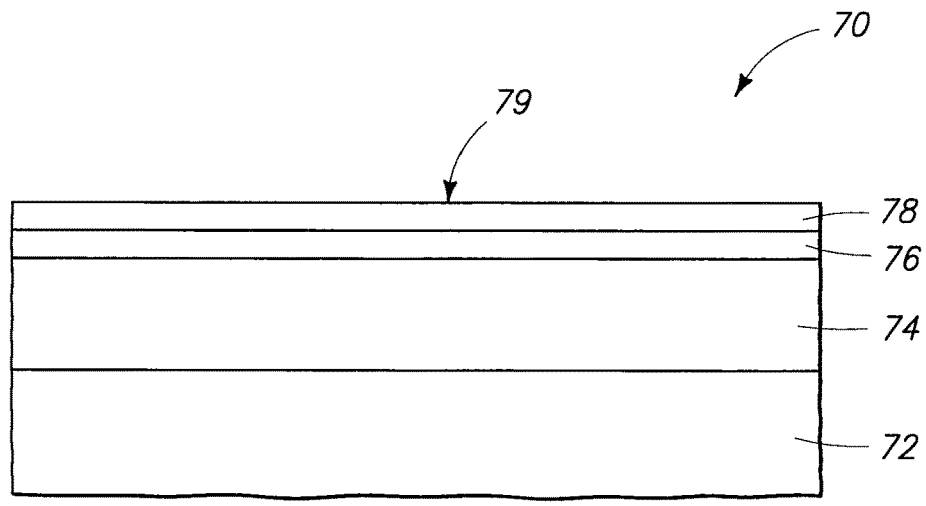
FIG. 39 is a diagrammatic sectional view of a portion of a substrate in process in accordance with an embodiment of the invention.

Embodiments of methods of forming one or more covered voids in a semiconductor substrate are now additionally described in connections with FIGS. 39-45. Referring to FIG. 39, a semiconductor substrate portion is indicated generally with reference numeral 70. Such comprises some base substrate 72, for example and by way of example only, bulk monocrystalline silicon. A first material 74 is deposited over substrate 72. A second material 76 is deposited over first material 74. A third material 78 is deposited over second material 76. Second material 76 is thereby received intermediate first material 74 and third material 78, and second material 76 is compositionally different from first material 74 and from third material 78. The first and third materials may be compositionally the same or different. The first and third materials may be insulative, conductive, and/or semiconductive, with insulative being preferred. Example materials include one or a combination of silicon dioxide or silicon nitride. By way of example only, example second materials include elemental-form silicon (including amorphous and/or crystalline forms of elemental-form silicon), elemental-form W, elemental-form Ti, and a silicide, including mixtures/combinations thereof. For purposes of the continuing discussion, third material 78 may be considered as having an elevationally outermost surface 79, and which may or may not be planar.

An example thickness range for each of layers 74, 76, and 78 is from 200 Angstroms to 3,000 Angstroms. Further by way of example only, first material 74 may be thicker or thinner than third material 78. Further, third material 78 may be thicker or thinner than second material 76. Further, any two or all three of materials 74, 76, and 78 may be of about the same thickness.

Figure 40:
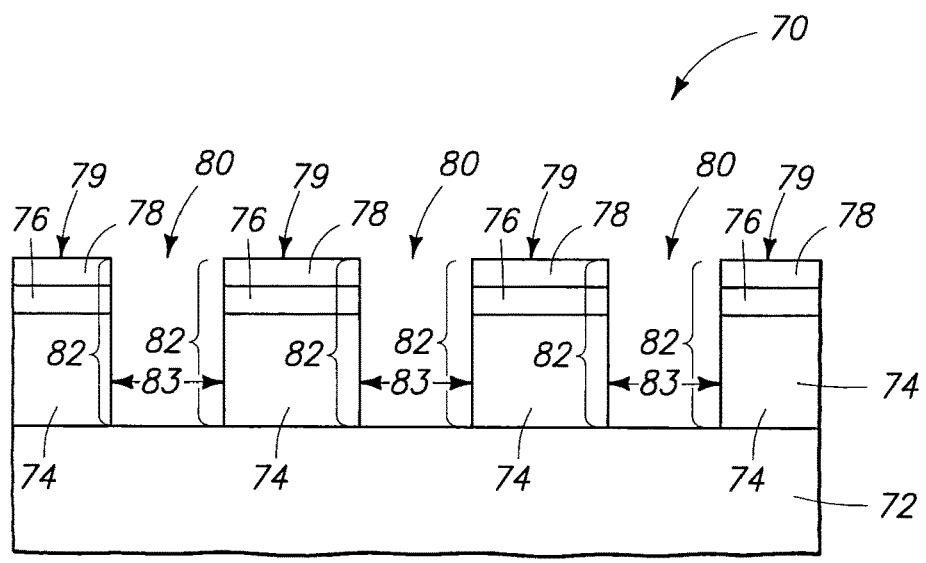
FIG. 40 is a view of the FIG. 39 substrate at a processing step subsequent to that shown by FIG. 39.

Referring to FIG. 40, openings 80 have been formed through third material 78, second material 76, and first material 74 to substrate material 72. Such openings may also, of course, extend into material 72. In one embodiment, openings 80 may be formed by etching, and in one embodiment comprise a plurality of elongated trenches.

In one embodiment, openings 80 may be considered as providing or defining respective pairs of upwardly-projecting sidewalls 82 relative to a semiconductor substrate 70. Sidewalls 82 have a space 83 therebetween which comprises opposing first, second, and third materials 74, 76, and 78, respectively.

Referring to FIG. 41, a fourth material 86 has been grown from opposing second material 76 of sidewalls 82 selectively relative at least to first material 74 and third material 78 effective to form a bridge of fourth material 86 across space 83 to form respective covered voids 87 between sidewalls 82. In one embodiment, essentially no fourth material 86 grows from sidewalls of first material 74 and third material 78, with the depicted covering of portions of sidewalls of materials 74 and 78 within openings 80 by material 86 only occurring as the result of upward and downward growth of material 86 from itself within openings 80. The second and fourth materials may be compositionally the same or different. In one embodiment, such selectively growing forms the fourth material to comprise elemental-form silicon. In one embodiment, the fourth material is formed to comprise any one or more of elemental-form W or a silicide. Example processing and materials may be as described in any of the above-described embodiments. FIG. 41 depicts an embodiment whereby a material 88 deposits atop and/or also selectively from substrate material 72 during the growth of material 86 from second material 76. In such event, material 88 may be compositionally the same as or different from material 86.

FIG. 41 also depicts an embodiment wherein the selectively growing does not grow fourth material 86 to extend over an elevationally outermost surface 79 of third material 78. FIG. 42 depicts continued processing and/or an alternate embodiment whereby the selectively growing of material 86 is continued sufficiently to grow fourth material 86 to extend over elevationally outermost surfaces 79 of third material 78.

Figure 45:
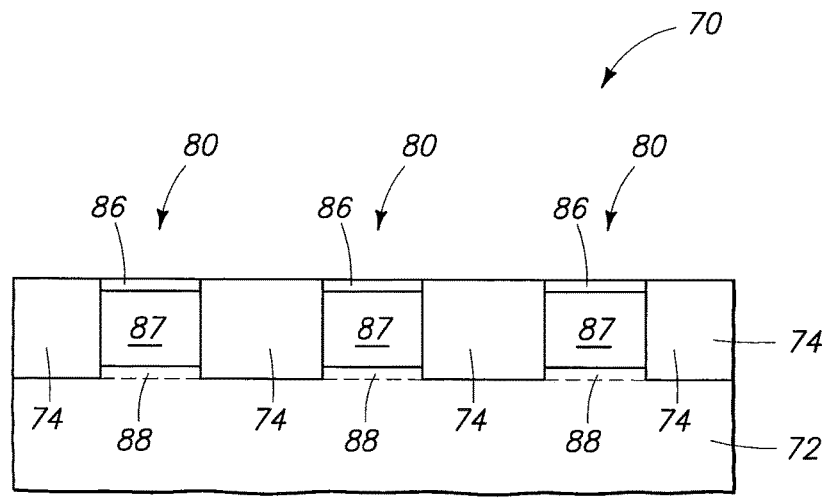
FIG. 45 is a view of the FIG. 44 substrate at a processing step subsequent to that shown by FIG. 44.

Referring to FIG. 43, substrate 70 has been polished inwardly to at least third material 78 to leave fourth material 86 bridging over covered voids 87. FIG. 44 illustrates example subsequent or continued processing whereby polishing of substrate 70 has been conducted inwardly to at least second material 76 to leave fourth material 86 bridging over covered voids 87. FIG. 45 illustrates still subsequent or continued processing whereby substrate 70 has been polished inwardly to first material 74 to still leave some fourth material 86 bridging over covered voids 87.

In one embodiment, a method of forming a covered void within a semiconductor substrate includes providing a bulk monocrystalline silicon-containing substrate. By way of example only with respect to FIG. 39, material 72 may constitute a bulk monocrystalline silicon-containing substrate. A first insulative material is deposited over the bulk monocrystalline silicon-containing substrate. With respect to the FIG. 39 embodiment, material 74 may comprise an example such first insulative material. An elemental-form silicon-containing material is deposited over the first insulative material. In the context of the FIG. 39 embodiment, material 76 may comprise an example such elemental-form silicon-containing material. A second insulative material is deposited over the elemental-form silicon-containing material. In the context of the FIG. 39 embodiment, material 78 may comprise such a second insulative material. The first insulative material may be compositionally be the same as or different from the second insulative material. In one embodiment, the first insulative material comprises silicon dioxide and the second insulative material comprises silicon nitride. In one embodiment, the elemental-form silicon-containing material deposited over the first insulative material comprises amorphous silicon and/or monocrystalline silicon.

A plurality of trenches is etched through the second insulative material, the elemental-form silicon-containing material, and the first insulative material to the bulk silicon-containing material of the substrate. By way of example only, FIG. 40 depicts such example processing. Again of course, etching may occur into material 72.

A silicon-comprising material is selectively grown from the elemental-form silicon-containing material and from the bulk silicon-containing material of the substrate within the trenches effective to bridge across the trenches with elemental-form silicon-comprising material to form covered trench voids within the trenches. By way of example only, FIGS. 41 and 42 depict examples of such processing. In one embodiment, at least one of field effect transistor channel regions or field effect transistor source/drain regions are formed within the elemental-form silicon-comprising material bridging across the trenches.

Also of course with respect to any of the above described embodiments, the covered openings/voids which are formed may subsequently be wholly or partially filled with any one or combinations of insulative, conductive, or semiconductive materials. Also and regardless, any of the above embodiments may not form trenches and/or provide other configuration projections forming one or more covered openings/voids. For example and by way of example only, the embodiment of FIGS. 13 and 14 may be utilized in the context of free-standing pillar formation. Regardless, any other of the above and below attributes with respect to any other of the disclosed embodiments are of course contemplated.

Embodiments herein encompass methods of forming a span comprising silicon dioxide. For example, an opening comprising sidewalls is formed within a semiconductor substrate. Further, the opening may be wholly or partially formed within semiconductive material of the semiconductor substrate or be received entirely outside of any semiconductor material of the semiconductor substrate. An elemental-form silicon-containing material is selectively grown relative to at least some portion of the sidewalls to bridge across the opening to form a covered cavity within the opening. By way of examples only, any of the above-depicted and described embodiments of selectively growing an elemental-form silicon-containing material to bridge across an opening to form a covered cavity or void within the opening are of course contemplated.

Figure 46:
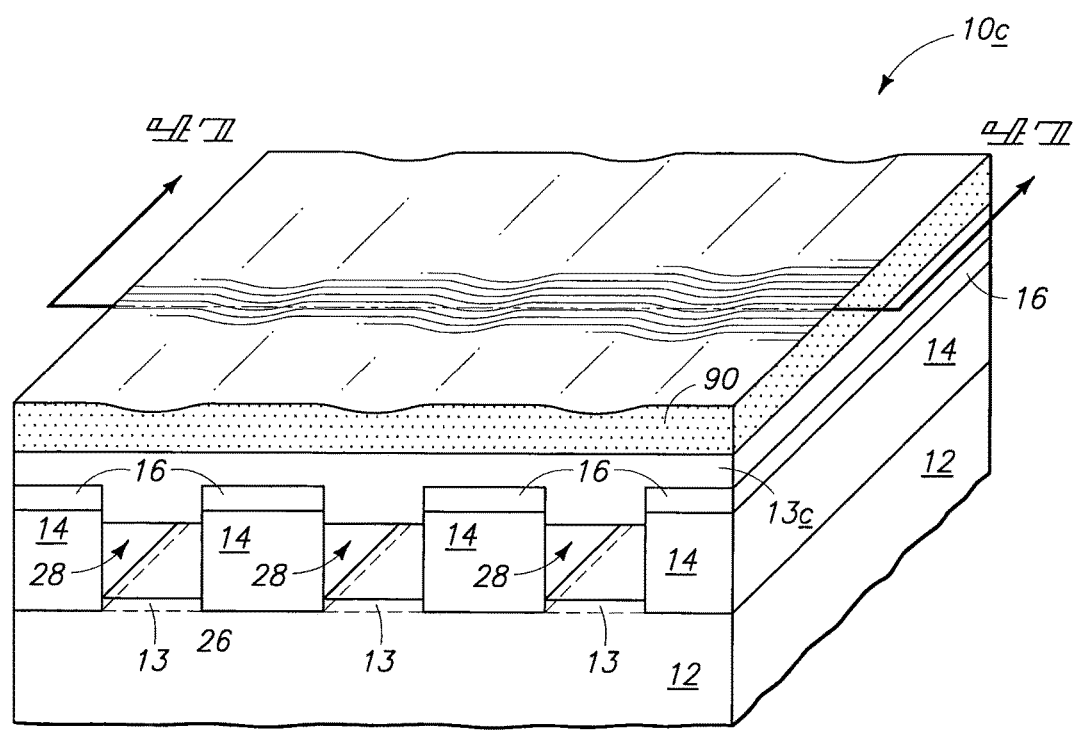
FIG. 46 is a diagrammatic perspective view of a portion of a substrate in process in accordance with an embodiment of the invention.
Figure 47:
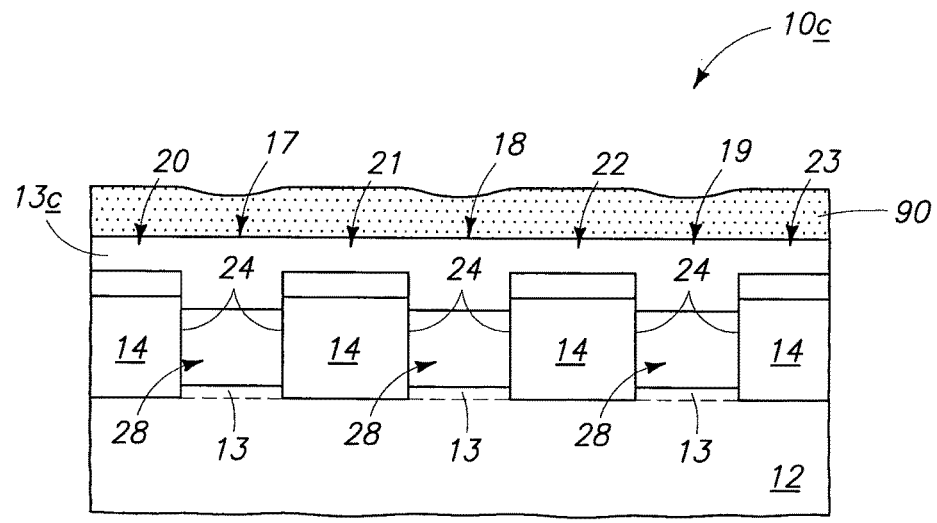
FIG. 47 is a view of the FIG. 46 substrate taken through line 47-47 in FIG. 46.

In one embodiment, at least an outermost upper half of the selectively grown elemental-form silicon-containing material is oxidized across the opening to form a silicon dioxide-comprising bridge across the opening over the cavity. By way of example only, FIGS. 46 and 47 depict a wafer portion 10c processed in accordance with an example of the just-described embodiment. FIGS. 46 and 47 depict substrate portion 10 of FIGS. 5 and 6 at a processing step alternate to that depicted by FIGS. 7 and 8, and is accordingly designated 10c. Like numerals from the first-described embodiment are utilized where appropriate, with differences being indicated with the suffix "c" or with different numerals. FIGS. 46 and 47 depict an outermost upper half of selectively grown elemental-form silicon-containing material 13 which bridges across the depicted openings as having been oxidized, thereby forming a silicon dioxide-comprising bridge 90 across the openings over the cavities and leaving bridging silicon-containing material 13c. FIGS. 46 and 47 depict the oxidizing as being of less than all of the epitaxially grown elemental-form silicon-containing material, with only about half of such material being oxidized to form the silicon dioxide-comprising bridge 90. Regardless and in one embodiment, elemental-form silicon-comprising material may be epitaxially grown from a base of the opening or openings while selectively growing the elemental-form silicon-containing material which bridges across the opening, for example as depicted in FIGS. 46 and 47. Elemental-form silicon-containing material 13 may be selectively grown from elemental-form silicon-containing material and/or from at least one of elemental-form W, elemental-form Ti, or a silicide. Processing may otherwise be conducted, by way of example only, as described above in connection with the substrate 10/10a/10b and other embodiments.

Figure 48:
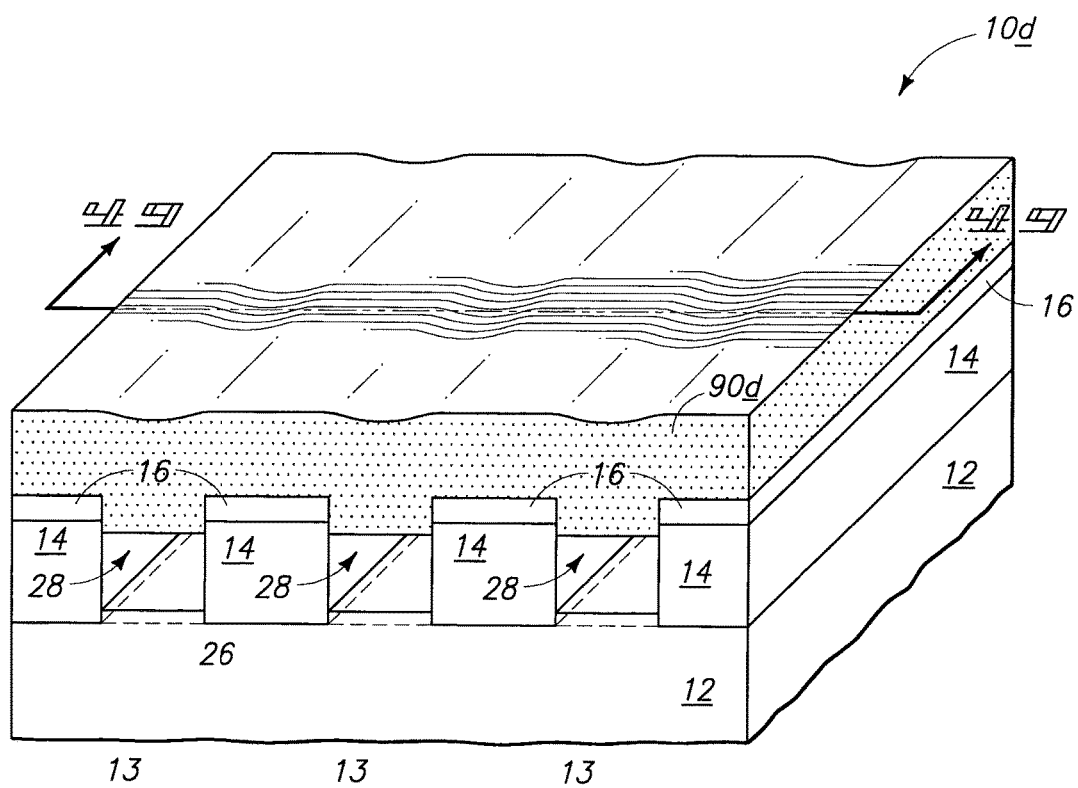
FIG. 48 is a diagrammatic perspective view of a portion of a substrate in process in accordance with an embodiment of the invention.
Figure 49:
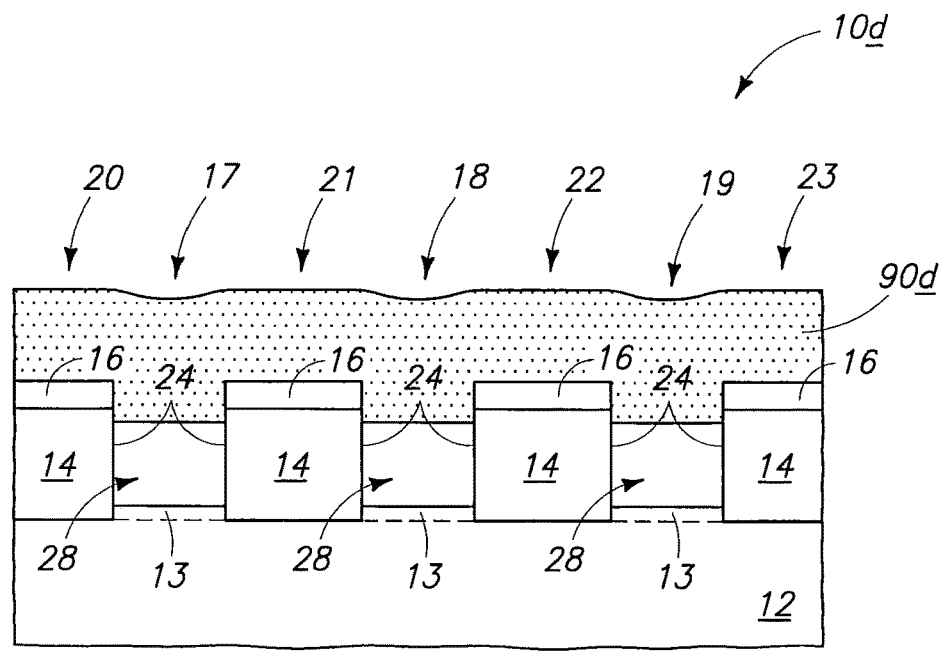
FIG. 49 is a view of the FIG. 48 substrate taken through line 49-49 in FIG. 48.

FIGS. 48 and 49 illustrate an alternate embodiment substrate portion 10d. Like numerals from the first-described substrate 10/10c embodiments have been utilized where appropriate, with differences being indicated with the suffix "d" or with different numerals. FIGS. 48 and 49 depict substrate portion 10d wherein all of the selectively grown elemental-form silicon-containing material of FIGS. 5 and 6 has been oxidized to form a silicon dioxide-comprising bridge 90d across the respective openings over the respective cavities. Processing may otherwise occur as described above with respect to the substrate 10/10a/10b/10c and other embodiments.

Figure 50:
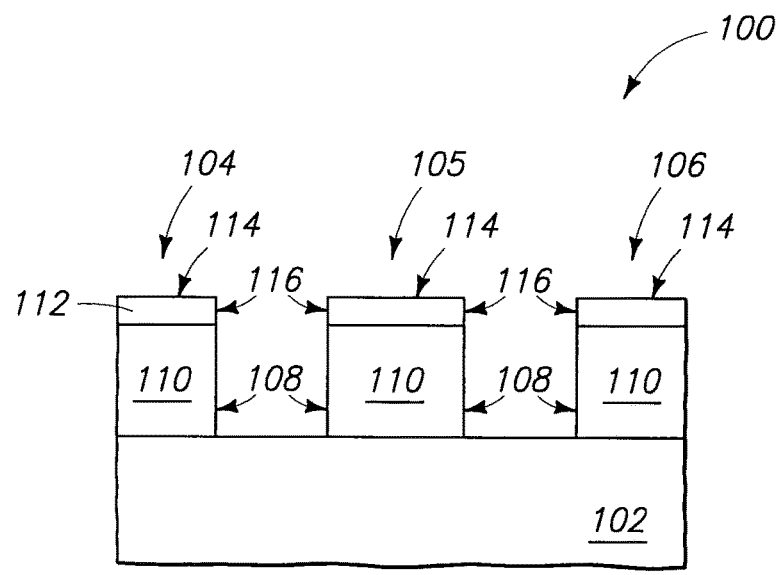
FIG. 50 is a diagrammatic sectional view of a portion of a substrate in process in accordance with an embodiment of the invention.

Additional embodiments of methods of forming covered voids in a semiconductor substrate are next described with reference to FIGS. 50-53. Referring to FIG. 50, a substrate portion 100 comprises some base substrate 102, for example monocrystalline silicon and/or at least one other semiconductor material. Projections 104, 105, and 106 project upwardly from substrate 102, and comprise sidewalls 108. Projections 104, 105, and 106 comprise different composition first and second materials 110 and 112, respectively, with second material 112 comprising at least some outwardly-exposed portion which is received over first material 110. First and second materials 110, 112 may be insulative, conductive, semiconductive, and including any combination thereof. Example materials of construction and dimensions for materials 110 and 112 are as described above in connection with the first-described embodiment for layers 14 and 16, respectively. For purposes of the continuing discussion, second material 112 may be considered as comprising elevationally outermost surfaces 114 and second material sidewalls 116.

Figure 51:
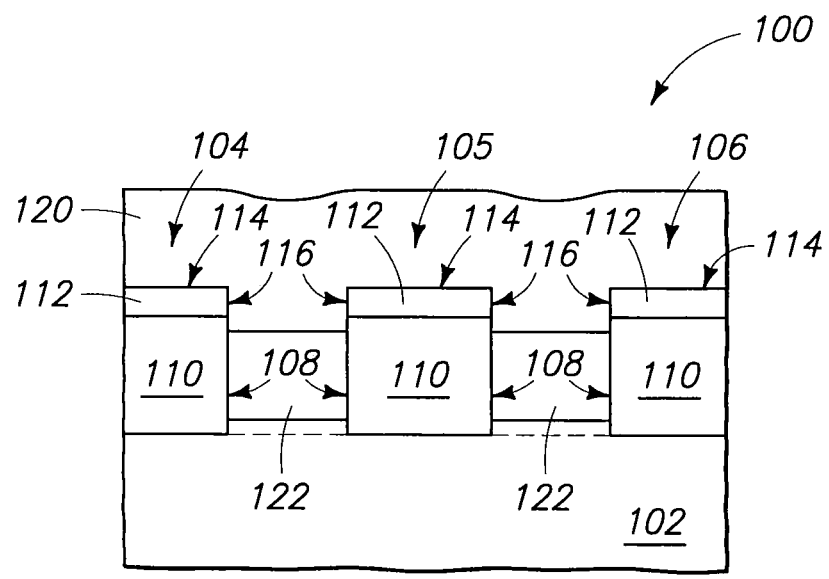
FIG. 51 is a view of the FIG. 50 substrate at a processing step subsequent to that shown by FIG. 50.

Referring to FIG. 51, a third material 120 has been selectively grown from second material 112 elevationally inward along projection sidewalls 108 and effective to bridge across projections 104, 105, and 106 with third material 120 to form respective covered voids 122 between adjacent pairs of the projections. Example attributes, materials, and methods are otherwise as described in connection with any of the above embodiments. The third material may be of the same composition as the second material, or of different composition. In one embodiment, the third material comprises elemental-form silicon, and the selectively growing comprises selective and/or epitaxial silicon-comprising growth. In one embodiment, the second material comprises elemental-form silicon. In one embodiment, the second material comprises any one or more of elemental-form W, elemental-form Ti, or a silicide. In one embodiment, the second material comprises elemental-form silicon, and the selectively growing comprises any one or more of elemental-form W or a silicide. In one embodiment, the second material comprises any one or more of elemental-form W, elemental-form Ti, or a silicide, and the selectively growing comprises epitaxial silicon-comprising growth. In the FIG. 51 embodiment, selective growth of third material 120 occurs from exposed elevationally-outermost surfaces 114 of second material 112 and from exposed sidewalls surfaces 116 of second material 112. Alternately, portions or all of at least one of such may be covered during the selective growth.

Figure 52:
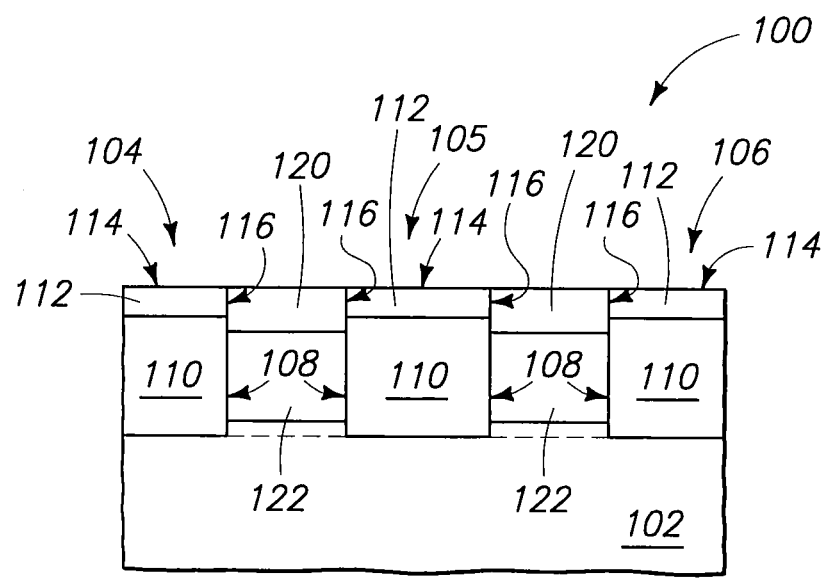
FIG. 52 is a view of the FIG. 51 substrate at a processing step subsequent to that shown by FIG. 51.
Figure 53:
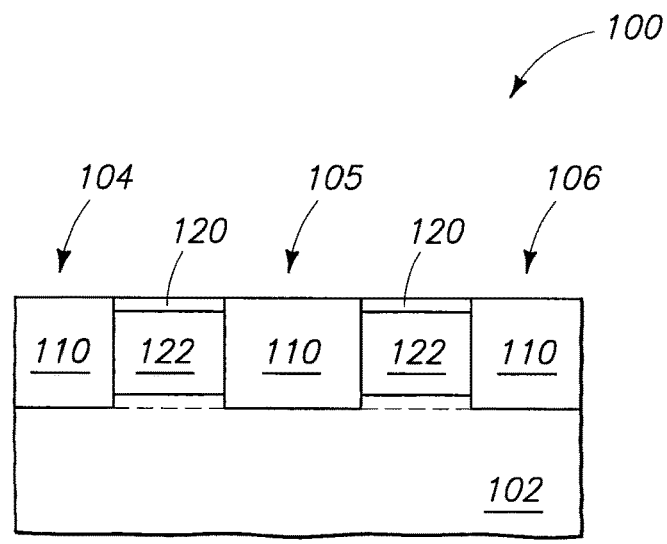
FIG. 53 is a view of the FIG. 52 substrate at a processing step subsequent to that shown by FIG. 52.

Referring to FIG. 52, third material 120 has been removed inwardly at least to second material 112 and effective to leave a third material-comprising bridge 120 across the respective adjacent pair of projections over the respective covered voids 122. Such removing may comprise any one or combination of etching, mechanical polishing, and/or chemical mechanical polishing. Further, such removing of third material 120 may be conducted inwardly to first material 110, for example as shown in FIG. 53. Again for example in such instance, such removing of the third material is effective to leave a third material-comprising bridge 120 over the respective pairs of projections over the covered voids.

Other attributes and methods may otherwise be as described in any of the above and below embodiments. For example and by way of example only, the covered voids may be provided to comprise elongated trenches running generally parallel a mean outermost global surface of the semiconductor substrate. Further in one embodiment, at least a majority of such trenches may be filled with conductive material to form elongated conductive lines therefrom. Alternately and by way example only, the pair of projections may be formed to comprise other structures, for example spaced free-standing pillars, prior to the stated selective growth. In one embodiment, the selective growth may form one or more voids to be covered by a ceiling supported at least in part by the plurality of pillars received within the void.

Embodiments herein also include methods of cooling semiconductor devices. For example, any of the structures shown and described herein which provide covered trenches or openings may be utilized in such method embodiments and in structure embodiments. Example materials of construction and dimensions are otherwise as disclosed herein. A method of cooling semiconductor devices in accordance with an embodiment comprises etching trenches into an insulative material. An elemental-form silicon-containing material is selectively grown across the trenches to convert the trenches to elongated covered conduits. At least one integrated circuit device is formed and is received at least partially within the elemental-form silicon-containing material received at least across one of the elongated covered conduits. Coolant is provided within the conduits, and preferably comprises the flowing of coolant therethrough for example in the form of one or both of liquid or gas.

In one embodiment, the trenches are provided to have exposed trench bases which comprise elemental-form silicon-containing material over which the insulative material is deposited. In one embodiment, an elemental-form silicon-containing material was epitaxially grown from the trench bases during the selectively growing of the elemental-form silicon-containing material across the trenches to convert the trenches to elongated covered conduits.

In one embodiment, etching of the trenches first comprises depositing insulative material over an elemental-form silicon-containing material. The trenches are then etched into such insulative material. An exposed seed material, which is different from the insulative material, is provided over the insulative material prior to the selective growth and from which the elemental-form silicon-comprising material received across the trenches is selectively grown during such selective growth. Of course, any of the above-described seed materials may be utilized, and regardless such seed material may be provided over the insulative material prior to or after the etching to form the trenches. If provided before, the act of etching the plurality of trenches will also occur first through the seed material and then through the insulative material. In one embodiment, the selective growth comprises epitaxial growth of the elemental-form silicon-containing material.

Figure 54:
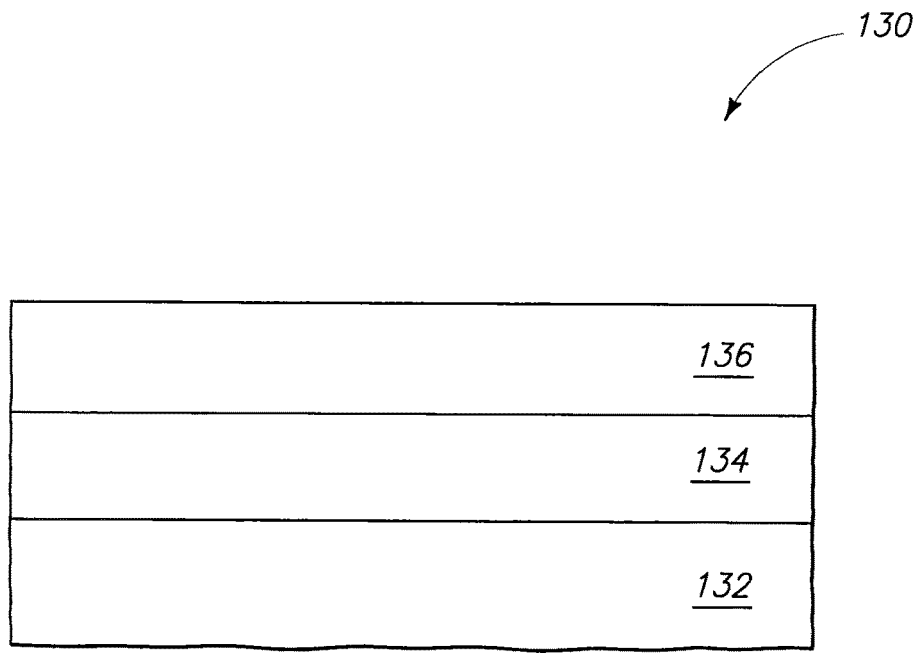
FIG. 54 is a diagrammatic sectional view of a portion of a substrate in process in accordance with an embodiment of the invention.

Embodiments herein also include methods of forming semiconductor-on-insulator substrates. For example referring to FIG. 54, a portion of a semiconductor-on-insulator substrate is indicated generally with reference numeral 130. Such comprises some base substrate 132, an insulator layer 134 received thereover, and a silicon-containing semiconductor layer 136 received over insulator layer 134. Base substrate 132 may comprises a bulk monocrystalline silicon-containing substrate. Example materials for insulator 134 include one or both of silicon dioxide or silicon nitride. An example thickness range for layer 134 is from about 1,000 Angstroms to about 3,000 Angstroms. An example thickness range for silicon-containing semiconductor layer 136 is from about 600 Angstroms to about 2,000 Angstroms, with example materials including monocrystalline silicon and SiGe$_x$, where "x" ranges from 0.01 to 2.0.

Figure 55:
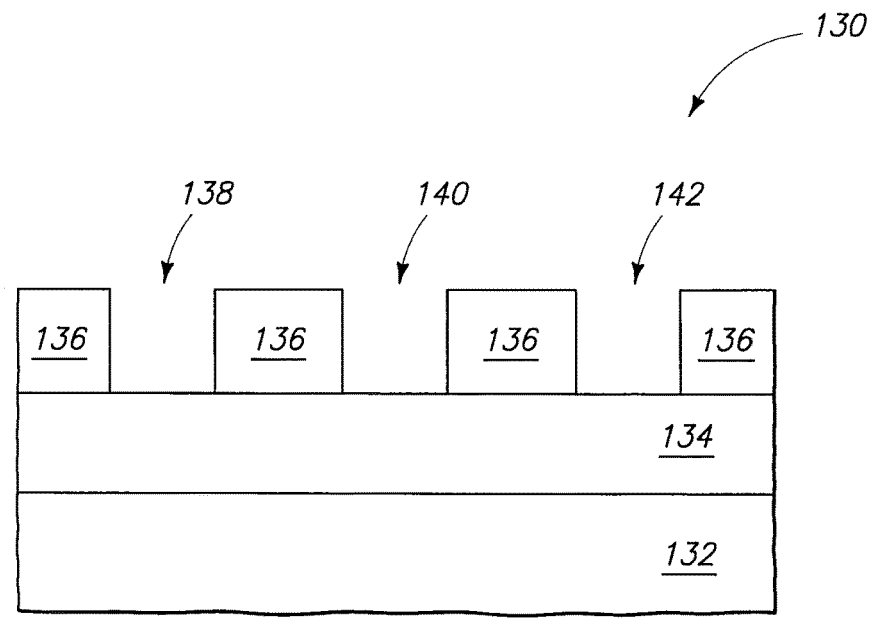
FIG. 55 is a view of the FIG. 54 substrate at a processing step subsequent to that shown by FIG. 54.

Referring to FIG. 55, a plurality of openings 138, 140, and 142 have been etched through semiconductor layer 136. Such etching may also be conducted to extend openings 138, 140, and 142 partially into or completely through insulator layer 134 (not shown in FIG. 55). Openings 138, 140, and 142 may be of any shape, for example shapes as disclosed herein, with one embodiment being of elongated trenches running generally parallel a mean outermost global surface of the semiconductor-on-insulator substrate. Substrate portion 130 in FIG. 55 is depicted as having a planar outermost global surface defined by the outermost surface of silicon-containing semiconductor layer 136, although planarity is of course not required.

Figure 56:
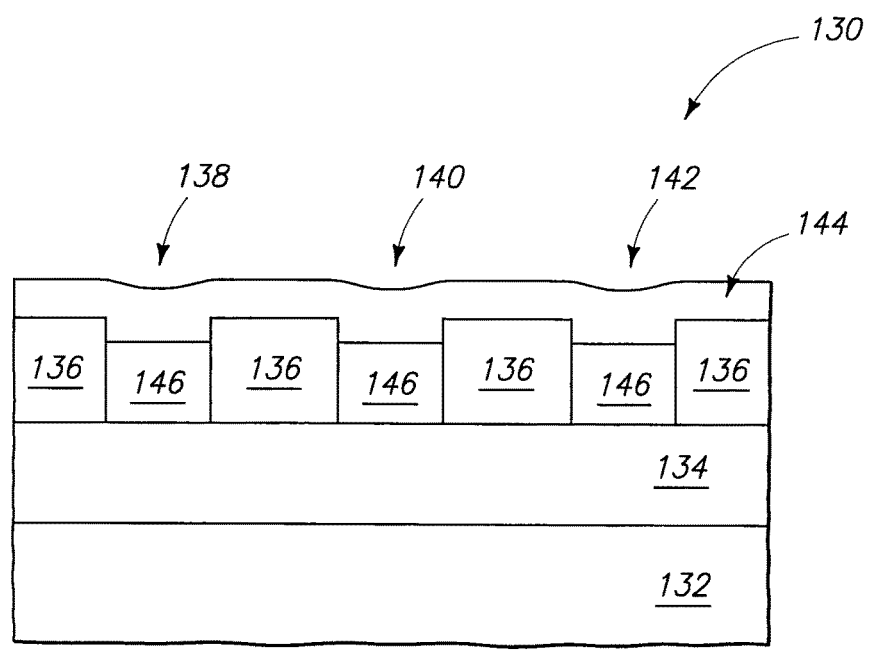
FIG. 56 is a view of the FIG. 55 substrate at a processing step subsequent to that shown by FIG. 55.

Referring to FIG. 56, an elemental-form silicon-comprising material 144 has been epitaxially grown over silicon-containing semiconductor layer 136 received over insulator layer 134 effective to bridge across openings 138, 140, and 142 with elemental-form silicon-comprising material, and to form covered voids 146 within openings 138, 140, and 142. At least one of field effect transistor channel regions or field effect transistor source/drain regions are formed within the elemental-form silicon-comprising material bridging across openings 138, 140, and 142.

Figure 57:
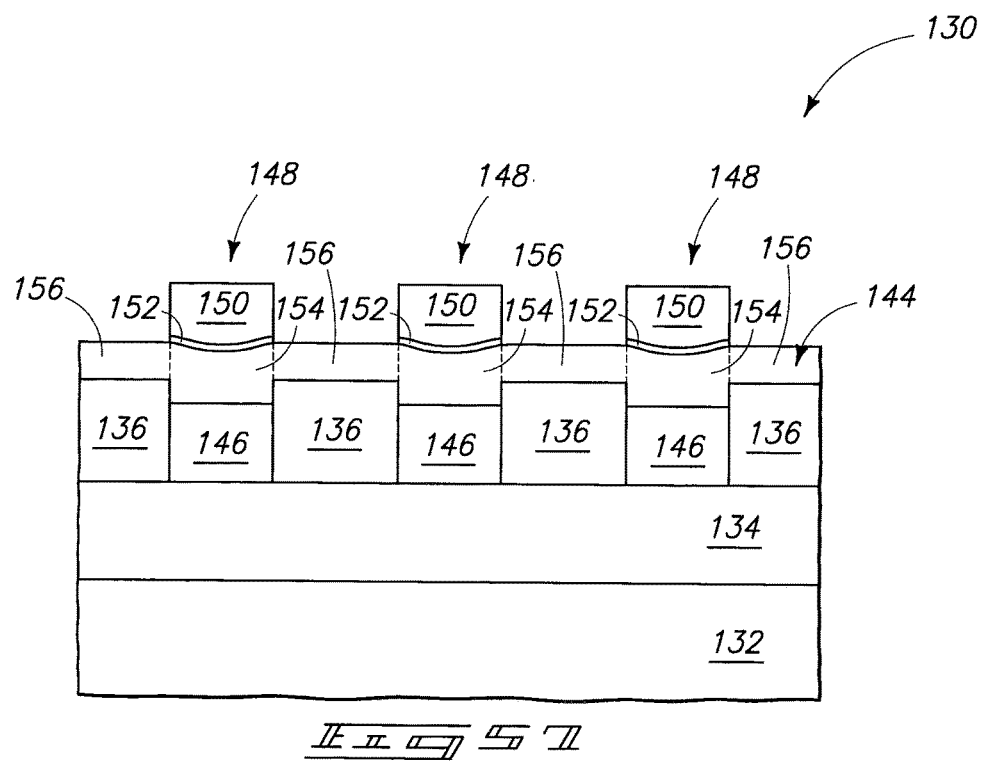
FIG. 57 is a view of the FIG. 56 substrate at a processing step subsequent to that shown by FIG. 56.

For example and by way of example only, FIG. 57 depicts both field effect transistor channel regions 154 and field effect transistor source/drain regions 156 formed within material 144. Gate constructions 148 have been formed directly over openings 138, 140, and 142. Such are depicted as comprising conductive regions 150 formed over a gate dielectric region 152.

Figure 58:
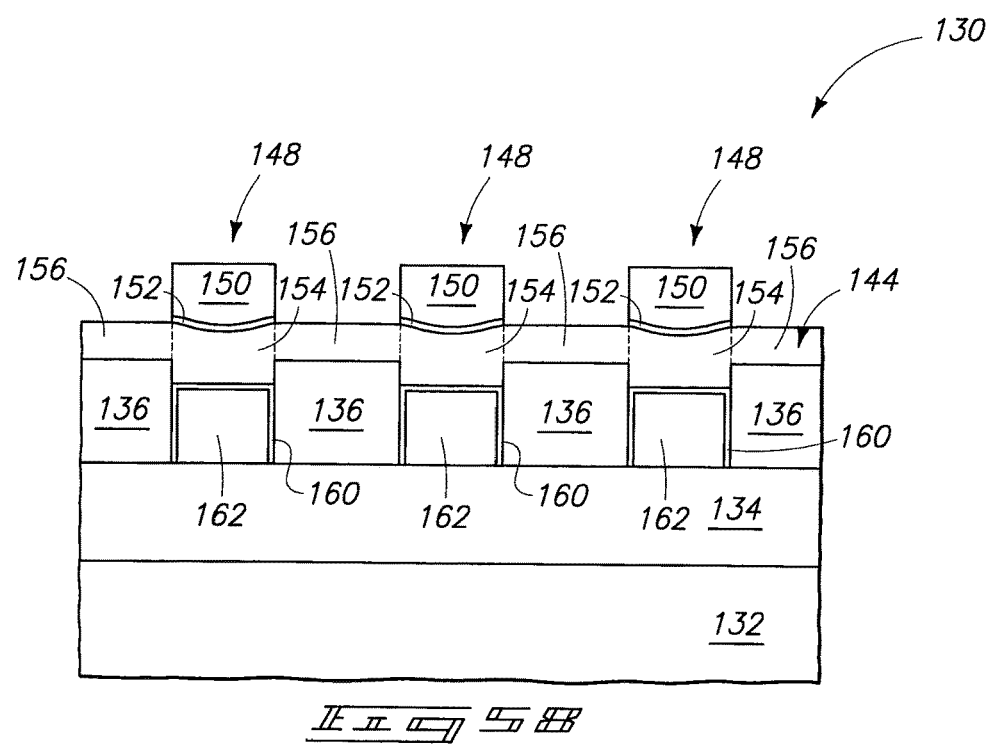
FIG. 58 is a view of the FIG. 57 substrate at a processing step subsequent to that shown by FIG. 57.

Covered voids 146, in whole or in part, may remain as part of the finished circuitry construction, for example provided with coolant fluid flowing or statically received therein. In one embodiment, covered voids 146 are wholly or partially filled with one, two, or three of any of conductive, semiconductive, and/or insulative materials. In one embodiment, a field effect transistor gate construction is provided within previous voids 146, and perhaps with gate constructions 148 in such embodiment being eliminated. Alternately by way of example only, field effect transistor gate constructions may be provided both within previously covered voids 146 and thereover, for example as depicted in FIG. 58. Substrate portion 130 in FIG. 58 is depicted as comprising a gate dielectric 160 and conductive material 162 within previous covered voids 146. Thereby, example channel regions 154 are gated from above and below. By way of example only, the gate dielectric may be formed by a thermal oxidation utilizing gases which access covered voids 146 (FIG. 57) from one or more ends thereof, followed by an isotropic deposition of any suitable conductive material 162, for example as described elsewhere in this document.

Figure 59:
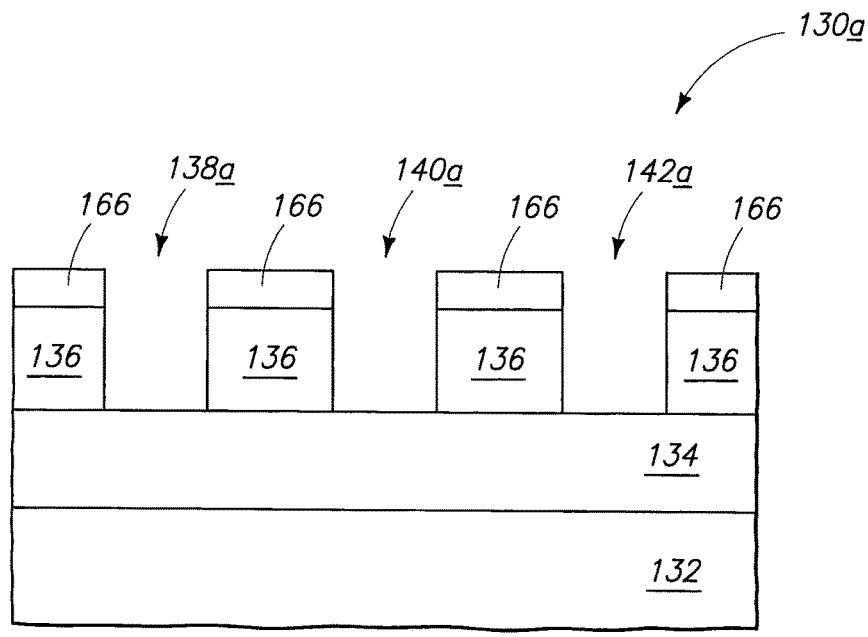
FIG. 59 is a diagrammatic sectional view of a portion of a substrate in process in accordance with an embodiment of the invention.
Figure 60:
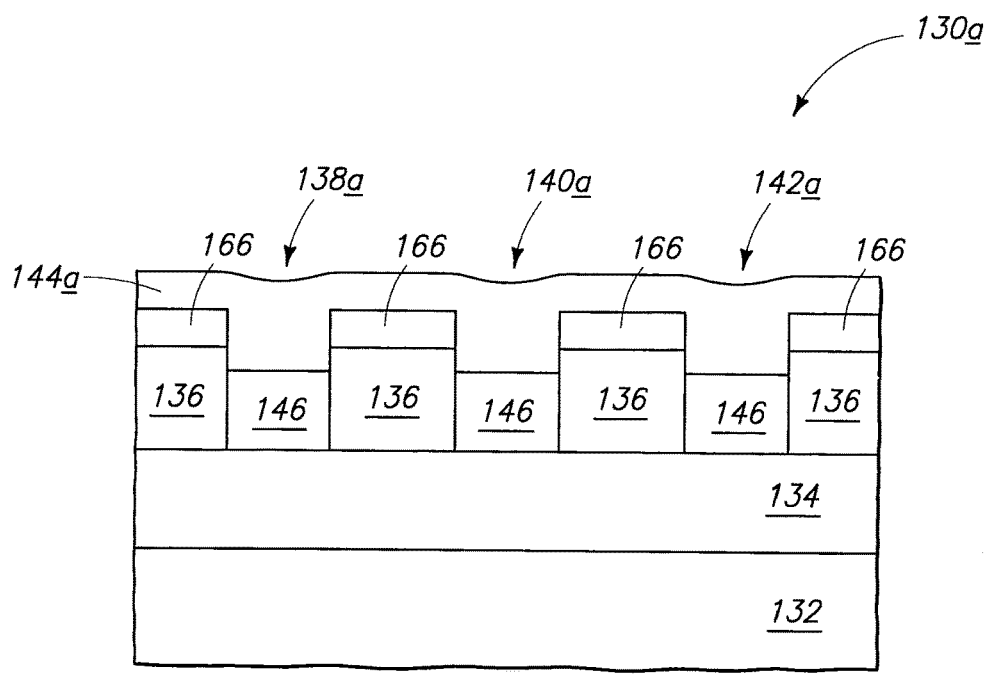
FIG. 60 is a view of the FIG. 59 substrate at a processing step subsequent to that shown by FIG. 59.

In one embodiment, FIGS. 54-58 depict epitaxial growth of an elemental-form silicon-comprising material 144 from exposed portions of an example silicon-containing semiconductor layer 136. By way of example only in but one alternative, an exposed epitaxial seed material may be provided over the silicon-containing semiconductor layer prior to the epitaxial growth and from which the elemental-form silicon-comprising material is grown during such epitaxial growth. Such an example embodiment is depicted with respect to a substrate portion 130a in FIGS. 59 and 60. Like numerals from the first-described embodiment have been utilized where appropriate, with differences being indicated with the suffix "a" or with different numerals. FIG. 59 depicts substrate portion 130a as comprising an exposed epitaxial seed material 166 received over silicon-containing semiconductor layer 136, and through which openings 138a, 140a, and 142a are formed. Example epitaxial seed materials are as described elsewhere in this document. FIG. 60 depicts subsequent epitaxial growth of an elemental-form silicon-comprising material 144a over layer 136 effective to bridge across the openings with elemental-form silicon-comprising material 144a to form covered voids 146 within openings 138a, 140a, and 142a.

Another embodiment is described in connection with FIGS. 61-63 with respect to a substrate portion 130b. Like numerals from the substrate portion 130 embodiment are utilized where appropriate, with differences being indicated with the suffix "b" or with different numerals. Referring to FIG. 61, openings 138b, 140b, and 142b have not only been etched through semiconductor 136, but also through insulator layer 134 to a bulk monocrystalline silicon-containing material 132 of a bulk monocrystalline silicon-containing substrate. Openings 138b, 140b, and 142b comprise monocrystalline silicon-containing bases 168. Of course, etching may also occur into material 132 (not shown).

Referring to FIG. 62, an elemental-form silicon-comprising material 145 is epitaxially grown from monocrystalline silicon-containing bases 168, and an elemental-form silicon-comprising material 144b is epitaxially grown from over silicon-containing semiconductor layer 136 received over insulator layer 134 effective to bridge across openings 138b, 140b, and 142b, and form covered voids 146b within such openings. At least one of field effect transistor channel regions or field effect transistor source/drain regions are formed within elemental-form silicon-comprising material 144b bridging across openings 138b, 140b and 142b.

Any of the processing and constructions as depicted and described in the FIGS. 54-60 embodiments may be fabricated with respect to the FIG. 62 embodiment. For example and by way of example only, FIG. 63 depicts the fabrication of gate constructions 172 within what were previously-covered voids 146b (FIG. 62). Dielectric material 174 has been formed, for example by thermal oxidation of materials 144b and 145 within the covered voids 146b of FIG. 62. A conductive gate material 176 has been subsequently deposited thereover, with at least the uppermost dielectric material 174 received against material 144b comprising a gate dielectric. Channel regions 154b and source/drain regions 156b have been formed within epitaxially grown elemental-form silicon-comprising material 144b.

Embodiments herein encompass integrated circuitry. In one embodiment, integrated circuitry comprises a semiconductor-on-insulator substrate having some mean outermost global surface. The substrate comprises monocrystalline silicon-containing material, an insulator received over the monocrystalline silicon-containing material, and an elemental-form silicon-comprising material received over the insulator. A plurality of elongated cooling conduits runs generally parallel to the mean outermost global surface within the insulator (i.e., within at least some portion of the insulator). Cooling fluid is received within the cooling conduits. In certain embodiments, one or both of field effect transistor channel regions and/or field effect transistor source/drain regions are received within the elemental-form silicon-comprising material that is over the cooling conduits. Example constructions, materials, dimensions, and methods of fabrication are otherwise as described anywhere else in this document.

Embodiments of methods of forming a semiconductor-on-insulator substrate are next described with reference to FIGS. 64-70 with respect to a substrate portion 200. Referring to FIG. 64, such comprises a base substrate 202 having an insulative layer 204 formed thereover. In one embodiment, an epitaxial seed material 206 or a seed material 206 is formed over insulative material 204. In one embodiment, base substrate 202 comprises a bulk monocrystalline silicon wafer and/or a carrier substrate. Regardless and for purposes of the continuing discussion, base substrate 202 may be considered as comprising a base region 208, a silicon-containing semiconductor region 212 over base region 208, and a release region 210 provided intermediate silicon-containing semiconductor region 212 and base region 208. In one embodiment, base substrate 202 comprises bulk monocrystalline silicon, and in one embodiment release region 210 is formed by implanting hydrogen into base substrate 202. For example, a hydrogen-implanted release region 210 may be formed by implanting hydrogen ions (H+) at about 40-210 KeV at a dose of about 5E16/cm$^2$. Alternately and by way of example only, another example release region 210 may be formed to comprise an insulator layer received over base region 208. For example, such may be formed by the suitable implant of oxygen atoms and a subsequent anneal to form a silicon dioxide region 210. As an alternate example, a suitable silicon dioxide or other layer may be deposited atop a base substrate 208, and a silicon-containing semiconductor region 212 formed thereover subsequently. Regardless, an example thickness range for release region 210 is from about 200 Angstroms to 2 about microns, and some interface 215 is inherently provided or formed relative to release region 210 and silicon-containing semiconductor region 212.

Figure 65:
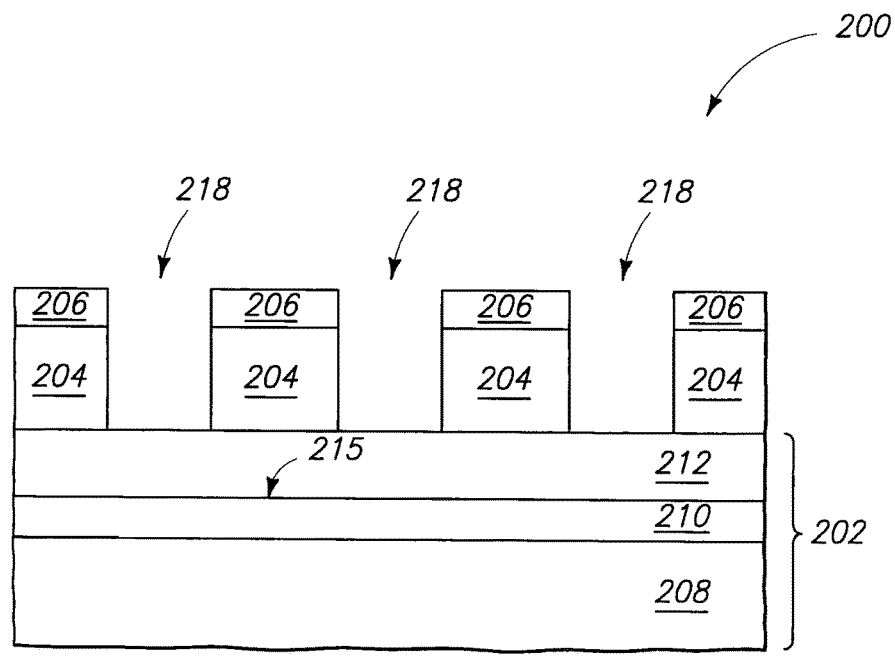
FIG. 65 is a view of the FIG. 64 substrate at a processing step subsequent to that shown by FIG. 64.

Referring to FIG. 65, cooling trenches 218 have been etched into insulative layer 204 to silicon-containing semiconductor region 212. Where material 206 is provided, cooling trenches 218 are also etched therethrough as shown in the depicted embodiment.

Figure 66:
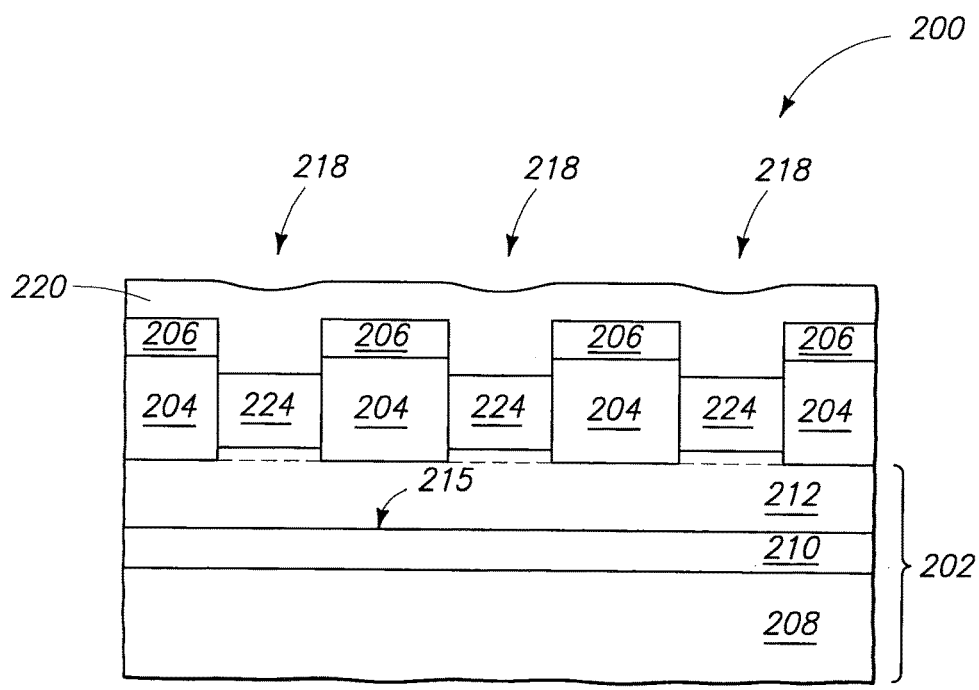
FIG. 66 is a view of the FIG. 65 substrate at a processing step subsequent to that shown by FIG. 65.

Referring to FIG. 66, a bridging material 220 has been selectively grown (relative to the insulative layer, at least) over insulative layer 204 effective to bridge across cooling trenches 218 with bridging material, and form covered elongated cooling trenches 224. Example materials and dimensions for, and methods of forming, bridging material 220 are as described above in other embodiments for the covering of voids/trenches. Of course as in embodiments described elsewhere in this document, epitaxial seed materials and seed materials such as disclosed may be utilized, and regardless growth of epitaxial material may occur from bases of openings 218, for example as shown. Regardless, covered elongated cooling trenches 224 may, at this point or later, be partially filled with one or more of insulative, semiconductive, and/or conductive materials.

Figure 67:
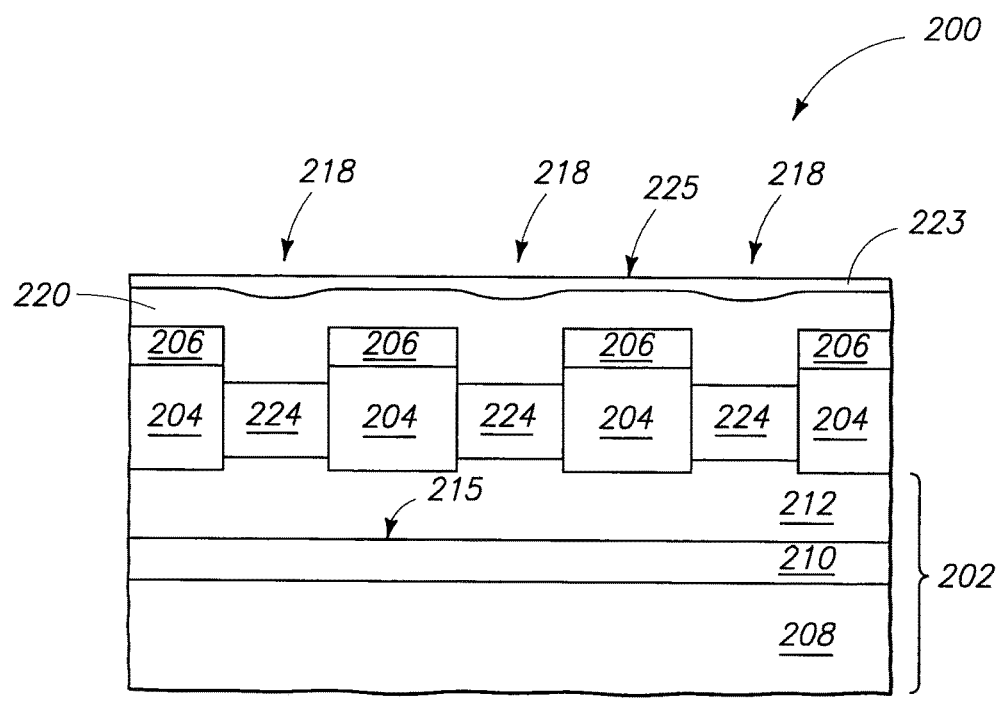
FIG. 67 is a view of the FIG. 66 substrate at a processing step subsequent to that shown by FIG. 66.

Referring to FIG. 67, and in but one example embodiment, an insulator layer 223 has been formed on an outer surface of bridging material 220 bridging across cooling trenches 218. In one embodiment, such is formed to have a substantially planar outer surface 225.

Figure 68:
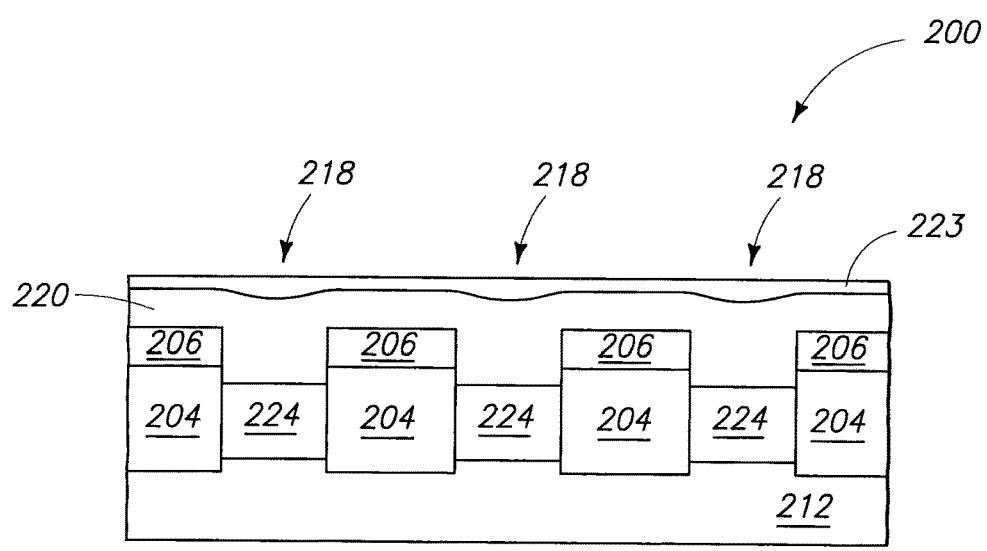
FIG. 68 is a view of the FIG. 67 substrate at a processing step subsequent to that shown by FIG. 67.

Referring to FIG. 68, at interface 215 of release region 210 (not shown) and silicon-containing semiconductor region 212, separation has occurred of a) base region 208 (not shown) and release region 210 (not shown) from b) silicon-containing semiconductor region 212, insulative layer 204 with covered elongated cooling trenches 224, and bridging material 220. By way of example only, techniques for doing so include so-called "smart-cut techniques", and for example as described in U.S. Pat. No. 6,184,111.

Referring to FIG. 69 and in but one embodiment, substrate 200 has been bonded with a carrier substrate 230. In one embodiment, carrier substrate 230 comprises some base substrate 232 having an oxide layer 234 formed thereover. Insulator layer 223 of substrate 200 has been bonded to carrier substrate 230, and in the depicted embodiment to oxide layer 234 thereof. Regardless, at least one of field effect transistor channel regions or field effect transistor source/drain regions are formed within silicon-containing semiconductor region 212, and cooling fluid is provided within cooling trenches 224.

For example, FIG. 70 depicts subsequent processing wherein a gate dielectric 240 has been formed over silicon-containing semiconductor region 212, and gates constructions 242 have been formed thereover. FIG. 70 also depicts channel regions 250 and source/drain regions 252 being formed in silicon-containing semiconductor region 212. Cooling fluid may ultimately be provided within the covered elongated cooling trenches. Such cooling fluid may comprise flowing gas, for example air, and/or a suitable flowing liquid.

Figure 71:
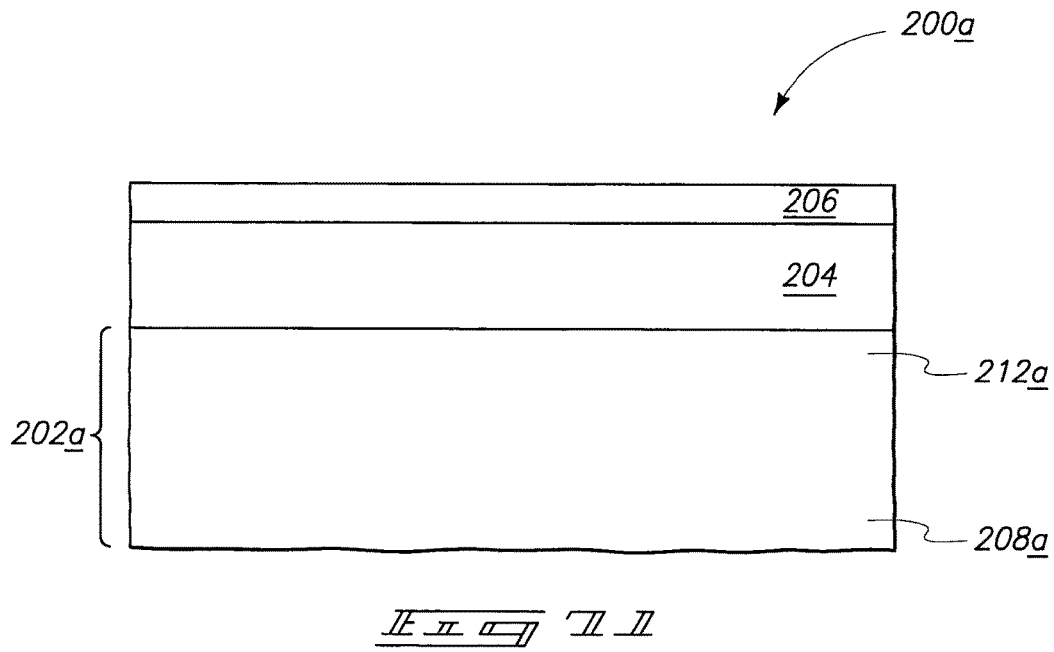
FIG. 71 is a diagrammatic sectional view of a portion of a substrate in process in accordance with an embodiment of the invention.
Figure 72:
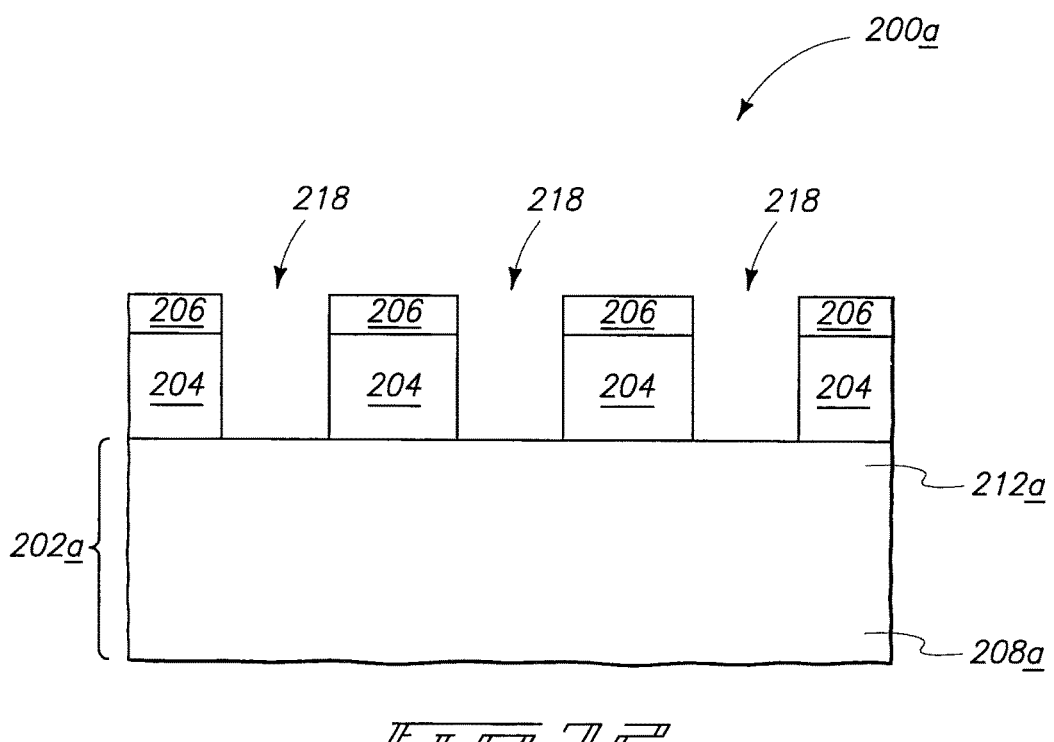
FIG. 72 is a view of the FIG. 71 substrate at a processing step subsequent to that shown by FIG. 71.
Figure 73:
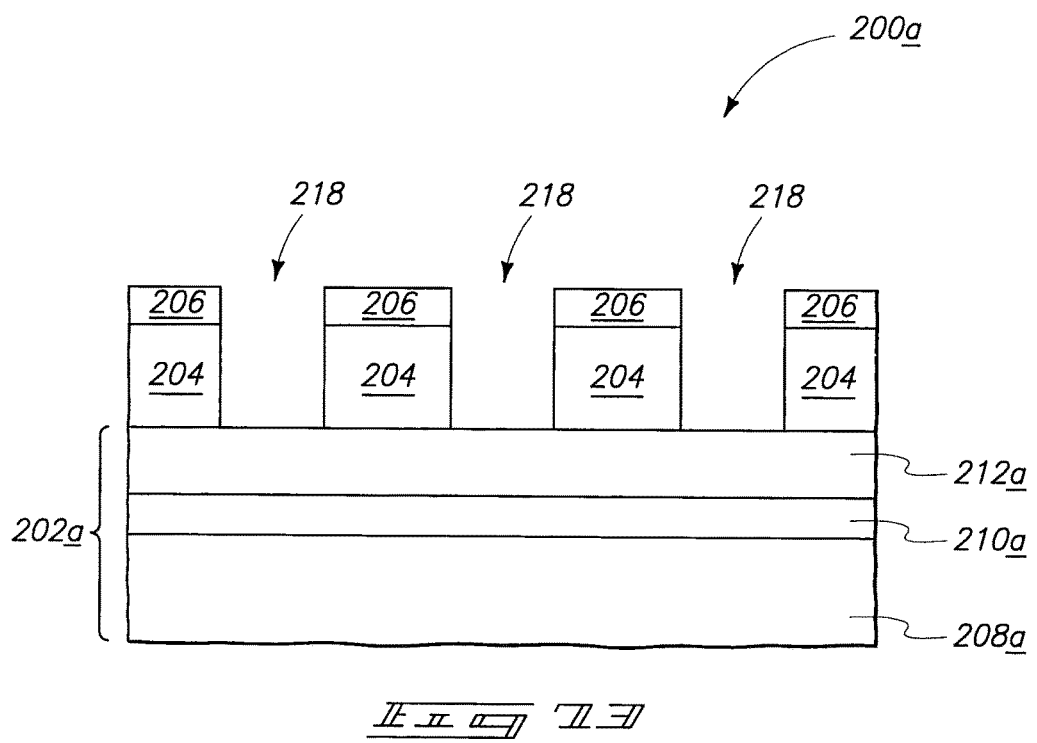
FIG. 73 is a view of the FIG. 72 substrate at a processing step subsequent to that shown by FIG. 72.

The above example FIGS. 64-70 embodiment encompasses a method wherein the release region was formed prior to the etching to form trenches 218. FIGS. 71-73 depict an alternate embodiment substrate portion 200a wherein the release region is formed after the etching to form the cooling trenches. Like numerals from the first-described embodiment are utilized where appropriate, with differences being indicated with the suffix "a". Referring to FIG. 71, base substrate 202a comprises a base region 208a and silicon-containing semiconductor region 212a which is void of a defined release region, at least at this point in the process.

Referring to FIG. 72, cooling trenches 218 have been etched into insulative layer 204 to silicon-containing semiconductor region 212.

Referring to FIG. 73, release region 210a has been formed intermediate silicon-containing semiconductor region 212a and base region 208a. Such may be formed, by way of example only, by implanting one or more of hydrogen atoms and/or oxygen atoms. A wholly or partially sacrificial planarized layer may be provided over substrate 200a prior to such implanting effective to fill openings 218 to provide uniform thickness material for ion implanting therethrough to form release region 210a. Processing may proceed subsequently as described above, or otherwise, with respect to the FIGS. 64-70 embodiment.

Embodiments of methods of forming a semiconductor-on-insulator substrate are next described with reference to FIGS. 105 and 106 with respect to a substrate portion 200b. Like numerals from the FIGS. 64-70 substrate portion 200 embodiment are utilized where appropriate, with differences being indicated with the suffix "b" or with different numerals.

Figure 105:
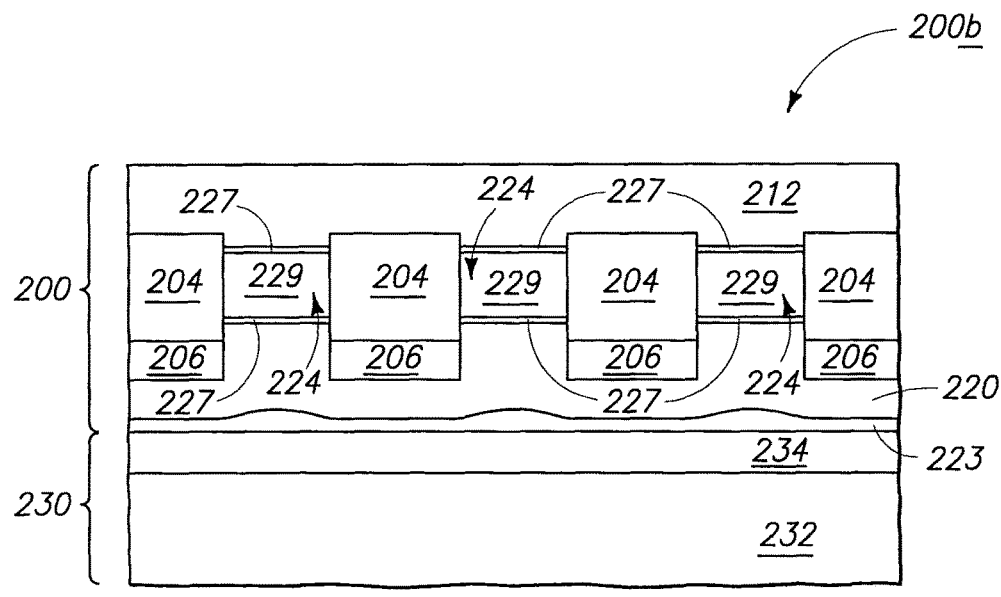
FIG. 105 is a diagrammatic sectional view of a portion of a substrate in process in accordance with an embodiment of the invention, and is alternate processing to that depicted by FIG. 70 subsequent to that depicted by FIG. 69.

Referring to FIG. 105, alternate processing to that depicted by FIG. 70 is shown. Specifically, suitable gate dielectric material 227 and conductive first field effect transistor gates 229 have been formed within trenches 224. Accordingly in this embodiment at least with respect to the depicted trenches 224, such do not function as cooling trenches within which cooling fluid is ultimately received.

Figure 106:
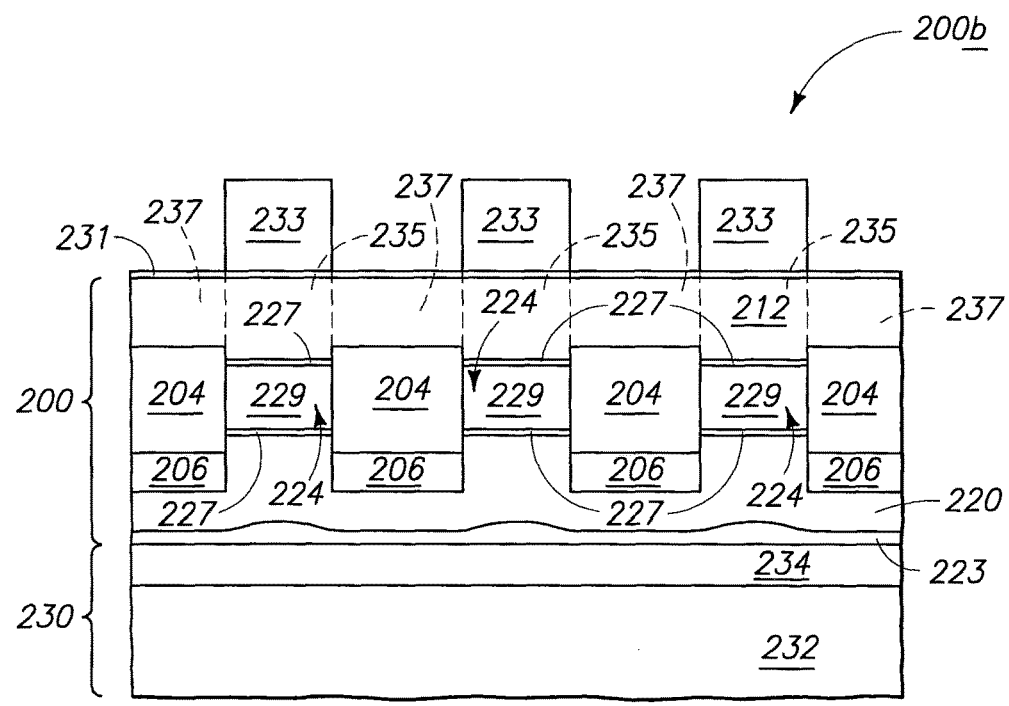
FIG. 106 is a view of the FIG. 105 substrate at a processing step subsequent to that shown by FIG. 106.

Referring to FIG. 106, gate dielectric 231 has been formed over silicon-containing semiconductor region 212. Second field effect transistor gates 233 have been formed opposite first field effect transistor gates 229 over silicon-containing semiconductor region 212. Field effect transistor channel regions 235 have been formed within material of silicon-containing semiconductor region 212 received between first field effect transistor gates 229 and second field effect transistor gates 233. Source/drain regions 237 have been formed within silicon-containing semiconductor region 212. Processing sequence to produce the FIG. 106 structure may of course be in any order with respect to components/ regions 227, 229, 231, 233, 235, and 237. Processing may otherwise occur as described above with respect to either of the FIGS. 64-70 embodiment or the FIGS. 71-73 embodiment, and by way of examples only.

Some embodiments herein include electromagnetic radiation guides (such as conduits) and methods of forming electromagnetic radiation guides. An example embodiment is described with reference to FIGS. 74-79.

Figure 74:
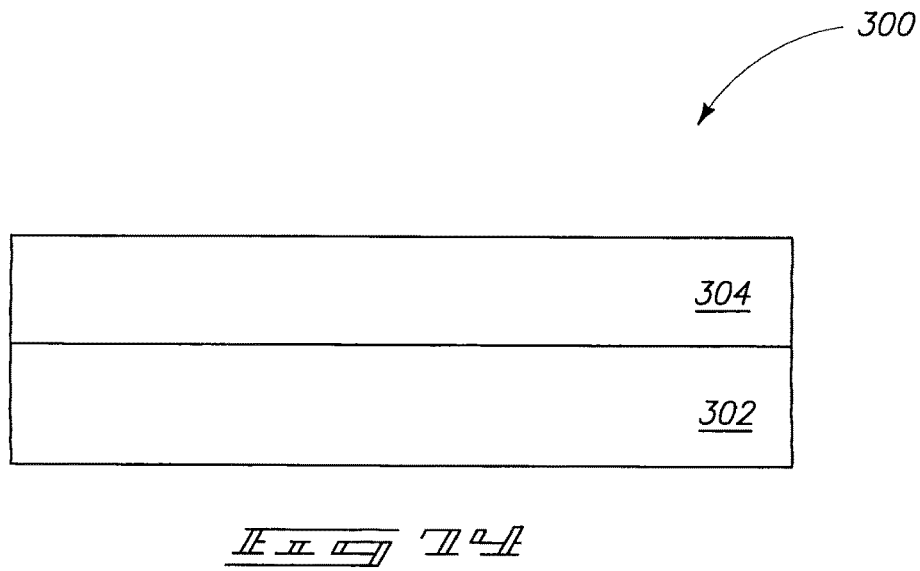
FIG. 74 is a diagrammatic sectional view of a portion of a substrate in process in accordance with an embodiment of the invention.

Referring to FIG. 74, a semiconductor construction 300 comprises a base 302 and a material 304 over the base. The base 302 may comprise one or more semiconductor materials, such as silicon or germanium. In some embodiments, the base may be configured to generate electromagnetic radiation upon appropriate electrical stimulus. In such embodiments, the base may comprise, consist essentially of, or consist of III/IV material (for example, may contain one or more of InAlP, GaS, and GaN), or a II/VI material (for example, may contain one or both of zinc selenide and cadmium telluride).

Material 304 is ultimately patterned into projections over base 302, and may comprise any material suitable to form such projections. Material 304 may be electrically insulative, conductive or semiconductive. In some embodiments, material 304 is electrically insulative and comprises, consists essentially of, or consists of silicon dioxide and/or silicon nitride.

Figure 75:
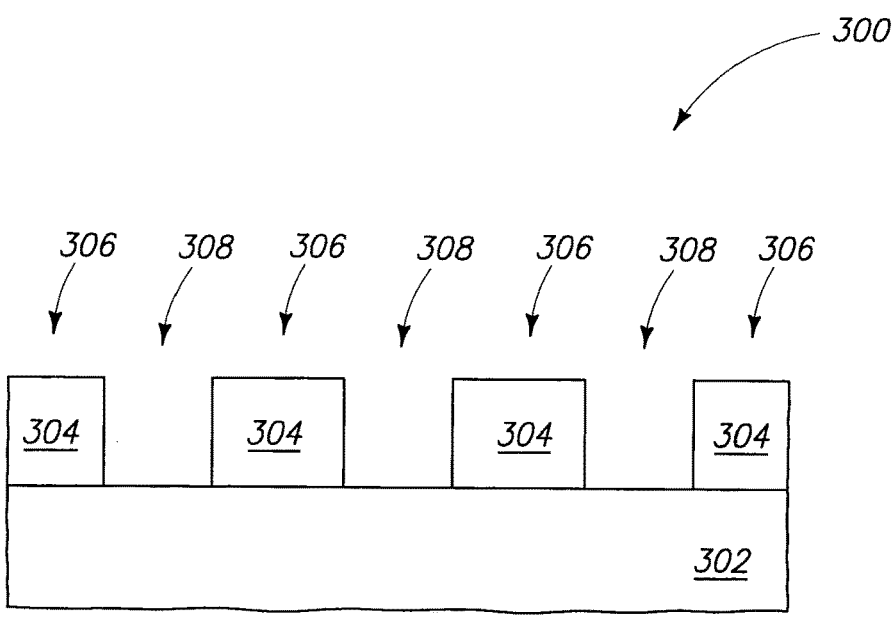
FIG. 75 is a view of the FIG. 74 substrate at a processing step subsequent to that of FIG. 74.

Referring to FIG. 75, material 304 is patterned into a plurality of projections 306, with such projections being spaced from one another by gaps 308 extending to base 302. Although the gaps are shown extending only to an upper surface of base 302, in other embodiments the gaps may extend into base 302.

Material 304 may be patterned utilizing any suitable processing. For instance, photolithographically patterned photoresist may be provided over material 304 to define the pattern which is ultimately be formed in material 304; an etch may be conducted to transfer the pattern from the photoresist to the material 304; and subsequently the photoresist may be removed to leave the construction of FIG. 75.

Figure 76:
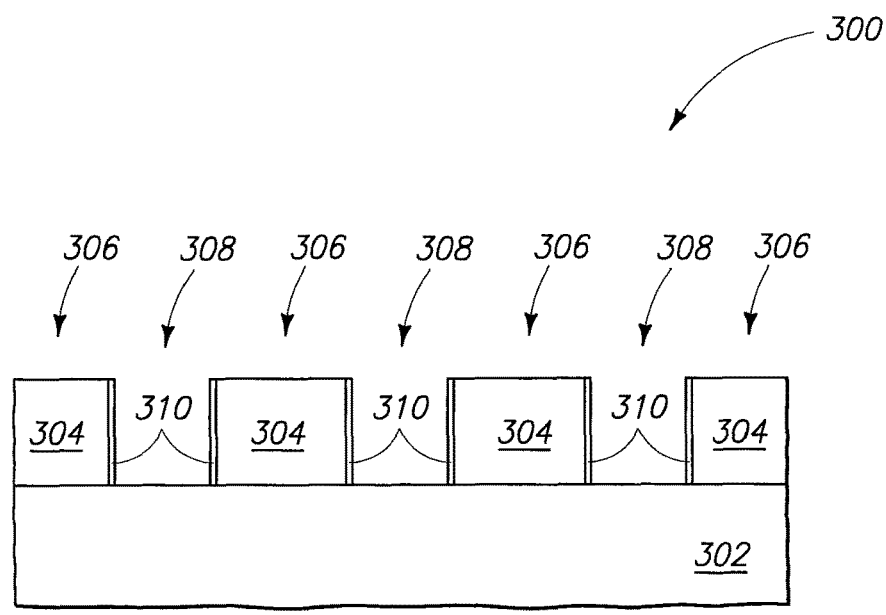
FIG. 76 is a view of the FIG. 75 substrate at a processing step subsequent to that of FIG. 75.

Referring to FIG. 76, a metal-containing layer 310 is formed along sidewalls of projections 306 within openings 308. The metal-containing layer may comprise, consist essentially of, or consist of one or more of elemental metal (such as titanium or tungsten), metal alloys, and metal-containing compositions (such as metal nitride). The metal-containing layer 310 may be formed to line only the sidewalls of projections 304 by any suitable processing. For instance, the metal-containing material may be initially formed as a layer extending across an entire upper topography of construction 300, and then such layer may be subjected to an anisotropic etch to leave the construction of FIG. 76.

Figure 77:
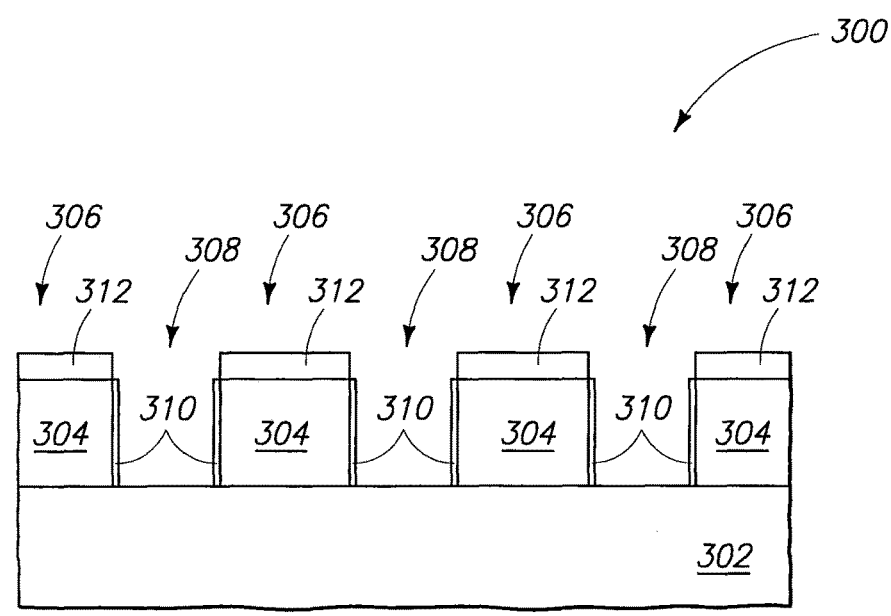
FIG. 77 is a view of the FIG. 76 substrate at a processing step subsequent to that of FIG. 76.
Figure 18:
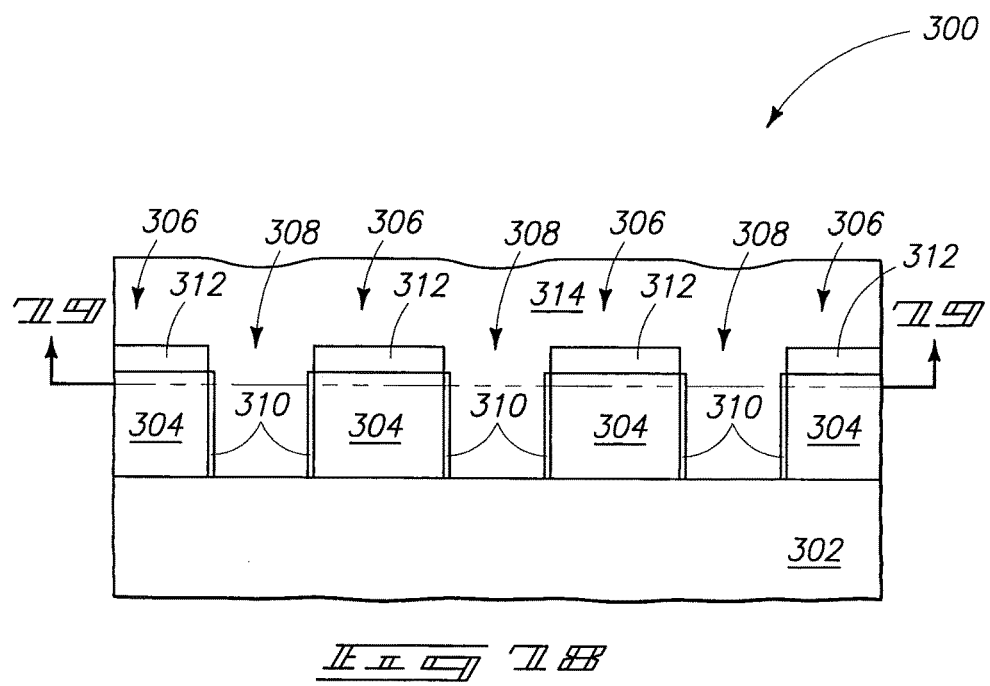
Figure 19:
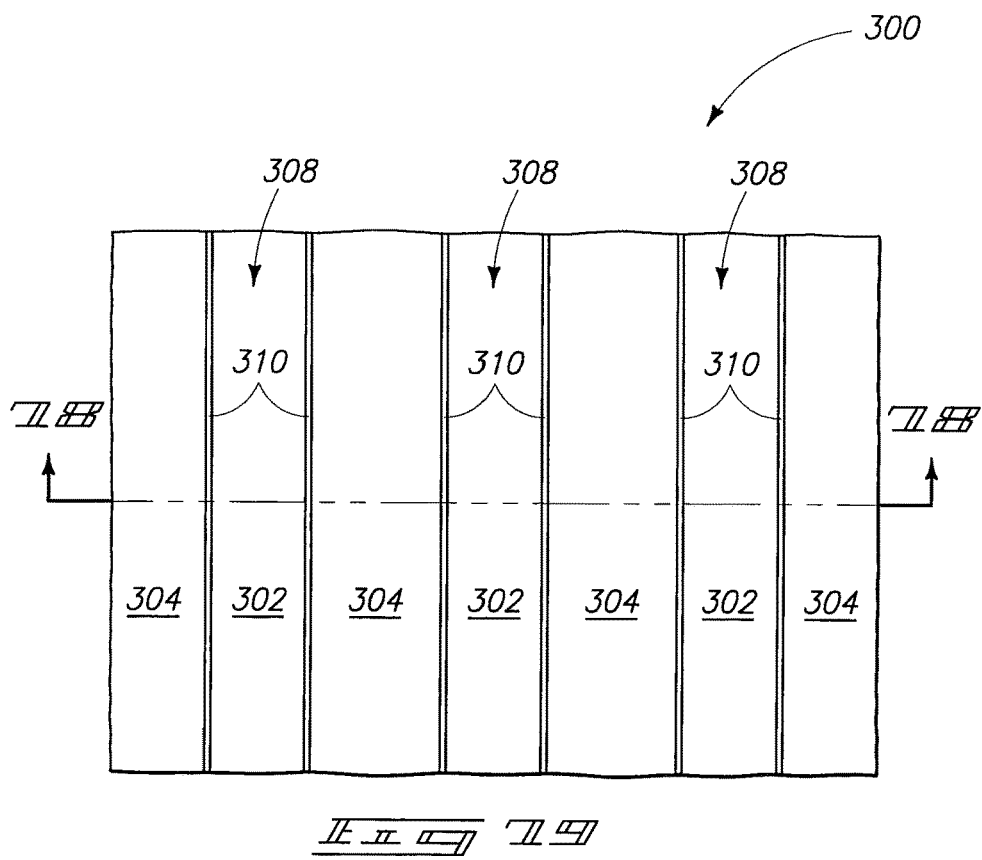

Referring to FIG. 77, seed material 312 is formed over upper surfaces of projections 304. The seed material may be formed by a selective deposition onto the upper surfaces of projections 304, or may be formed by a non-selective deposition followed by an etch. Although the seed material is formed after the patterning of projections 306 in the shown embodiment, in other embodiments the seed material may be provided over material 304 prior to the patterning of the projections. In such other embodiments, the seed material may be patterned during the patterning of the projections.

The seed material may comprise any of the seed materials discussed previously in this disclosure. Accordingly, the seed material may comprise crystalline semiconductor material, tungsten, titanium, silicide, etc.

Referring to FIGS. 78 and 79, a covering material 314 is grown from the seed material to bridge across the projections 306. The material 314 may comprise the same composition as the seed material 312. Accordingly, material 314 may merge with the seed material to form a single homogeneous composition extending across the projections 306 and bridging over the openings 308.

FIG. 79 shows that the openings 308 form a plurality of conduits extending over base 302. In operation, base 302 may be stimulated to generate electromagnetic radiation which enters the conduits and is then guided by the conduits to desired locations. The electromagnetic radiation may comprise any suitable wavelength, and in some embodiments may correspond to visible light. The metal-containing lining (or cladding) 310 may polarize electromagnetic radiation generated by base 302. In some embodiments, the metal-containing lining may be omitted.

Openings 308 may be open spaces at the processing stage of FIG. 78 (as shown), or may be at least partially filled with material. For instance, a material may be provided within the openings that has refractive properties different from those of base 302, cover 314 and metal-containing layer 310 to enhance retention of electromagnetic radiation within the conduits. If the openings are to be at least partially filled with material, such material may be provided prior to the formation of cover 314 across the openings in some embodiment.

In some embodiments, base 302 may comprise a composition which is not an electromagnetic radiation emitter, and instead electromagnetic radiation may be introduced into the conduits from a source other than the base.

Another example embodiment method of forming an electromagnetic radiation guide is described with reference to FIGS. 80-84.

Figure 80:
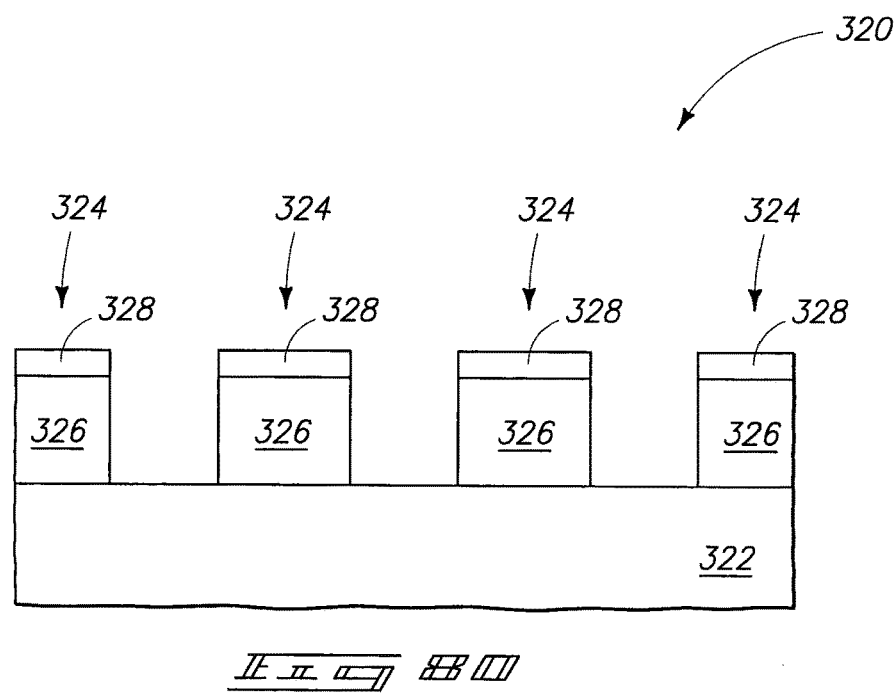
FIG. 80 is a diagrammatic sectional view of a portion of a substrate in process in accordance with an embodiment of the invention.

Referring to FIG. 80, a construction 320 comprises a base 322 having a plurality of projections 324 supported thereover. The projections comprise a material 326 and another material 328. In some embodiments, base 322 may comprise monocrystalline silicon, material 326 may comprise silicon dioxide, and material 328 may comprise monocrystalline silicon. Accordingly, construction 320 may correspond to a patterned silicon-on-insulator (SOI) structure similar to that of FIG. 61. In some embodiments, base 322 may be considered to comprise a first material, material 326 may be considered a second material, and material 328 may be considered a third material. In some embodiments, material 328 may comprise one or more of elemental-form tungsten, elemental-form titanium, or silicide.

Figure 81:
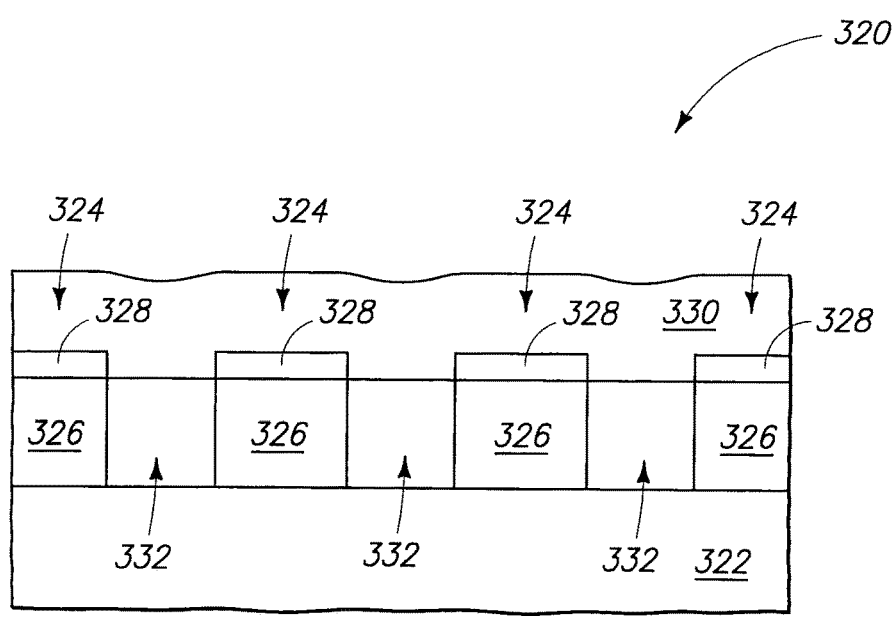
FIG. 81 is a view of the FIG. 80 substrate at a processing step subsequent to that of FIG. 80.

Referring to FIG. 81, covering material 330 is epitaxially grown from material 328, and accordingly material 328 functions as a seed layer. Material 330 may comprise monocrystalline silicon, and accordingly may comprise the same composition as the material of base 322.

The growth of material 330 forms conduits 332 contained between projections 324, base 322, and a cover defined by material 330.

Referring to FIG. 82, materials 328 and 330 may be oxidized to form an oxide 334. In embodiments in which material 326 comprises silicon dioxide, and materials 328 and 330 comprise silicon, such oxidation may form oxide 334 to be a silicon dioxide which merges with the silicon oxide of projections 326, as shown.

Figure 84:
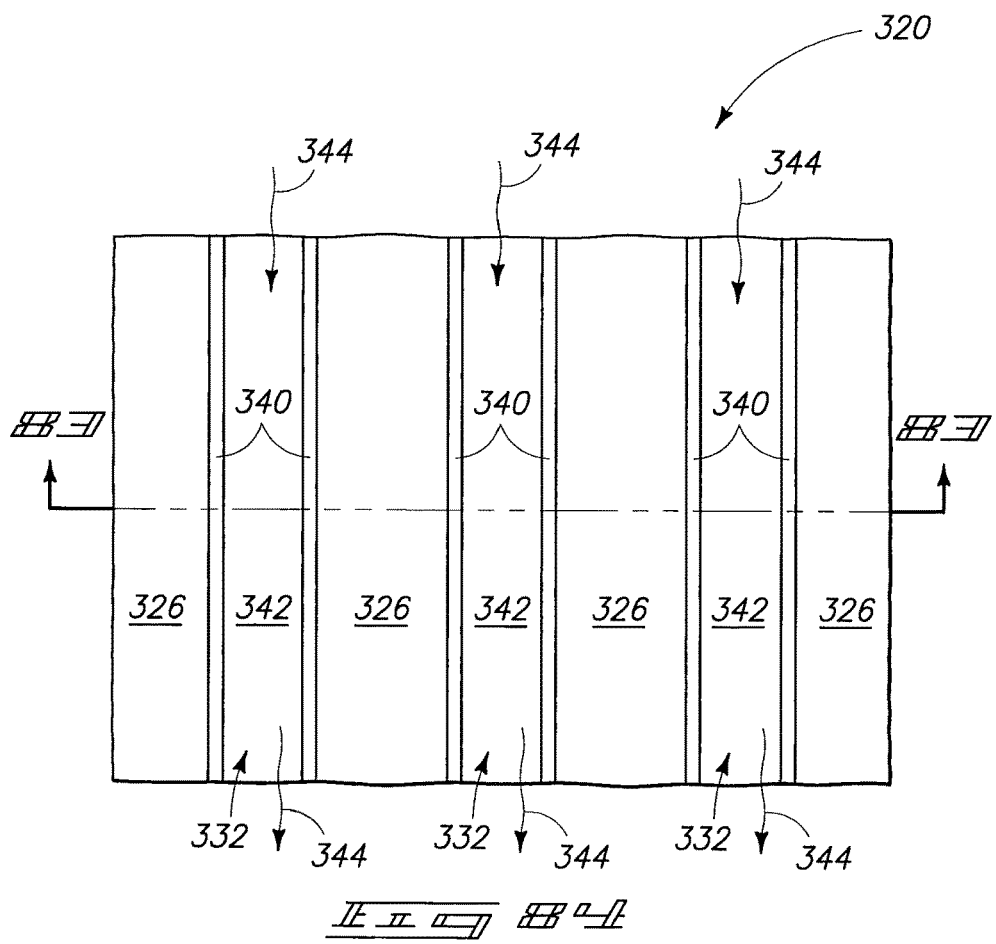
FIG. 84 is a top sectional view of the FIG. 83 substrate along the line 84-84; with the FIG. 83 view being along the line 83-83 of FIG. 84.

Referring to FIGS. 83 and 84, conduits 332 are lined with material 340, and the lined conduits are then filled with material 342. The materials 340 and 342 may be chosen to have light-refracting characteristics which substantially retain particular wavelengths of electromagnetic radiation within the conduits so that such wavelengths may be guided by the conduits from one location to another. For instance, one or both of materials 340 and 342 may have different light refracting properties than the material of base 332, or one or both of materials 326 and 334. In some embodiments, materials 328 and 330 will not be oxidized to form material 334, and in such embodiments one or both of materials 340 and 342 may have different light refracting properties than one or both of materials 328 and 330. In some embodiments, one or both of the materials 340 and 342 may be omitted. In some embodiments, one or both of materials 340 and 342 may comprise metal. The metal may be in elemental form, alloy form, or in the form of a metal-containing composition (for example a nitride or a silicide).

FIG. 84 shows that conduits 332 having the materials 340 and 342 therein form electromagnetic radiation-guiding paths. Specifically, electromagnetic radiation is diagrammatically illustrated by arrows 344 as entering the conduits at one end, being directed along the conduits, and exiting the conduits at another end.

Some embodiments herein include imager systems and methods of forming imager systems. An example embodiment is described with reference to FIGS. 85-89.

Figure 85:
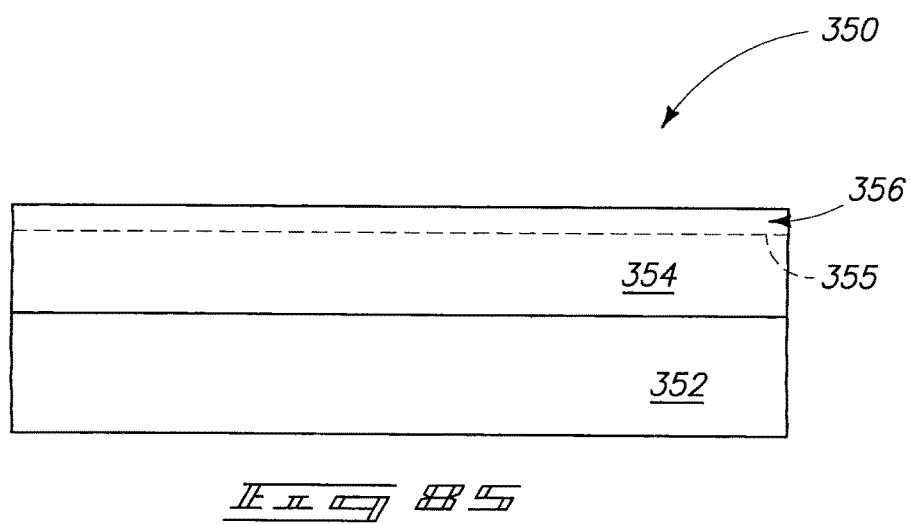
FIG. 85 is a diagrammatic sectional view of a portion of a substrate in process in accordance with an embodiment of the invention.

Referring to FIG. 85, a construction 350 comprises a semiconductor base 352 and a material 354 formed over the base. The material 354 may comprise an electrically conductive composition, and may accordingly comprise metal, metal-containing compounds, and/or conductively-doped semiconductor material. The material 354 comprises a different composition than semiconductor base 352. In some embodiments, base 352 may comprise monocrystalline silicon.

A seed region 356 is provided over material 354. An approximate boundary where the seed material joins material 354 is diagrammatically illustrated with a dashed line 355. In some embodiments, the seed material may be identical in composition to the remainder of material 354, and is defined only by its location at an uppermost region of material 354 from which growth of additional materials ultimately occurs. The seed regions may comprise monocrystalline silicon. In some embodiments, both material 354 and material 356 comprise, consist essentially of, or consist of monocrystalline silicon. In other embodiments, material 354 comprises a composition other than monocrystalline silicon, while material 356 comprises, consists essentially of, or consists of monocrystalline silicon. In such other embodiments, material 354 may comprise one or more electrically conductive compositions, such as elemental metal and/or one or more metal-containing compounds.

Referring to FIG. 86, material 354 and seed material 356 are patterned to form a plurality of openings 358 extending to base 352, and to form a plurality of projections 360 comprising material 354 and seed material 356. Materials 354 and 356 may be patterned by any suitable method. For instance, a photolithographically patterned photoresist mask may be formed over the materials, a pattern may be transferred from the mask to the materials with the one or more suitable etches, and then the mask may be removed to leave the construction of FIG. 86.

Referring to FIG. 87, openings 358 are at least partially filled with dielectric material 362. In the shown embodiment, the openings are entirely filled with dielectric material 362 and a planarized surface 363 extends across material 356 and dielectric material 362. The construction of FIG. 87 may be formed by providing dielectric material 362 to entirely fill the openings 358 and to extend across projections 360, followed by planarization (for example chemical-mechanical polishing) to remove material 362 from over the projections and form the shown planarized surface 363. Dielectric material 362 may comprise, consist essentially of, or consist of silicon dioxide. In some embodiments, the openings may be left open rather than being at least partially filled with dielectric material (in other words, the processing of FIG. 87 may be omitted).

Referring to FIG. 88, monocrystalline silicon 364 is grown from seed material 356, and over openings 358. In the shown embodiment, the openings 358 are filled with dielectric material 362, and accordingly monocrystalline silicon 364 is grown over such dielectric material.

Referring to FIG. 89, a pixel 370 (specifically, a CMOS imager device) is formed to be supported by monocrystalline silicon 364. The pixel includes first and second gate constructions 371 and 373, and source/drain regions 372, 382 and 384; with source/drain region 372 corresponding to a photodiode. The photodiode extends across several pockets of dielectric material 362. The buried dielectric material 362 may provide some electrical isolation to charge flowed into the underlying base 352, without excluding the ability to use conventional isolation structures, (such as the shallow trench isolation structures 374), to isolate pixels from one another in layer 364.

The pockets of dielectric material 362 may have sub-wavelength width and depth dimensions relative to wavelengths of visible light. Such sub-wavelength width and depth dimensions of the pockets may reduce loss of incident light and improve sensitivity of the pixel. Since silicon has a different index of refraction than dielectric material 362, some incident light passing through layer 364 will be reflected at the interfaces between dielectric material 362 and material 364. Light reflected at the silicon-dielectric interface is redirected to the photodiode of the pixel, as shown diagrammatically with arrows 375 representing light in FIG. 89.

Pixel 370 may be one of numerous identical pixels of a pixel array. Pixel cross-talk between the various pixels of the array may be reduced due to buried dielectric 362 reducing pixel-to-pixel carrier mobility within base 352.

Some embodiments herein include fluorimetry systems and fluorimetry methods. An example embodiment is described with reference to FIGS. 90-93.

Referring to FIG. 90, a construction 400 comprises a base 402 having a plurality of projections 404 supported thereover. The projections comprise a material 406 and another material 408. In some embodiments, base 402 may comprise monocrystalline silicon, material 406 may comprise silicon dioxide, and material 408 may comprise monocrystalline silicon. Accordingly, construction 400 may correspond to a patterned SOI structure similar to that of FIG. 61. The material 408 may be referred to as a seed material.

The projections 404 are spaced from one another by gaps 405 that extend to base 402.

Referring to FIG. 91, monocrystalline semiconductor material 410 is grown from seed material 408 to form a cover extending across gaps 405.

Figure 92:
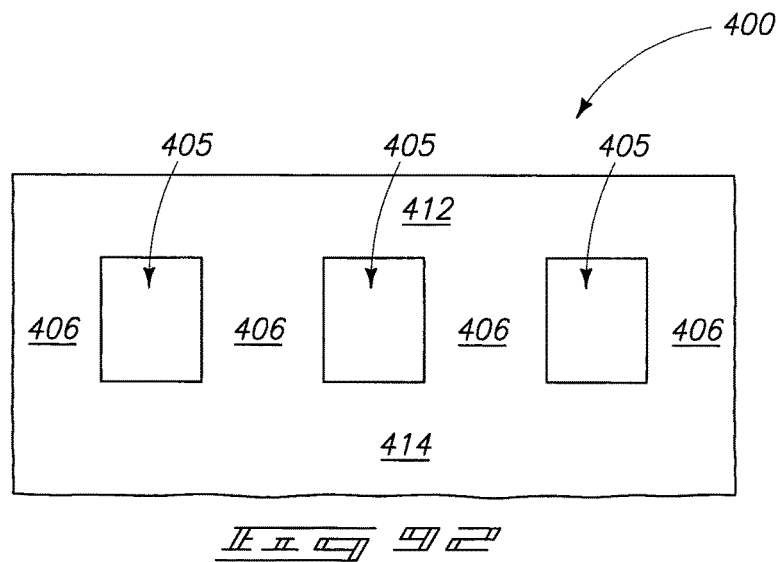
FIG. 92 is a view of the FIG. 91 substrate at a processing step subsequent to that of FIG. 91.

Referring to FIG. 92, materials 408 and 410 (FIG. 91) are oxidized to form an oxide material 412. In the shown embodiment, oxide 412 comprises the same material as 406 so that the oxide 412 merges with material 406. FIG. 92 also shows base 402 oxidized to form an oxide 414. The oxide 414 is shown being of the same composition as material 406 so that the oxide 414 and material 406 merge as a single material. In some embodiments, material 406 and oxides 412 and 414 all consist essentially of, or consist of silicon dioxide.

Figure 93:
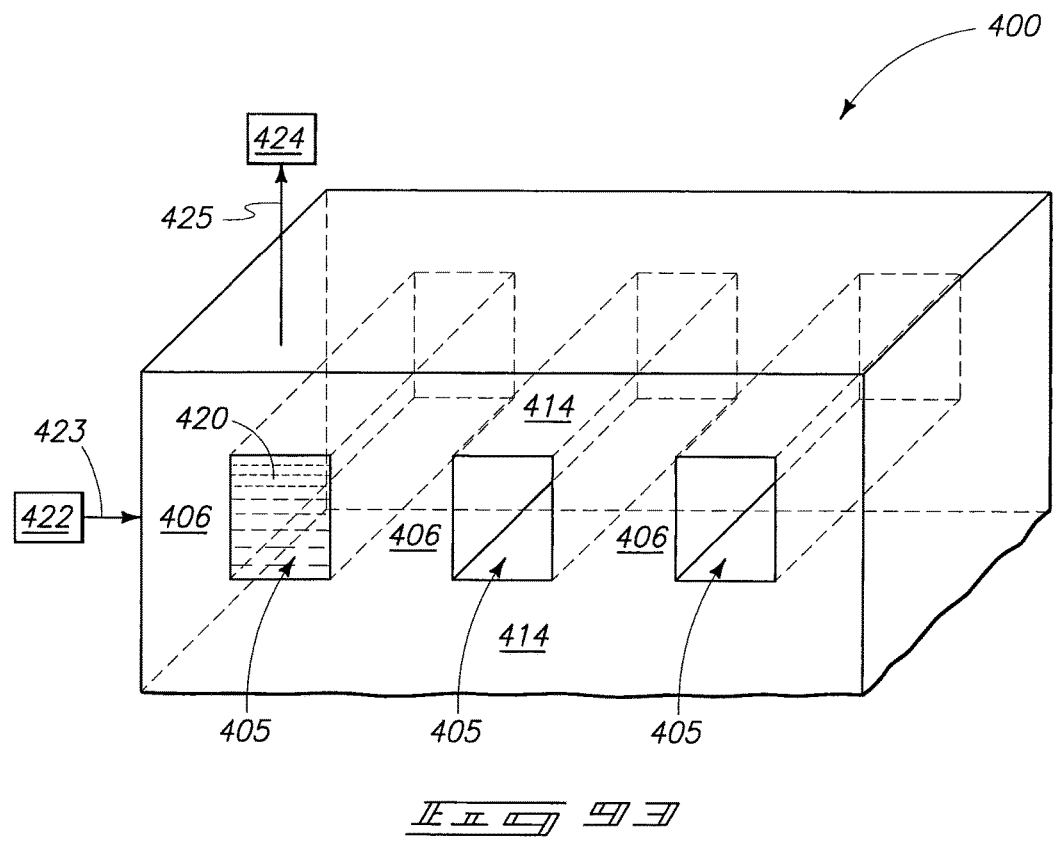
FIG. 93 is a diagrammatic perspective view of the FIG. 92 substrate.

The oxides 406, 412 and 414 surround gaps 405. In some embodiments, the oxides 406, 412 and 414 may be considered windows surrounding conduits corresponding to gaps 405. Such windows are transparent to various wavelengths of electromagnetic radiation, and accordingly the construction 400 of FIG. 92 may be utilized as a sample-retaining structure of a fluorimeter. FIG. 93 shows a perspective view of the construction of FIG. 92 and shows a fluid sample 420 within one of the conduits corresponding to a gap 405. The view of FIG. 93 also diagrammatically illustrates the conduits beneath material 414 in dashed-line view.

FIG. 93 shows an electromagnetic radiation emitting source 422, and an electromagnetic radiation detector 424. The detector and emitter are arranged at right angles relative to one another as is typical of fluorimeters. In operation, radiation 423 is directed toward sample 420 from source 422, causing a component of the sample to fluoresce. The fluorescence 425 is then detected by detector 424.

Although the emission is shown going through one of the projections and detection shown through the cover 414, in other embodiments the relative locations of the detector and emitter could be reversed. Also, in some embodiments one of the detector and emitter could be positioned beneath base 414.

Some embodiments herein include nanofluidic channels and methods of forming nanofluidic channels. An example embodiment is described with reference to FIGS. 94-98.

Figure 94:
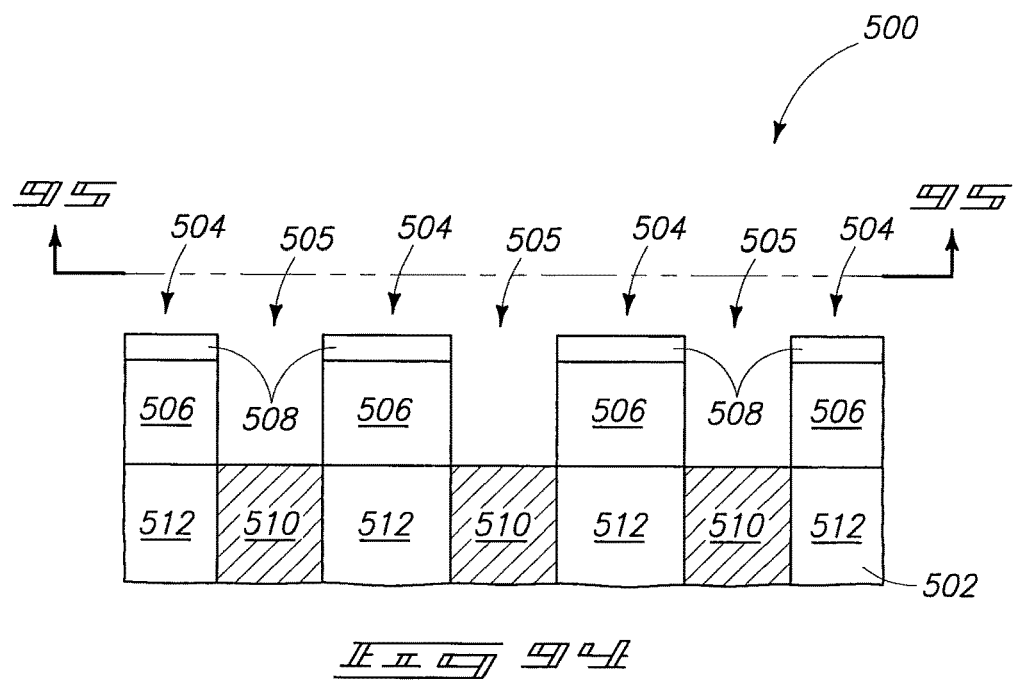
FIGS. 94 and 95 are a diagrammatic sectional view and a diagrammatic top view, respectively, of a portion of a substrate in process in accordance with an embodiment of the invention. The view of FIG. 95 is along the line 95-95 of FIG. 94, and the view of FIG. 94 is along the line 94-94 of FIG. 95.
Figure 95:
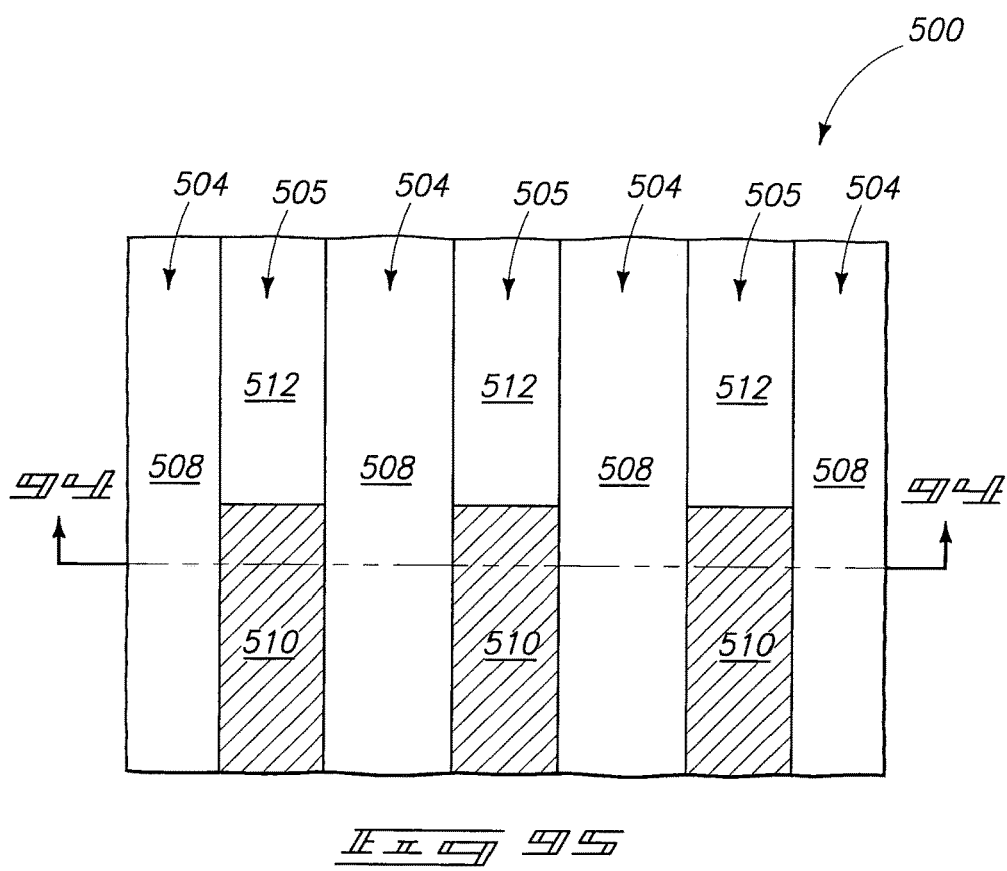

Referring to FIGS. 94 and 95, a construction 500 comprises a base 502 having a plurality of projections 504 supported thereover. The projections comprise a material 506 and another material 508. In some embodiments, base 502 may comprise monocrystalline silicon, material 506 may comprise silicon dioxide, and material 508 may comprise monocrystalline silicon. Accordingly, construction 500 may correspond to a patterned SOI structure similar to that of FIG. 61. The material 508 may be referred to as a seed material.

The projections 504 are spaced from one another by gaps (or trenches) 505 that extend to base 502.

Portions of base 502 are conductively-doped to form conductive regions 510 at the bottoms of gaps 505, while leaving insulative regions 512 adjacent the conductive regions. The top view of FIG. 95 shows that in some embodiments only portions of the base at the bottoms of the gaps 505 are doped to form the regions 510. Accordingly, there are also insulative regions 512 along some portions of the base at the bottoms of the gaps 505.

Figure 96:
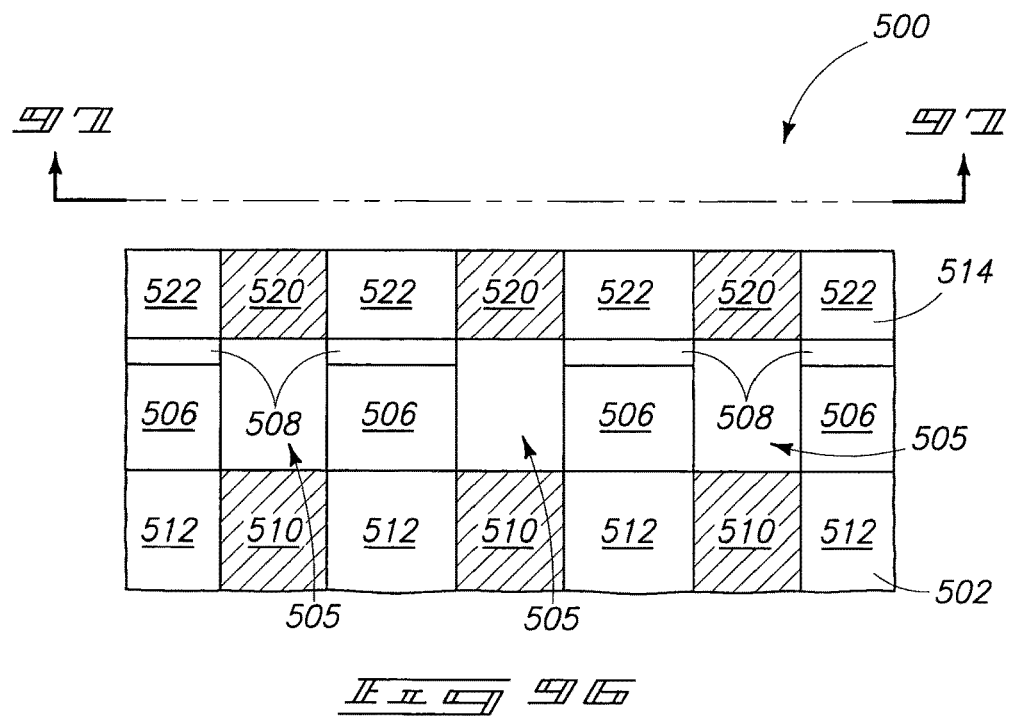
FIGS. 96 and 97 are a diagrammatic sectional view and a diagrammatic top view, respectively, of the substrate of FIGS. 94 and 95 at a processing stage subsequent to that of FIGS. 94 and 95. The view of FIG. 96 is along the line 96-96 of FIG. 97, and the view of FIG. 97 is along the line 97-97 of FIG. 96.
Figure 97:
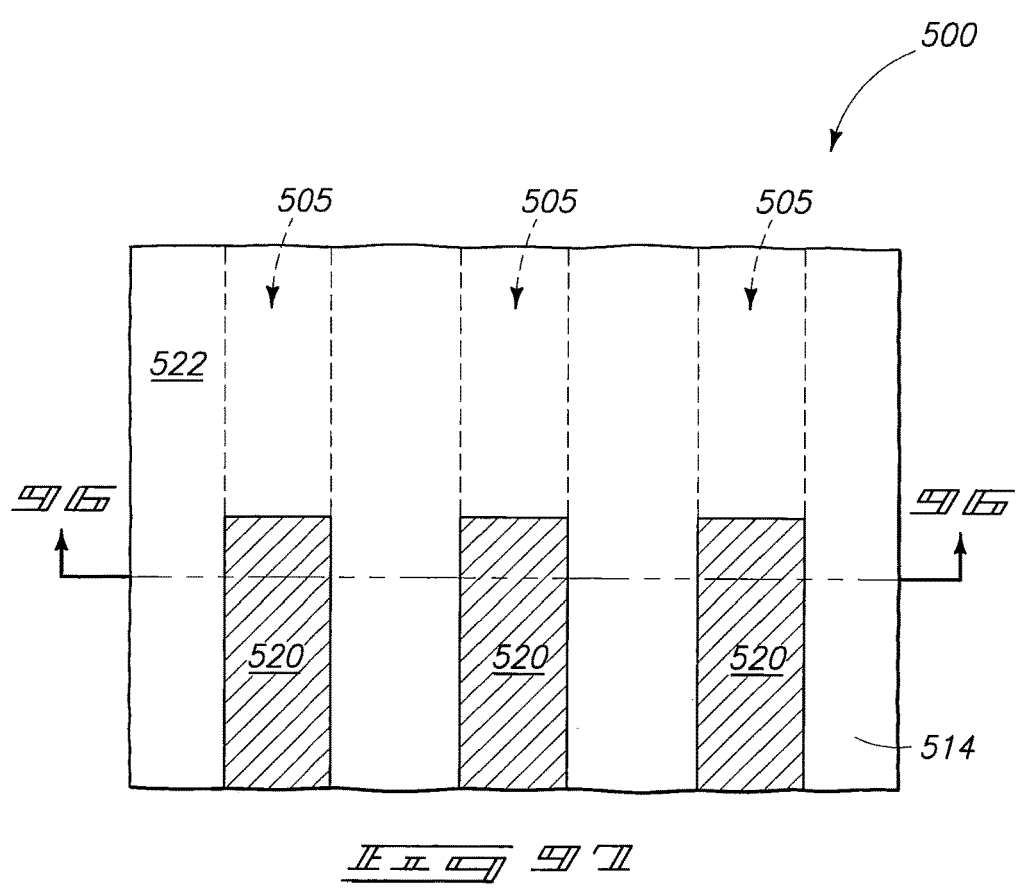

Referring to FIGS. 96 and 97, monocrystalline semiconductor material 514 is grown from seed material 508 to form a cover extending across gaps 505. Such converts the gaps into conduits extending between cover 514 and base 502. Portions of cover 514 are conductively-doped to form conductive regions 520 over gaps 505, while leaving insulative regions 522 adjacent the conductive regions. The top view of FIG. 97 shows that in some embodiments only portions of the cover over the gaps 505 are doped to form the regions 520, so that there are also insulative regions 522 of the cover directly over some portions of the gaps 505. The gaps 505 are diagrammatically illustrated in dashed-line view in FIG. 97 to assist the reader in understanding the location of the gaps relative to the shown conductive and insulative regions of the cover 514.

FIG. 98 shows a perspective view of the construction of FIGS. 96 and 97, and shows fluidic samples 530 within the conduits corresponding to gaps 505. The view of FIG. 98 also diagrammatically illustrates the conduits 505 beneath material cover 514 in dashed-line view.

The conductive regions 510 and 520 form paired conductive plates offset from one another by spaces corresponding to conduits 505. The paired conductive plates are electrically connected to monitoring apparatuses 550, 552 and 554. The monitoring apparatuses may monitor electrical properties between the paired plates to detect changes occurring as a sample fluid 530 passes between the plates. Such changes may be catalogued relative to various macromolecules (such as, for example, nucleotides or proteins) so that construction 500 of FIG. 98 may ultimately be utilized for characterization and/or sequencing of macromolecules. Although three separate monitoring apparatuses 550, 552 and 554 are shown, in other embodiments the monitoring apparatuses may be encompassed by a single processor.

The conductive plates may be considered to be a detection system which monitors at least one electrical property of fluid material passing between the plates.

There has been significant research directed toward utilization of nanofluidic channels (in other words, channels having at least some dimensions on the order of nanometers) for sequencing and/or other characterization of macromolecules. It has proven difficult to fabricate nanofluidic channels using conventional processes. However, some processing as disclosed herein may be utilized to fabricate nanofluidic channels as shown in FIGS. 94-98. Further, semiconductor processing may be used to fabricate conductive plates on opposing sides of the channels, and such conductive plates may then be utilized for monitoring materials flowed through the channels. The conductive plates may be conductively-doped regions of semiconductor material (as shown), and/or may comprise patterned metal-containing materials.

Various of the structures described in this disclosure may be incorporated into electronic systems.

Figure 99:
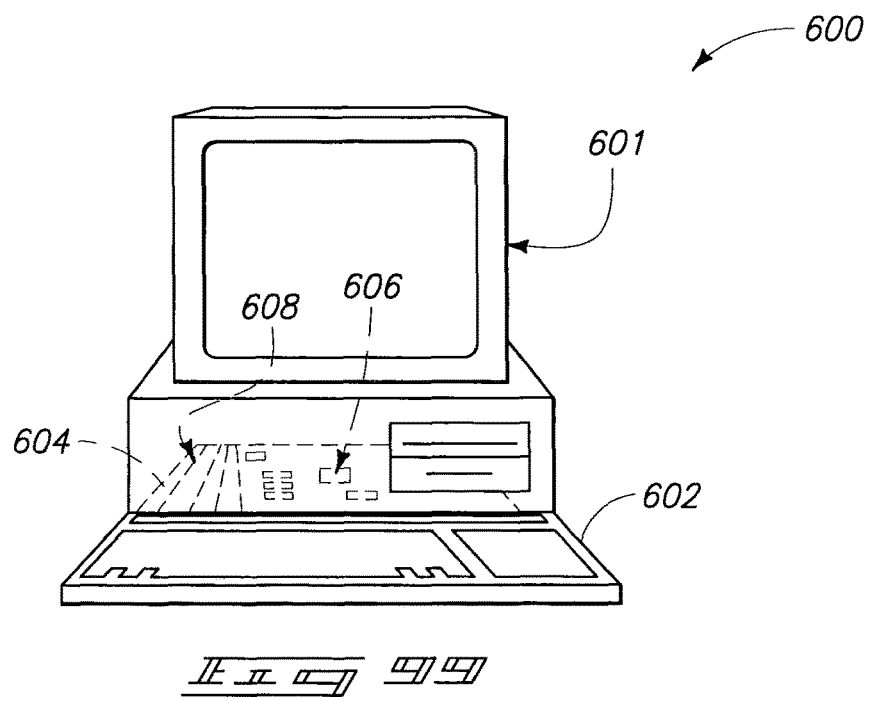
FIG. 99 is a diagrammatic view of a computer embodiment.
Figure 100:
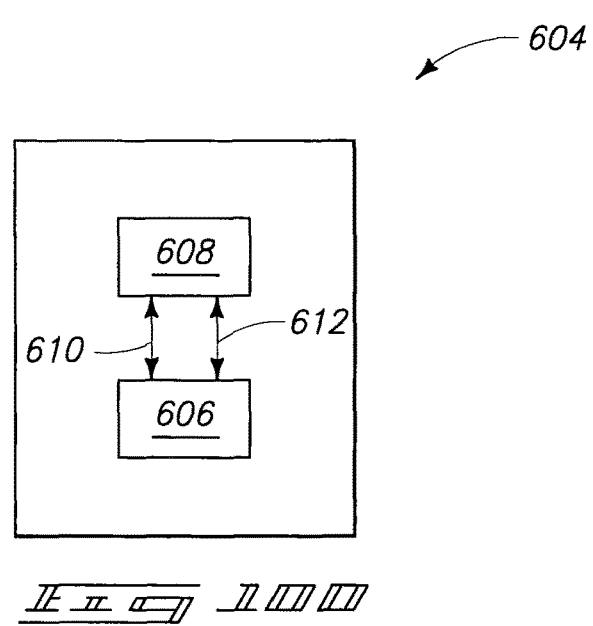
FIG. 100 is a block diagram showing particular features of the motherboard of the FIG. 99 computer embodiment.

FIG. 99 illustrates an embodiment of an electronic system corresponding to a computer system 600. Computer system 600 includes a monitor 601 or other communication output device, a keyboard 602 or other communication input device, and a motherboard 604. Motherboard 604 may carry a microprocessor 606 or other data processing unit, and at least one memory device 608. Memory device 608 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 608 and processor 606. Such is illustrated in the block diagram of the motherboard 604 shown in FIG. 100. In such block diagram, the addressing circuitry is illustrated as 610 and the read circuitry is illustrated as 612.

Processor device 606 may correspond to a processor module, and may comprise various of the structures described in this disclosure.

Memory device 608 may correspond to a memory module, and may comprise various of the structures described in this disclosure.

Figure 101:
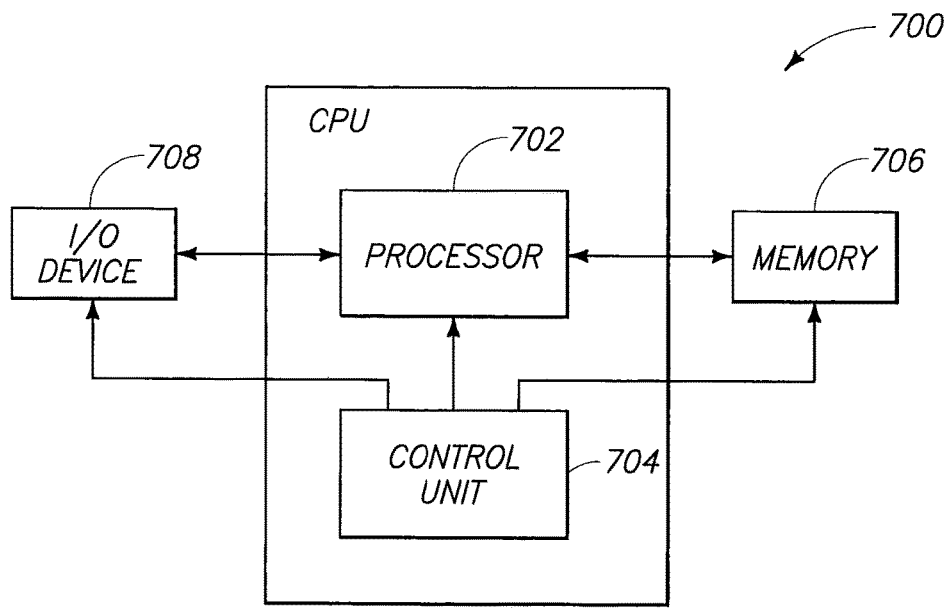
FIG. 101 is a high level block diagram of an electronic system embodiment.

FIG. 101 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may comprise various of the structures described in this disclosure.

Figure 102:
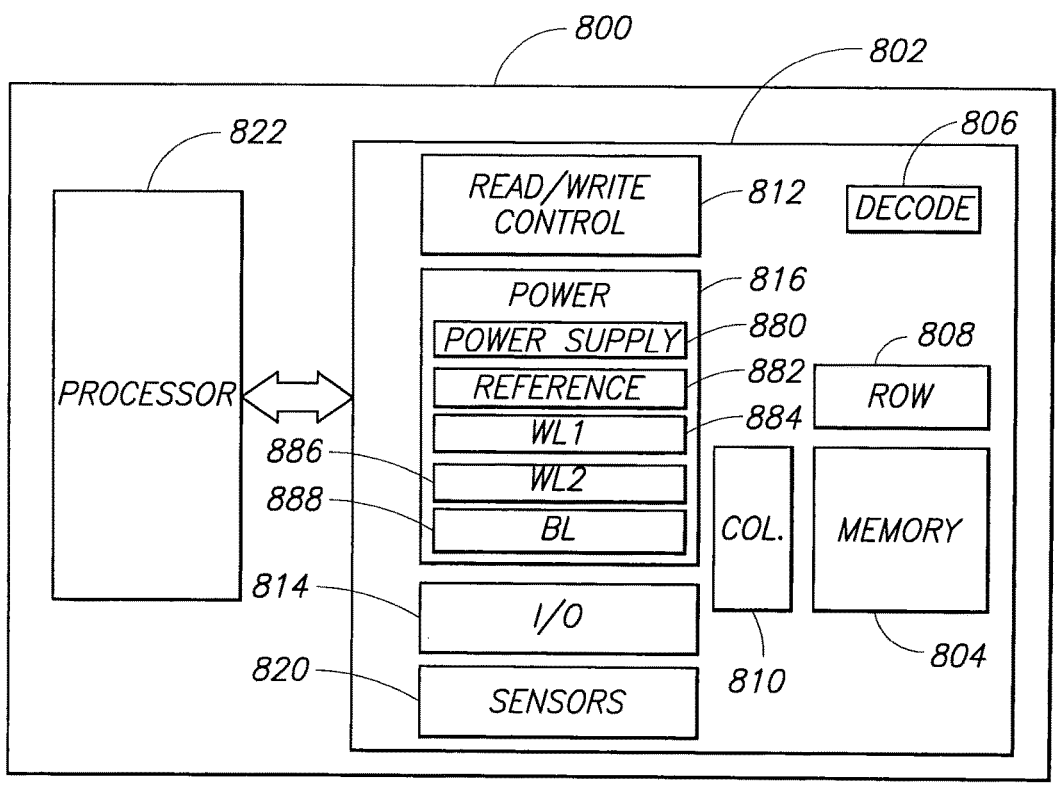
FIG. 102 is a simplified block diagram of a memory device embodiment.

FIG. 102 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may comprise various of the structures described in this disclosure.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A fluorimetry system, comprising:
   a sample holder comprising:
   a silicon-containing substrate;
   a pair of silicon dioxide-containing projections extending upwardly from the substrate;
   a silicon dioxide-containing cover extending across the projections; the substrate, projections and cover together encompassing a sample-retaining conduit;
   a source of electromagnetic radiation configured to emit radiation through either the substrate, projections or the cover; and
   a detector configured to detect electromagnetic radiation passing out of the sample-retaining conduit, the detector being configured to detect radiation at about 90 degrees relative to a direction along which the source emits radiation.

2. The fluorimetry system of claim 1 wherein the source is configured to emit the radiation through the substrate.

3. The fluorimetry system of claim 1 wherein the source is configured to emit the radiation through the projections.

4. The fluorimetry system of claim 1 wherein the source is configured to emit the radiation through the cover.

5. The fluorimetry system of claim 1 wherein the substrate comprises monocrystalline silicon.

6. The fluorimetry system of claim 1 wherein the substrate comprises silicon dioxide.

7. The fluorimetry system of claim 1 wherein the substrate consists of silicon dioxide.

* * * * *